(12) United States Patent
Sinclair et al.

(10) Patent No.: US 8,103,841 B2
(45) Date of Patent: Jan. 24, 2012

(54) NON-VOLATILE MEMORY AND METHOD WITH NON-SEQUENTIAL UPDATE BLOCK MANAGEMENT

(75) Inventors: Alan Welsh Sinclair, Maddiston (GB); Sergey Anatolievich Gorobets, Edinburgh (GB); Alan David Bennett, Edinburgh (GB); Peter John Smith, Midlothian (GB)

(73) Assignee: Sandisk Technologies Inc., Plano, TX (US)

( * ) Notice: Subject to any disclaimer, the term of this patent is extended or adjusted under 35 U.S.C. 154(b) by 74 days.

(21) Appl. No.: 12/239,489

(22) Filed: Sep. 26, 2008

(65) Prior Publication Data

US 2009/0019218 A1   Jan. 15, 2009

Related U.S. Application Data

(63) Continuation of application No. 10/917,867, filed on Aug. 13, 2004, now abandoned, which is a continuation-in-part of application No. 10/750,155, filed on Dec. 30, 2003, now Pat. No. 7,139,864.

(51) Int. Cl.
  *G06F 12/16* (2006.01)
(52) U.S. Cl. ......... 711/162; 711/103; 711/161; 714/6.1; 714/6.23
(58) Field of Classification Search .................. 711/103, 711/162, 161; 714/6, 6.1, 6.23
  See application file for complete search history.

(56) References Cited

U.S. PATENT DOCUMENTS

| | | | |
|---|---|---|---|
| 5,043,940 A | 8/1991 | Harari | |
| 5,070,032 A | 12/1991 | Yuan et al. | |
| 5,095,344 A | 3/1992 | Harari | |
| 5,172,338 A | 12/1992 | Mehrotra | |
| 5,313,421 A | 5/1994 | Guterman | |
| 5,315,541 A | 5/1994 | Harari et al. | |
| 5,343,063 A | 8/1994 | Yuan et al. | |
| 5,367,484 A | 11/1994 | Alexander et al. | |

(Continued)

FOREIGN PATENT DOCUMENTS

CN    1243317 A    2/2000

(Continued)

OTHER PUBLICATIONS

Korean Patent Office, "Preliminary Rejection," corresponding Korean Patent Application No. 2006-7013310, mailed on Jan. 14, 2010, 4 pages (including translation.).

(Continued)

*Primary Examiner* — Jae Yu
(74) *Attorney, Agent, or Firm* — Davis Wright Tremaine LLP

(57) ABSTRACT

In a nonvolatile memory with block management system that supports update blocks with non-sequential logical units, an index of the logical units in a non-sequential update block is buffered in RAM and stored periodically into the nonvolatile memory. In one embodiment, the index is stored in a block dedicated for storing indices. In another embodiment, the index is stored in the update block itself. In yet another embodiment, the index is stored in the header of each logical unit. In another aspect, the logical units written after the last index update but before the next have their indexing information stored in the header of each logical unit. In this way, after a power outage, the location of recently written logical units can be determined without having to perform a scanning during initialization. In yet another aspect, a block is managed as partially sequential and partially non-sequential, directed to more than one logical subgroup.

14 Claims, 63 Drawing Sheets

U.S. PATENT DOCUMENTS

| | | | |
|---|---|---|---|
| 5,404,485 A | 4/1995 | Ban | |
| 5,473,765 A | 12/1995 | Gibbons et al. | |
| 5,532,962 A | 7/1996 | Auclair et al. | |
| 5,570,315 A | 10/1996 | Tanaka et al. | |
| 5,661,053 A | 8/1997 | Yuan | |
| 5,742,934 A | 4/1998 | Shinohara | |
| 5,751,634 A | 5/1998 | Itoh | |
| 5,768,192 A | 6/1998 | Eitan | |
| 5,774,397 A | 6/1998 | Endoh et al. | |
| 5,798,968 A | 8/1998 | Lee et al. | |
| 5,860,124 A | 1/1999 | Matthews et al. | |
| 5,890,192 A | 3/1999 | Lee et al. | |
| 5,903,495 A | 5/1999 | Takeuchi et al. | |
| 5,907,856 A | 5/1999 | Estakhri et al. | |
| 5,909,449 A | 6/1999 | So et al. | |
| 5,930,167 A | 7/1999 | Lee et al. | |
| 5,933,368 A | 8/1999 | Ma et al. | |
| 5,937,425 A | 8/1999 | Ban | |
| 6,011,725 A | 1/2000 | Eitan | |
| 6,034,897 A | 3/2000 | Estakhri et al. | |
| 6,046,935 A | 4/2000 | Takeuchi et al. | |
| 6,098,077 A | 8/2000 | Sassa | |
| 6,125,435 A | 9/2000 | Estakhri et al. | |
| 6,141,249 A | 10/2000 | Estakhri et al. | |
| 6,157,991 A * | 12/2000 | Arnon | 711/161 |
| 6,185,663 B1 * | 2/2001 | Burke | 711/156 |
| 6,222,762 B1 | 4/2001 | Guterman et al. | |
| 6,226,728 B1 | 5/2001 | See et al. | |
| 6,272,610 B1 | 8/2001 | Katayama et al. | |
| 6,304,980 B1 | 10/2001 | Beardsley et al. | |
| 6,377,500 B1 | 4/2002 | Fujimoto et al. | |
| 6,401,160 B1 | 6/2002 | See et al. | |
| 6,421,279 B1 | 7/2002 | Tobita et al. | |
| 6,426,893 B1 | 7/2002 | Conley et al. | |
| 6,446,249 B1 | 9/2002 | Wang et al. | |
| 6,456,528 B1 | 9/2002 | Chen | |
| 6,490,649 B2 | 12/2002 | Sinclair | |
| 6,522,580 B2 | 2/2003 | Chen et al. | |
| 6,544,844 B2 | 4/2003 | Chang et al. | |
| 6,563,734 B2 | 5/2003 | Taki | |
| 6,567,307 B1 | 5/2003 | Estakhri | |
| 6,571,261 B1 | 5/2003 | Wang-Knop et al. | |
| 6,591,328 B1 | 7/2003 | Iida et al. | |
| 6,591,330 B2 | 7/2003 | Lasser | |
| 6,643,170 B2 | 11/2003 | Huang et al. | |
| 6,697,957 B1 | 2/2004 | Wang et al. | |
| 6,725,321 B1 | 4/2004 | Sinclair et al. | |
| 6,763,424 B2 | 7/2004 | Conley | |
| 6,826,651 B2 | 11/2004 | Michael et al. | |
| 6,871,259 B2 | 3/2005 | Hagiwara et al. | |
| 6,895,464 B2 | 5/2005 | Chow et al. | |
| 6,898,662 B2 | 5/2005 | Gorobets | |
| 7,139,864 B2 | 11/2006 | Bennett et al. | |
| 7,177,184 B2 | 2/2007 | Chen | |
| 7,315,916 B2 | 1/2008 | Bennett et al. | |
| 2001/0042882 A1 | 11/2001 | Chang et al. | |
| 2002/0099904 A1 | 7/2002 | Conley | |
| 2002/0136054 A1 | 9/2002 | Blodgett | |
| 2002/0184436 A1 | 12/2002 | Kim et al. | |
| 2002/0199058 A1 | 12/2002 | Ofek | |
| 2003/0053334 A1 | 3/2003 | Chen | |
| 2003/0065899 A1 | 4/2003 | Gorobets | |
| 2003/0076709 A1 | 4/2003 | Huang et al. | |
| 2003/0109093 A1 | 6/2003 | Harari et al. | |
| 2003/0110343 A1 | 6/2003 | Hagiwara et al. | |
| 2003/0115433 A1 | 6/2003 | Kodama | |
| 2003/0191916 A1 * | 10/2003 | McBrearty et al. | 711/162 |
| 2004/0103241 A1 | 5/2004 | Chang et al. | |
| 2005/0141312 A1 | 6/2005 | Sinclair et al. | |
| 2005/0141313 A1 | 6/2005 | Gorobets et al. | |
| 2005/0144357 A1 | 6/2005 | Sinclair | |
| 2005/0144358 A1 | 6/2005 | Conley et al. | |
| 2005/0144360 A1 | 6/2005 | Bennett et al. | |
| 2005/0144363 A1 | 6/2005 | Sinclair | |
| 2005/0144365 A1 | 6/2005 | Gorobets et al. | |
| 2005/0144367 A1 | 6/2005 | Sinclair | |
| 2005/0166087 A1 | 7/2005 | Gorobets | |
| 2007/0061545 A1 | 3/2007 | Kuhne | |
| 2009/0019217 A1 | 1/2009 | Gorobets et al. | |
| 2009/0037651 A1 | 2/2009 | Gorobets | |

FOREIGN PATENT DOCUMENTS

| | | |
|---|---|---|
| CN | 1922580 A | 2/2007 |
| EP | 0 887 732 A | 12/1998 |
| EP | 0 977 121 A | 2/2000 |
| EP | 1 424 631 A | 6/2004 |
| EP | 1 702 338 A | 9/2006 |
| EP | 1 704 484 A | 9/2006 |
| JP | H05-046494 A | 2/1993 |
| JP | 5314019 A | 11/1993 |
| JP | H11-073379 A | 3/1999 |
| JP | 2001-357683 A | 12/2001 |
| JP | 2002-366423 A | 12/2002 |
| JP | 2003-177974 A | 6/2003 |
| JP | 2004-252746 A | 9/2004 |
| JP | 2005-503640 T | 2/2005 |
| JP | 2007-534048 A | 11/2007 |
| TW | 543200 B | 7/2003 |
| TW | 559707 B | 11/2003 |
| TW | 561340 B | 11/2003 |
| TW | 561411 B | 11/2003 |
| WO | WO 00/49488 A | 8/2000 |
| WO | WO 02/058074 A | 7/2002 |
| WO | WO 03/027828 A | 4/2003 |
| WO | WO 03/029951 A | 4/2003 |
| WO | WO 2004/040457 A | 5/2004 |
| WO | WO 2004/040458 A | 5/2004 |
| WO | WO 2004/040459 A | 5/2004 |
| WO | WO 2004/040578 A | 5/2004 |
| WO | WO 2005/041046 A2 | 5/2005 |
| WO | WO 2005/066792 A2 | 7/2005 |
| WO | WO 2005/066793 A2 | 7/2005 |
| WO | WO 2005/066964 A2 | 7/2005 |
| WO | WO 2005/066970 A2 | 7/2005 |
| WO | WO 2005/066972 A1 | 7/2005 |

OTHER PUBLICATIONS

Chang, Li-Pin et al., "An Adaptive Striping Architecture for Flash Memory Storage Systems of Embedded Systems", Proceedings of the Eighth IEEE Real-Time and Embedded Technology and Applications Symposium, Sep. 24, 2002, pp. 187-196.

Eitan et al., "NROM: A Novel Localized Trapping, 2-Bit Nonvolatile Memory Cell," IEE Electron Device Letters, vol. 21, No. 1, Nov. 2000, pp. 543-545.

EPO/ISA, "Notification of Transmittal of the International Search Report and the Written Opinion of the International Searching Authority, or the Declaration", mailed in related PCT/US2004/043692 on May 4, 2005, 9 pages.

ISA/EPO, "Communication Relating to the Results of the Partial International Search," mailed in related PCT/US2004/043680 on Jul. 5, 2005, 3 pages.

EPO/ISA, "Notification of Transmittal of the International Search Report and the Written Opinion of the International Searching Authority, or the Declaration", mailed in related PCT/US2004/043597 on Aug. 8, 2005, 12 pages.

EPO/ISA, "Notification of Transmittal of the International Search Report and the Written Opinion of the International Searching Authority, or the Declaration", mailed in related PCT/US2004/043680 on Sep. 23, 2005, 18 pages.

EPO/ISA, "Notification of Transmittal of the International Search Report and the Written Opinion of the International Searching Authority, or the Declaration", mailed in related PCT/US2004/043377 on Dec. 2, 2005, 10 pages.

EPO/ISA, "Invitation to Pay Additional Fees and Communication Relating to the Results of the Partial International Search", mailed in related PCT/US2004/043762 on Dec. 8, 2005, 5 pages.

Taiwanese Patent Office, "Preliminary Notice of Rejection of the IPO," mailed in related Taiwanese patent application. No. 093141438 on Mar. 17, 2006, 2 pages.

EPO/ISA, "Notification of Transmittal of the International Search Report and the Written Opinion of the International Searching Authority, or the Declaration" mailed in related PCT/US2004/043762 (published as WO 2005/066793 A2) on Apr. 4, 2006, 14 pages.
USPTO, "Office Action," mailed in related U.S. Appl. No. 10/749,189 on Apr. 28, 2006, 13 pages.
USPTO, "Office Action," mailed in related U.S. Appl. No. 10/841,118 on Jun. 16, 2006, 29 pages.
USPTO, "Notice of Allowance," mailed in related U.S. Appl. No. 10/750,155 on Aug. 21, 2006, 17 pages.
USPTO, "Office Action," mailed in U.S. Appl. No. 10/917,888 on Oct. 20, 2006, 24 pages.
USPTO, "Office Action," mailed in U.S. Appl. No. 10/917,889 on Oct. 23, 2006, 24 pages.
Examination of First Report, European Patent No. 04815627.7, mailed Nov. 23, 2006, 3 pages.
USPTO, "Final Office Action," U.S. Appl. No. 10/841,118 on Feb. 6, 2007, 32 pages.
EPO, "European Search Report," mailed in related European Application No. 06 076 755.5 on Mar. 5, 2007, 4 pages.
USPTO, "Office Action," mailed in U.S. Appl. No. 10/917,725 on Mar. 22, 2007, 6 pages.
USPTO, "Office Action," mailed in U.S. Appl. No. 10/917,888 on Apr. 6, 2007, 14 pages.
USPTO, "Office Action," mailed in U.S. Appl. No. 10/917,889 on Apr. 18, 2007, 16 pages.
EPO, "Office Action," mailed in related European Application No. 04 815 452.0 on Apr. 19, 2007, 5 pages.
EPO, "Office Action," mailed in related European Application No. 04 815 706.9 on Apr. 19, 2007, 5 pages.
USPTO, "Office Action," mailed in U.S. Appl. No. 10/917,725 on Jun. 22, 2007, 10 pages.
Tawanese Patent Office, "Search Report," mailed in related Tawanese Patent Application No. 093141376 on Jun. 29, 2007, 2 pages.
EPO, "Office Action," mailed in related European Application No. 04 815 767.1 on Jul. 3, 2007, 7 pages.
Tawanese Patent Office, "Search Report," mailed in related Tawanese Patent Application No. 093141426 on Jul. 9, 2007, 2 pages.
USPTO, "Office Action," mailed in U.S. Appl. No. 10/917,889 on Aug. 13, 2007, 12 pages.
USPTO, "Office Action," mailed in U.S. Appl. No. 10/917,888 on Sep. 4, 2007, 16 pages.
EPO, "Office Action," mailed in related European Application No. 04 815 695.4, on Sep. 6, 2007, 2 pages.
The Patent Office of the People's Republic of China, "Office Action," mailed in related Chinese Application No. 200480042136.3 on Sep. 7, 2007, 14 pages (translation included.).
The Patent Office of the People's Republic of China, "Office Action," mailed in related Chinese Application No. 2004800421382 on Sep. 28, 2007, 11 pages (trasnlation included).
The Patent Office of the People's Republic of China, "Office Action," mailed in related Chinese Application No. 200480042129.3 on Sep. 28, 2007, 5 pages.

USPTO, "Office Action," mailed in related U.S. Appl. No. 10/917,725 on Feb. 11, 2008, 18 pages.
USPTO, "Office Action," mailed in related U.S. Appl. No. 10/917,888 on May 1, 2008, 17 pages.
USPTO, "Office Action," mailed in related U.S. Appl. No. 10/917,889 on May 9, 2008, 17 pages.
USPTO, "Office Action," mailed in related U.S. Appl. No. 10/917,725 on Jun. 24, 2008, 15 pages.
The China State Intellectual Property Office, "Office Action," corresponding Chinese Patent Application No. 200480041562.5, mailed on Jul. 11, 2008, 6 pages (including translation.).
USPTO, "Office Action," mailed in related U.S. Appl. No. 10/917,725 on Nov. 25, 2008, 14 pages.
The China State Intellectual Property Office, "Office Action," corresponding Chinese Patent Application No. 200480042136.3, mailed on Feb. 27, 2009, 6 pages (including translation.).
USPTO, "Office Action," mailed in related U.S. Appl. No. 10/917,725 on May 17, 2010, 12 pages.
EPO, "Office Action," mailed in related European Application No. 04 815 627.7 on Mar. 10, 2009, 4 pages.
China State Intellectul Property Office, "Decision of Rejection," corresponding Chinese Patent Application No. 200480042136.3, mailed on Jun. 5, 2009, 9 pages (including translation.).
USPTO, "Office Action," mailed in related U.S. Appl. No. 12/248,160 on Jun. 8, 2010, 31 pages.
USPTO, "Office Action," mailed in related U.S. Appl. No. 12/239,351 on Jun. 22, 29 pages.
China State Intellectul Property Office, "Reexamination Office Action," mailed on Jul. 23, 2010, 6 pages (including translation.).
USPTO, "Office Action," mailed in related U.S. Appl. No. 10/917,725 on Nov. 3, 2010, 12 pages.
USPTO, "Notice of Allowance and Fee(s) Due," mailed in related U.S. Appl. No. 12/239,351 on Nov. 10, 2010, 16 pages.
EPO, "Office Communication and Search Report," corresponding European Patent Application No. 10009157.8, mailed on Jan. 31, 2011, 6 pages.
JPO, "Notification of Reasons for Refusal," corresponding Japanese Patent Application No. 2006-547487, mailed on Feb. 8, 2011, 6 pages (including translation.).
USPTO, "Notice of Allowance and Fee(s) Due," mailed in related U.S. Appl. No. 12/248,160 on Jan. 7, 2011, 22 pages.
JPO, "Notification of Reasons for Refusal," corresponding Japanese Patent Application No. 2006-547516, mailed on Mar. 8, 2011, 5 pages (including translation.).
JPO, "Notification of Reasons for Refusal," corresponding Japanese Patent Application No. 2006-547386, mailed on Mar. 29, 2011, 6 pages (including translation.).
JPO, "Notification of Reasons for Refusal," corresponding Japanese Patent Application No. 2006-547493, mailed on Apr. 5, 2011, 7 pages (including translation.).

* cited by examiner

**SEQUENTIAL UPDATE
Example**

**CHAOTIC UPDATE
(NONSEQUENTIAL)
Example**

FORCED SEQUENTIAL
UPDATE
Example

LOGICAL GROUP STATES

| LOGICAL GROUP STATE | DESCRIPTION |
| --- | --- |
| Intact | Complete Logical Group in logically sequential order in a single metablock |
| Unwritten | No portion of the Logical Group has ever been written |
| Sequential Update | An update segment of the Logical Group is written to an update block without changing its existing sequential nature |
| Chaotic Update | An update segment of the Logical Group is written to an update block in logically non-sequential order |

*FIG. 12B*

PHYSICAL METABLOCK STATES

| METABLOCK STATE | DESCRIPTION |
|---|---|
| Erased | All the sectors in the metablock are erased |
| Sequential Update | The metablock is partially written with sectors in logically sequential order, possibly using page tag. All the sectors belong to the same logical group. |
| Non-sequential (Chaotic) Update | The metablock is partially or fully written with sectors in logically non-sequential order. Any sector can be written more than once. All sectors belong to the same logical group |
| Intact | The metablock is fully written in logically sequential order, possibly using page tag |
| Original | The metablock was previously Intact but at least one sector has been made obsolete by a host data update |

*FIG. 13B*

| Operation | Logical Group Transitions | Physical Metablock Transitions | | |
|---|---|---|---|---|
| | | original | old chaotic | new chaotic |
| (I) Compaction | UW, INT, SQ, CH | ER, CH, SQ, INT, OR | ER, CH, SQ, INT, OR | ER, CH, SQ, INT, OR |
| (J) Consolidation | UW, INT, SQ, CH | ER, CH, SQ, INT, OR | ER, CH, SQ, INT, OR | ER, CH, SQ, INT, OR |

FIGs. 14(I)-14(J)

Chaotic Block Index (CBI) Sector

| Chaotic Block Index | Chaotic Block Info | CBI Sector Index |
|---|---|---|

Chaotic Block Indexing Structure

Address Translation

Operations on Control Data Structures

Logical page $LP_k$ resides in Plane $x$
where $x = k\,MOD(k, W)$,
W (e.g., =4) is the total number of planes.

NONPLANE-ALIGNED
SEQUENTIAL UPDATE
Example

NONPLANE-ALIGNED
CHAOTIC UPDATE
(NONSEQUENTIAL)
Example

PLANE-ALIGNED
SEQUENTIAL UPDATE
Example

PLANE-ALIGNED
CHAOTIC UPDATE
(NONSEQUENTIAL)
Non-Padded Example

PLANE-ALIGNED
CHAOTIC UPDATE
(NONSEQUENTIAL)
Padded Example

SECTOR ALIGNMENT WITHIN PAGE
Exampe

LS$_k$ resides in Plane $x$
where $x = k'$ MOD(W),
$k' = $ INT($k$/K),
K (e.g., =2) is the total number of sectors in a page of a plane,
W (e.g., =4) is the total number of planes.

**MULTIPLE-SECTOR PAGE
PLANE-ALIGNMENT**

**MULTIPLE-SECTOR PAGE
PLANE-ALIGNMENT**

PLANE ALIGNMENT WITHOUT PADDING

Consolidation Failure Handling by Re-consolidation

Host Write Operation

Program Failure Handling
(Case 1: Block 3 = New)

Program Failure Handling
(Case 2: Block 3 = Block 2)

Consolidation Failure Handling (Phase I)
(Case 1: No additional updates on Breakout Block)

Consolidation Failure Handling (Phase III)
(Case 1: No additional updates on Breakout Block)

Consolidation Failure Handling (Phase III)
(Case 2: Additional updates on Breakout Block)

Sequential Padding Failure Handling (Phase I and III)

**Consolidation of Update of Update Block
Failure Handling (Phase I and III)**

**Relocation Failure Handling
(Without Logical Grouping)
(Phase I and III)**

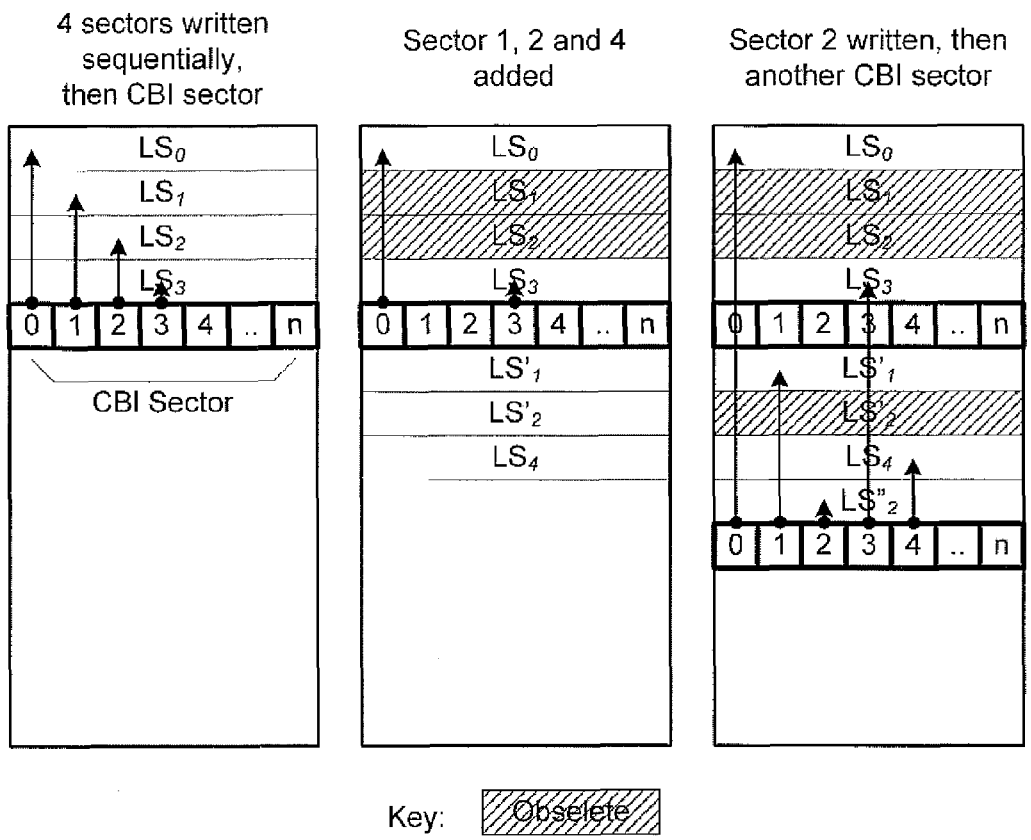
*FIG. 38A*  *FIG. 38B*  *FIG. 38C*
*FIG. 40*

Multistate Memory

Key:  ◯ Logical Upper Page   ☐ Logical Lower Page

2-Pass Programming with
Gray Code

Sectors to Duplicate

Multistate Page

| ⊠C⊠ | ⊠C⊠ | D | D | Upper Page | 2$^{nd}$ program |
| A | A | B | B | Lower Page | 1$^{st}$ program |

Non-robust Arrangement of Duplicate Sectors in a Page

Robust Arrangement of Duplicate Sectors in a Page

Duplicate Sectors in Upper Page Only

Duplicate Sectors in Binary Program Mode

Robust Arrangement of Duplicate Sectors in Two Blocks

Multistate Memory

2-Pass Programming with
Fault Tolerant Code

| STATE | COPY 1 | COPY 2 | VALID COPY |
|---|---|---|---|
| 1 | EEC Good | EEC Good | Copies 1 & 2 |
| 2 | EEC Good | EEC Bad | Copy 1 |
| 3 | EEC Good | Blank | Copy 1 |
| 4 | EEC Bad | Blank | None |

NON-VOLATILE MEMORY AND METHOD WITH NON-SEQUENTIAL UPDATE BLOCK MANAGEMENT

CROSS REFERENCE TO RELATED APPLICATIONS

This application is a continuation of U.S. patent application Ser. No. 10/917,867, filed on Aug. 13, 2004, now abandoned, which is a continuation-in-part of U.S. patent application Ser. No. 10/750,155, filed on Dec. 30, 2003, now U.S. Pat. No. 7,139,864.

FIELD OF THE INVENTION

This invention relates generally to non-volatile semiconductor memory and specifically to those having a memory block management system with efficient handling of update data in a block.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In flash memory systems, erase operation may take as much as an order of magnitude longer than read and program operations. Thus, it is desirable to have the erase block of substantial size. In this way, the erase time is amortized over a large aggregate of memory cells.

The nature of flash memory predicates that data must be written to an erased memory location. If data of a certain logical address from a host is to be updated, one way is rewrite the update data in the same physical memory location. That is, the logical to physical address mapping is unchanged. However, this will mean the entire erase block contain that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

Another problem with managing flash memory system has to do with system control and directory data. The data is produced and accessed during the course of various memory operations. Thus, its efficient handling and ready access will directly impact performance. It would be desirable to maintain this type of data in flash memory because flash memory is meant for storage and is nonvolatile. However, with an intervening file management system between the controller and the flash memory, the data can not be accessed as directly. Also, system control and directory data tends to be active and fragmented, which is not conducive to storing in a system with large size block erase. Conventionally, this type of data is set up in the controller RAM, thereby allowing direct access by the controller. After the memory device is powered up, a process of initialization enables the flash memory to be scanned in order to compile the necessary system control and directory information to be placed in the controller RAM. This process takes time and requires controller RAM capacity, all the more so with ever increasing flash memory capacity.

U.S. Pat. No. 6,567,307 discloses a method of dealing with sector updates among large erase block including recording the update data in multiple erase blocks acting as scratch pad and eventually consolidating the valid sectors among the various blocks and rewriting the sectors after rearranging them in logically sequential order. In this way, a block needs not be erased and rewritten at every slightest update.

WO 03/027828 and WO 00/49488 both disclose a memory system dealing with updates among large erase block including partitioning the logical sector addresses in zones. A small zone of logical address range is reserved for active system control data separate from another zone for user data. In this way, manipulation of the system control data in its own zone will not interact with the associated user data in another zone. Updates are at the logical sector level and a write pointer points to the corresponding physical sectors in a block to be written. The mapping information is buffered in RAM and eventually stored in a sector allocation table in the main memory. The latest version of a logical sector will obsolete all previous versions among existing blocks, which become partially obsolete. Garbage collection is performed to keep partially obsolete blocks to an acceptable number.

Prior art systems tend to have the update data distributed over many blocks or the update data may render many existing blocks partially obsolete. The result often is a large amount of garbage collection necessary for the partially obsolete blocks, which is inefficient and causes premature aging of the memory. Also, there is no systematic and efficient way of dealing with sequential update as compared to non-sequential update.

Therefore there is a general need for high capacity and high performance non-volatile memory. In particular, there is a need to have a high capacity nonvolatile memory able to conduct memory operations in large blocks without the aforementioned problems.

SUMMARY OF INVENTION

A non-volatile memory system is organized in physical groups of physical memory locations. Each physical group (metablock) is erasable as a unit and can be used to store a logical group of data. A memory management system allows for update of a logical group of data by allocating a metablock dedicated to recording the update data of the logical group. The update metablock records update data in the order received and has no restriction on whether the recording is in the correct logical order as originally stored (sequential) or not (chaotic). Eventually the update metablock is closed to further recording. One of several processes will take place, but will ultimately end up with a fully filled metablock in the correct order which replaces the original metablock. In the chaotic case, directory data is maintained in the non-volatile memory in a manner that is conducive to frequent updates. The system supports multiple logical groups being updated concurrently.

One feature of the invention allows data to be updated logical-group by logical-group. Thus, when a logical group is being updated, the distribution of logical units (and also the scatter of memory units that the updates obsolete) are limited in range. This is especially true when the logical group is normally contained within a physical block.

During updates of the logical group, typically one or two blocks need be assigned to buffer the updated logical units. Thus, garbage collection need only be performed over a relatively fewer number of blocks. Garbage collection of a chaotic block may be performed by either consolidation or compaction.

The economy of the update process is further evident in the generic treatment of the update blocks so that no additional block need be assigned for chaotic (non-sequential) updates as compared to the sequential ones. All update blocks are allocated as sequential update block, and any update block can change to a chaotic update block. Indeed, the change of an update block from sequential to chaotic is discretionary.

The efficient use of system resource allows multiple logical groups to be updated concurrently. This further increases efficiency and reduces overheads.

Alignment For Memory Distributed Over Multiple Memory Planes

According to another aspect of the invention, for a memory array organized into erasable blocks and constituted from multiple memory planes so that logical units can be read or programmed into the multiple planes in parallel, when an original logical unit of a first block stored in a given memory plane is to be updated, provisions are made to keep the updated logical unit in the same plane as the original. This is accomplished by recording the updated logical unit to the next available location of a second block but in the same plane. Preferably, the logical unit is stored with an identical offset position in the plane as its other versions so that all versions of a given logical units are serviced by an identical set of sensing circuits.

In a preferred embodiment, any intervening gaps from the last programmed memory unit to the next available plane-aligned memory unit are padded accordingly with the current versions of logical units. The padding is accomplished by filling in a gap with current versions of the logical units that follow logically from the last programmed logical unit, and with current versions of the logical units that precede logically from the logical unit stored in the next available plane-aligned memory unit.

In this way, all versions of a logical unit are maintained in the same plane with the same offsets as the original so that in a garbage collection operation, the latest version of the logical unit need not be retrieved from a different plane, resulting in reduced performance. In a preferred embodiment, each memory unit across the plane is either updated or padded with the latest versions. Thus a logical unit from each plane could be read out in parallel, which will be in logical sequential order without the need for further rearrangement.

This scheme reduces the time for consolidation of a chaotic block by allowing on-plane rearrangement of the latest versions of the logical units of a logical group and avoiding having to gather the latest versions from different memory planes. This is of benefit where the performance specification for the host interface defines a maximum latency for completion of a sector write operation by the memory system.

Phased Program Error Handling

According to another aspect of the invention, in a memory with block management system, program failure in a block during a time-critical memory operation is handled by continuing the programming operation in a breakout block. Later, at a less critical time, the data recorded in the failed block prior to the interruption is transferred to another block, which could also be the breakout block. The failed block can then be discarded. In this way, when a defective block is encountered, it can be handled without loss of data and without exceeding a specified time limit by having to transfer the stored data in the defective block on the spot. This error handling is especially critical for a garbage collection operation so that the entire operation need not be repeated on a fresh block during a critical time. Subsequently, at an opportune time, the data from the defective block can be salvaged by relocation to another block.

The program failure handling is especially critical during a consolidation operation. A normal consolidation operation consolidates into a consolidation block the current versions of all logical units of a logical group residing among an original block and an update block. During the consolidation operation, if a program failure occurs in the consolidation block, another block acting as a breakout consolidation block will be provisioned to receive the consolidation of the remaining logical units. In this way, no logical units need be copied more than once and the operation with exception handling can still be completed within a period specified for a normal consolidation operation. At an opportune time, the consolidation operation can be completed by consolidating all outstanding logical units of the group into the breakout block. The opportune time will be during some other period outside the current host write operation when there is time to perform the consolidation. One such opportune time is during another host write where there is an update but no associated consolidation operation.

Essentially, the consolidation with the program failure handling can be regarded as being implemented in multiple phases. In a first phase, the logical units are being consolidated into more than one block after a program failure occurs in order to avoid consolidating each logical unit more than once. The final phase is completed at an opportune time, where the logical group is consolidated into one block, preferably by collecting all the logical units into the breakout consolidation block in sequential order.

Non-Sequential Update Block Indexing

According to another aspect of the invention, in a nonvolatile memory with block management system that supports update blocks with non-sequential logical units, an index of the logical units in a non-sequential update block is buffered in RAM and stored periodically into the non-volatile memory. In one embodiment, the index is stored in a block dedicated for storing indices. In another embodiment, the index is stored in the update block itself. In yet another embodiment, the index is stored in the header of each logical unit. In another aspect, the logical units written after the last index update but before the next have their indexing information stored in the header of each logical unit. In this way, after a power outage, the location of recently written logical units can be determined without having to perform a scanning during initialization. In yet another aspect, a block is managed as partially sequential and partially non-sequential, directed to more than one logical subgroup.

Control Data Integrity & Management

According to another aspect of the invention, critical data such as some or all of the control data is guaranteed an extra level of reliability if it is maintained in duplicates. The duplication is performed in a manner that for multi-state memory system employing a two-pass programming technique for successively programming the multi-bits of the same set of memory cells, any programming error in the second pass will not corrupt the data established by the first pass. The duplication also helps with detection of write aborts, detection of misdetection (i.e., both copies have good ECC but data are different), and adds an extra level of reliability. Several techniques of data duplication are contemplated.

In one embodiment, after two copies of a given data have been programmed in an earlier programming pass, a subsequent programming pass avoids programming the memory cells storing at least one of the two copies. In this way, at least one of the two copies will be unaffected in the event the subsequent programming pass aborts before completion and corrupts the data of the earlier pass.

In another embodiment, the two copies of a given data are stored in two different blocks where at most one of the two copies have its memory cells programmed in a subsequent programming pass.

In yet another embodiment, after two copies of a given data have been stored in a programming pass, no further programming will be preformed on the set of memory cells storing the two copies. This is accomplished by programming the two copies in an ultimate programming pass for the set of memory cells.

In yet another embodiment, the two copies of a given data is programmed into a multi-state memory in a binary programming mode, so that no further programming on the programmed memory cells will take place.

In yet another embodiment, for multi-state memory system employing a two-pass programming technique for successively programming the multi-bits of the same set of memory cells, a fault-tolerant code is employ to code the multiple memory states such that data established by an earlier programming pass is insensitive to errors in subsequent programming pass.

According to another aspect of the invention, in a nonvolatile memory with a block management system, a "control garbage collection" or preemptive relocation of a memory block is implemented to avoid the situation where a large number of update blocks all happen to need relocation concurrently. For example, this situation can happen when updating control data used for controlling the operation of the block management system. A hierarchy of control data type can exist with varying degree of update frequencies, resulting in their associated update blocks requiring garbage collection or relocation at different rates. There will be certain times that the garbage collection operations of more than one control data types coincide. In the extreme situation, the relocation phases of the update blocks for all control data types could line up, resulting in all of the update blocks requiring relocation at the same time.

Additional features and advantages of the present invention will be understood from the following description of its preferred embodiments, which description should be taken in conjunction with the accompanying drawings.

BRIEF DESCRIPTION OF THE DRAWINGS

FIG. 12B is a table listing the possible states of a Logical Group.

FIG. 13B is a table listing the possible states of a metablock.

FIGS. 14(A)-14(J) are state diagrams showing the effect of various operations on the state of the logical group and also on the physical metablock.

FIG. 38A illustrates an update block up to the point when a CBI sector is recorded in it after a predetermined number of writes.

FIG. 38B illustrates the update block of FIG. 38A to have data pages 1, 2 and 4 further recorded to it after the index sector.

FIG. 38C illustrates the update block of FIG. 38B having another logical sector written to trigger the next recording of an index sector.

FIG. 40 illustrates the information in the chaotic index field being stored in a header of each data sector in the chaotic update block.

DETAILED DESCRIPTION OF THE PREFERRED EMBODIMENTS

Figure 1:
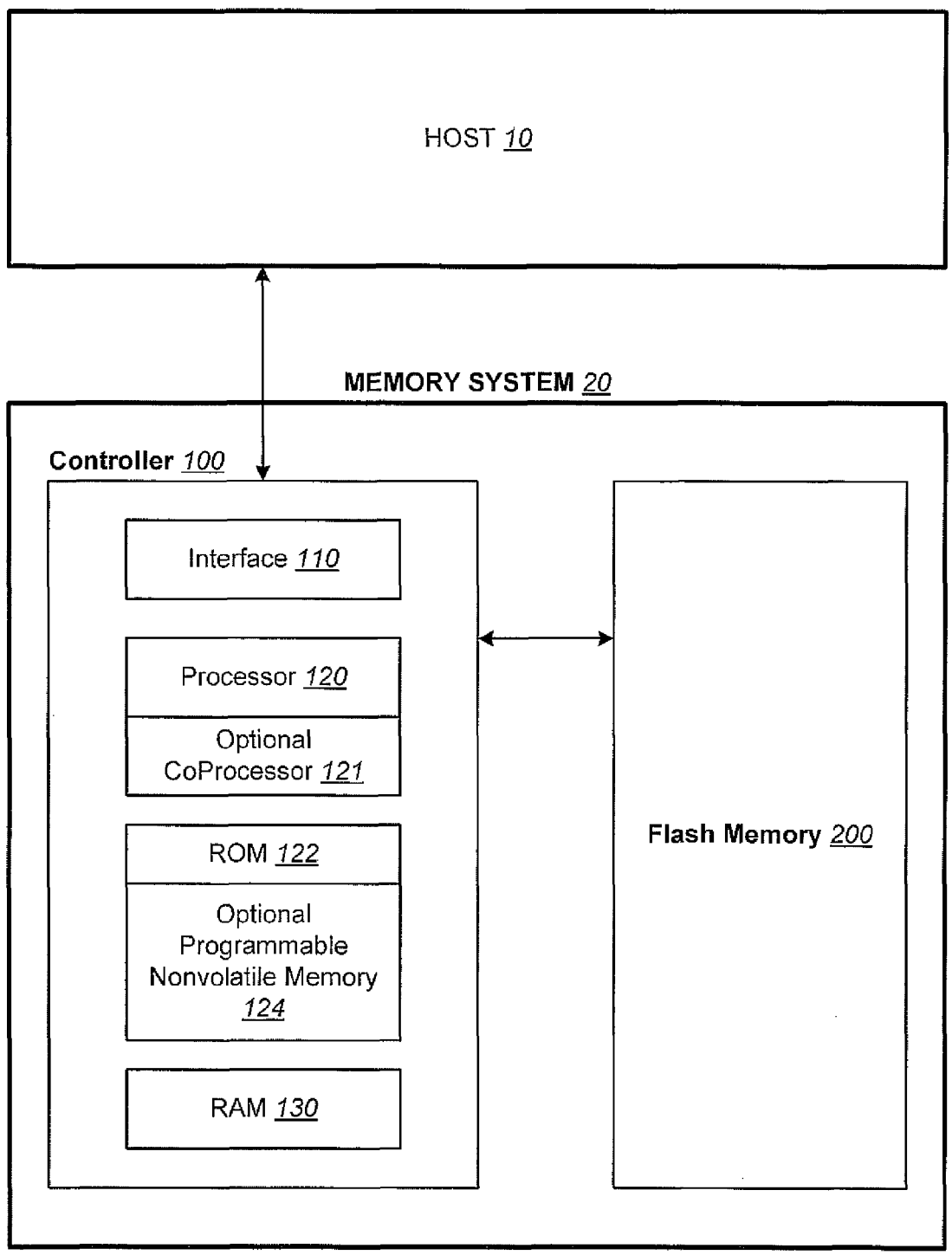
FIG. 1 illustrates schematically the main hardware components of a memory system suitable for implementing the present invention.

FIG. 1 illustrates schematically the main hardware components of a memory system suitable for implementing the present invention. The memory system 20 typically operates with a host 10 through a host interface. The memory system is typically in the form of a memory card or an embedded memory system. The memory system 20 includes a memory 200 whose operations are controlled by a controller 100. The memory 200 comprises of one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Logical and Physical Block Structures

Figure 2:
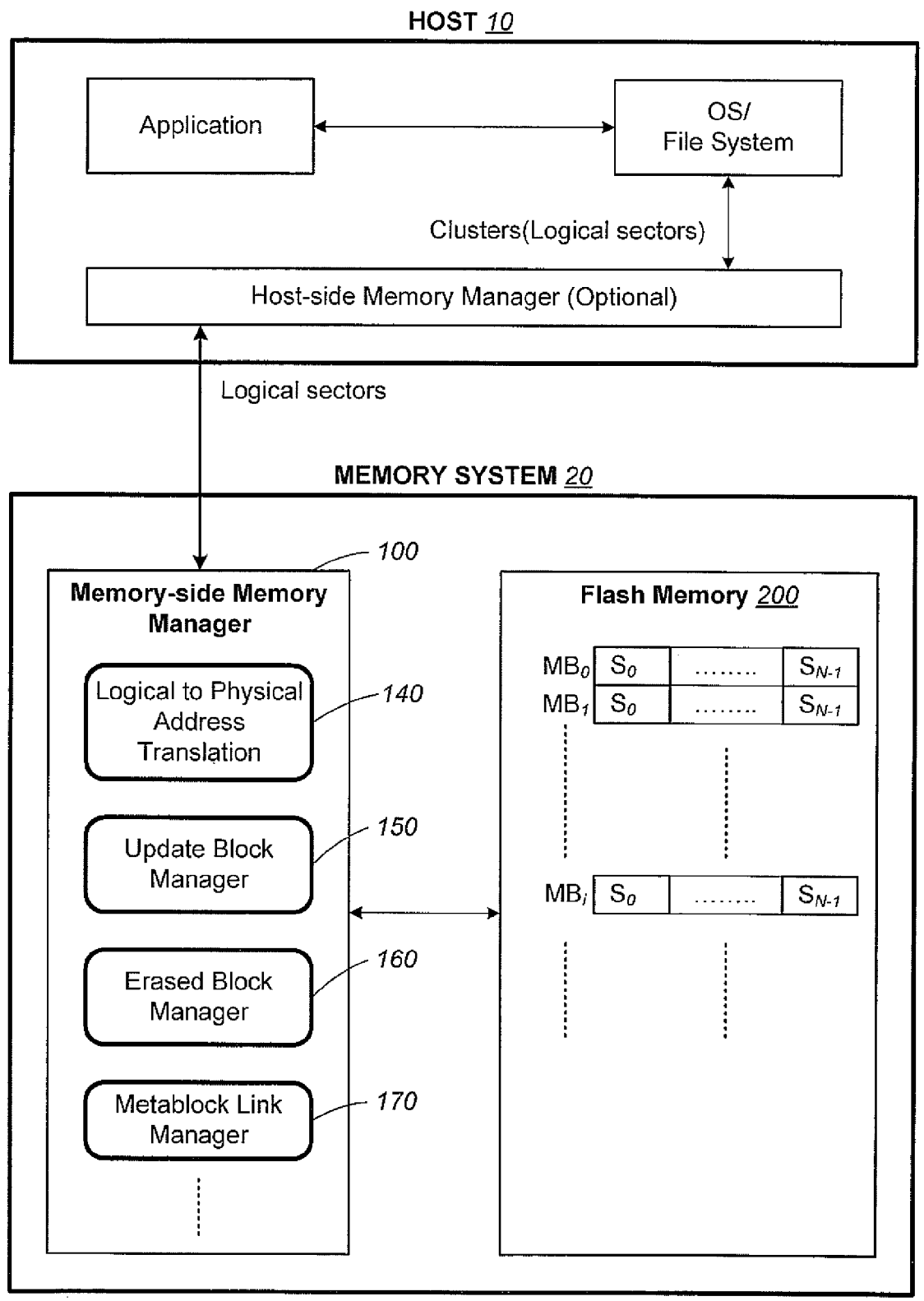
FIG. 2 illustrates the memory being organized into physical groups of sectors (or metablocks) and managed by a memory manager of the controller, according to a preferred embodiment of the invention.

FIG. 2 illustrates the memory being organized into physical groups of sectors (or metablocks) and managed by a memory manager of the controller, according to a preferred embodiment of the invention. The memory 200 is organized into metablocks, where each metablock is a group of physical sectors $S_0, \ldots, S_{N-1}$ that are erasable together.

The host 10 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 10 essentially issues a command to the memory system 20 to read or write a segment containing a string of logical sectors of data with contiguous addresses.

A memory-side memory manager is implemented in the controller 100 of the memory system 20 to manage the storage and retrieval of the data of host logical sectors among metablocks of the flash memory 200. In the preferred embodiment, the memory manager contains a number of software modules for managing erase, read and write operations of the metablocks. The memory manager also maintains system control and directory data associated with its operations among the flash memory 200 and the controller RAM 130.

Figure 3A:
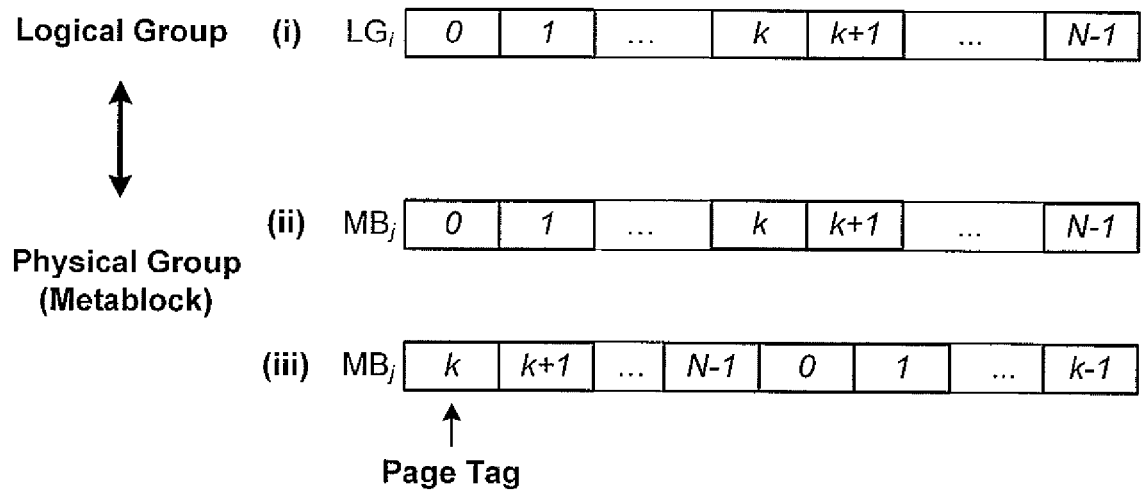
FIGS. 3A(i)-3A(iii) illustrate schematically the mapping between a logical group and a metablock, according to a preferred embodiment of the present invention.

FIGS. 3A(i)-3A(iii) illustrate schematically the mapping between a logical group and a metablock, according to a preferred embodiment of the present invention. The metablock of the physical memory has N physical sectors for storing N logical sectors of data of a logical group. FIG. 3A(i) shows the data from a logical group $LG_i$, where the logical sectors are in contiguous logical order 0, 1, ..., N-1. FIG. 3A(ii) shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 3A(iii), the metablock stores in its first location beginning with the data of logical sector k. When the last logical sector N-1 is reached, it wraps around to sector 0 and finally storing data associated with logical sector k-1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 3B:
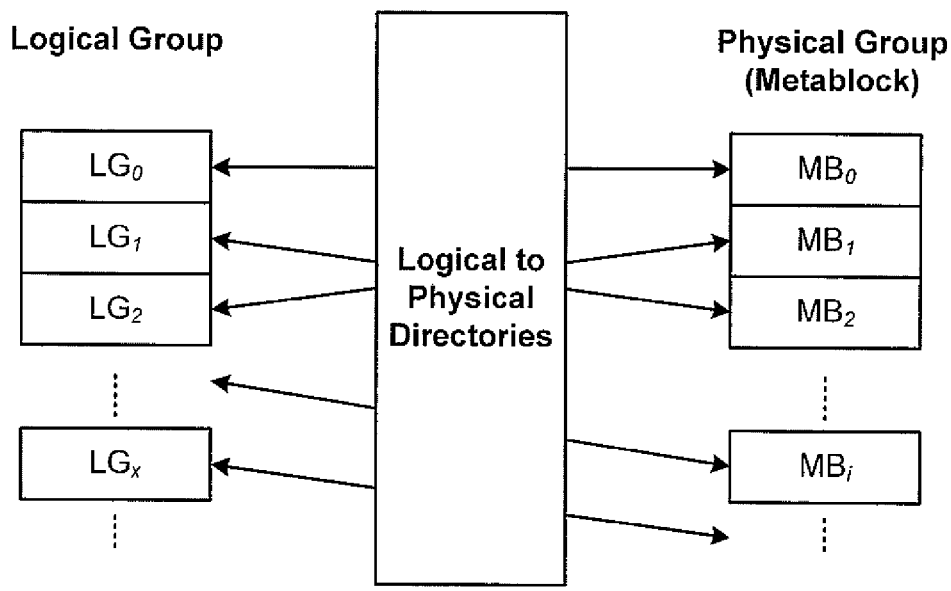
FIG. 3B illustrates schematically the mapping between logical groups and metablocks.

FIG. 3B illustrates schematically the mapping between logical groups and metablocks. Each logical group is mapped to a unique metablock, except for a small number of logical groups in which data is currently being updated. After a logical group has been updated, it may be mapped to a different metablock. The mapping information is maintained in a set of logical to physical directories, which will be described in more detail later.

Other types of logical group to metablock mapping are also contemplated. For example, metablocks with variable size are disclosed in co-pending and co-owned U.S. patent application, entitled, "Adaptive Metablocks," filed by Alan Sinclair, on the same day as the present application. The entire disclosure of the co-pending application is hereby incorporated herein by reference.

One feature of the invention is that the system operates with a single logical partition, and groups of logical sectors throughout the logical address range of the memory system are treated identically. For example, sectors containing system data and sectors containing user data can be distributed anywhere among the logical address space.

Unlike prior art systems, there is no special partitioning or zoning of system sectors (i.e., sectors relating to file allocation tables, directories or sub-directories) in order to localize in logical address space sectors that are likely to contain data with high-frequency and small-size updates. Instead, the present scheme of updating logical groups of sectors will efficiently handle the patterns of access that are typical of system sectors, as well as those typical of file data.

Figure 4:
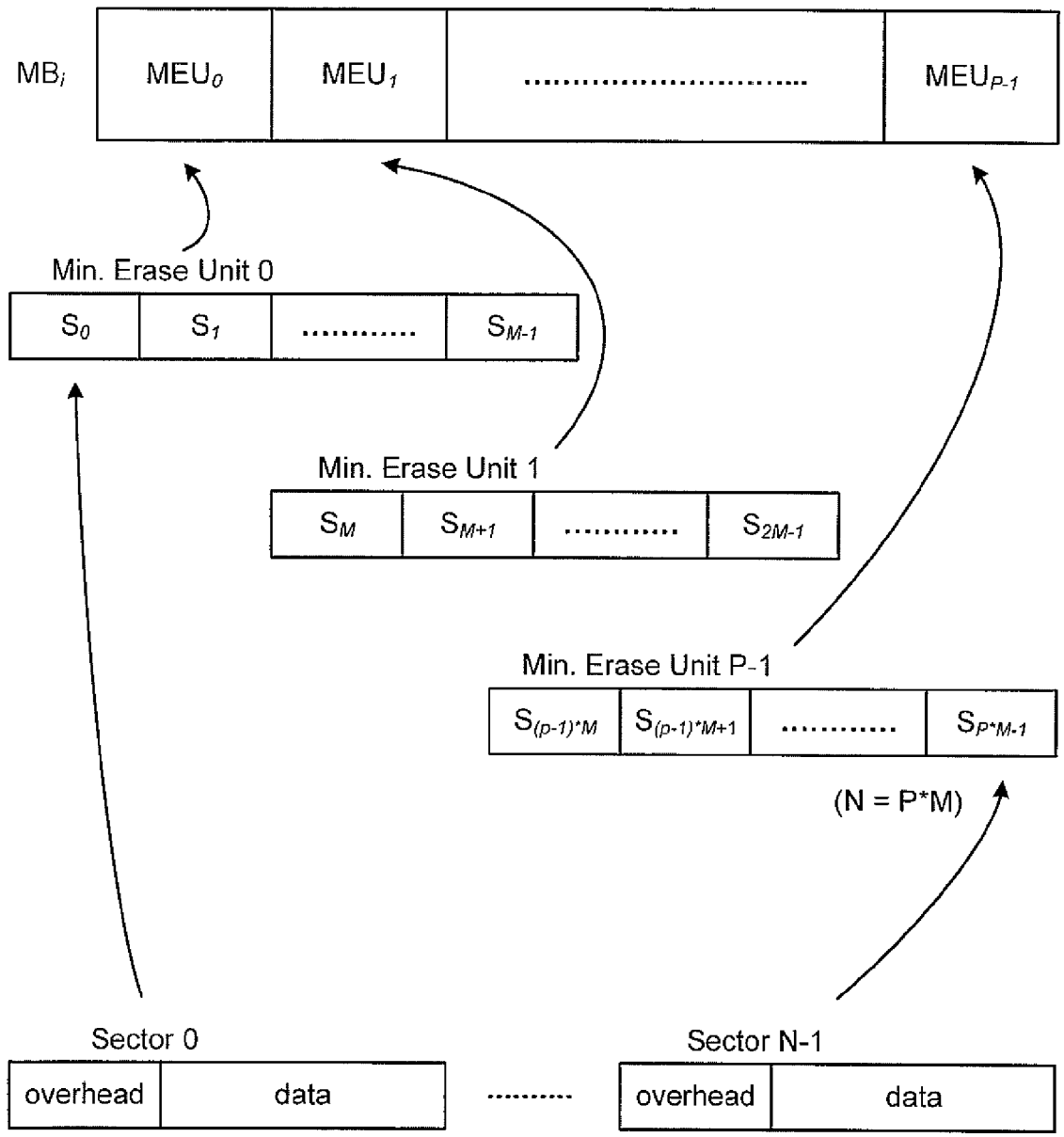
FIG. 4 illustrates the alignment of a metablock with structures in physical memory.

FIG. 4 illustrates the alignment of a metablock with structures in physical memory. Flash memory comprises blocks of memory cells which are erasable together as a unit. Such erase blocks are the minimum unit of erasure of flash memory or minimum erasable unit (MEU) of the memory. The minimum erase unit is a hardware design parameter of the memory, although in some memory systems that supports multiple MEUs erase, it is possible to configure a "super MEU" comprising more than one MEU. For flash EEPROM, a MEU may comprise one sector but preferably multiple sectors. In the example shown, it has M sectors. In the preferred embodiment, each sector can store 512 bytes of data and has a user data portion and a header portion for storing system or overhead data. If the metablock is constituted from P MEUs, and each MEU contains M sectors, then, each metablock will have N=P*M sectors.

The metablock represents, at the system level, a group of memory locations, e.g., sectors that are erasable together. The physical address space of the flash memory is treated as a set of metablocks, with a metablock being the minimum unit of erasure. Within this specification, the terms "metablock" and "block" are used synonymously to define the minimum unit of erasure at the system level for media management, and the term "minimum erase unit" or MEU is used to denote the minimum unit of erasure of flash memory.

Linking of Minimum Erase Units (MEUS) to Form a Metablock

In order to maximize programming speed and erase speed, parallelism is exploited as much as possible by arranging for multiple pages of information, located in multiple MEUs, to be programmed in parallel, and for multiple MEUs to be erased in parallel.

In flash memory, a page is a grouping of memory cells that may be programmed together in a single operation. A page may comprise one or more sector. Also, a memory array may be partitioned into more than one plane, where only one MEU within a plane may be programmed or erased at a time. Finally, the planes may be distributed among one or more memory chips.

In flash memory, the MEUs may comprise one or more page. MEUs within a flash memory chip may be organized in planes. Since one MEU from each plane may be programmed or erased concurrently, it is expedient to form a multiple MEU metablock by selecting one MEU from each plane (see FIG. 5B below.)

Figure 5A:
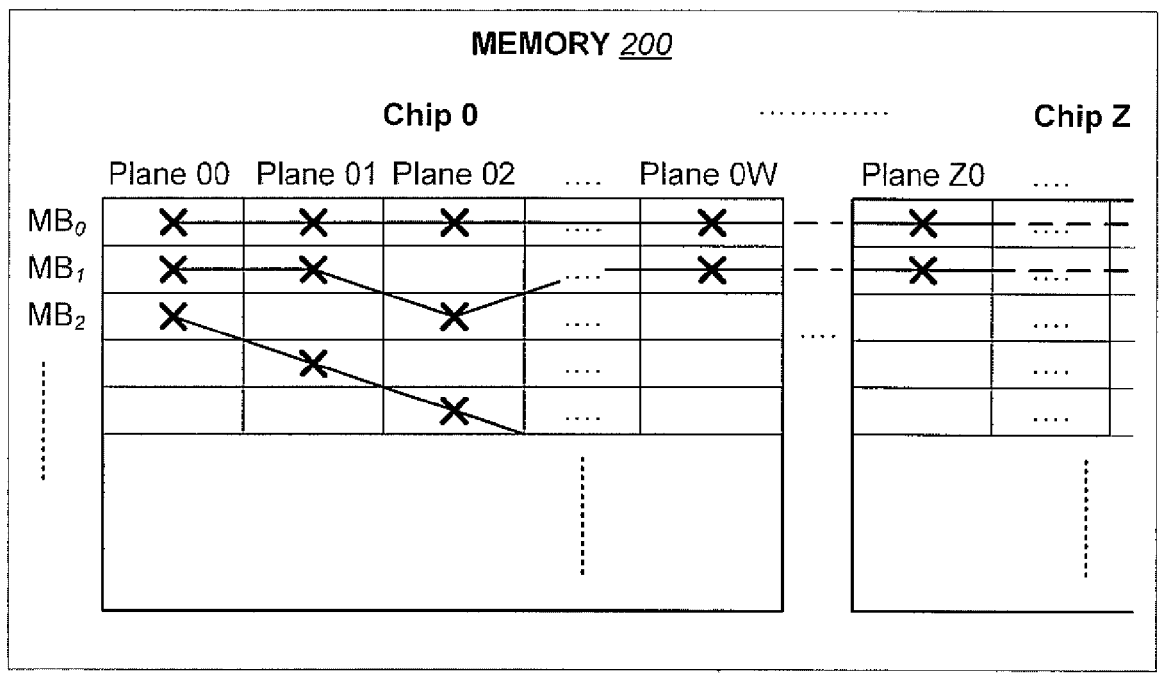
FIG. 5A illustrates metablocks being constituted from linking of minimum erase units of different planes.

FIG. 5A illustrates metablocks being constituted from linking of minimum erase units of different planes. Each metablock, such as MB0, MB1, . . . , is constituted from MEUs from different planes of the memory system, where the different planes may be distributed among one or more chips. The metablock link manager 170 shown in FIG. 2 manages the linking of the MEUs for each metablock. Each metablock is configured during an initial formatting process, and retains its constituent MEUs throughout the life of the system, unless there is a failure of one of the MEUs.

Figure 5B:
FIG. 5B illustrates one embodiment in which one minimum erase unit (MEU) is selected from each plane for linking into a metablock.

FIG. 5B illustrates one embodiment in which one minimum erase unit (MEU) is selected from each plane for linking into a metablock.

Figure 5C:
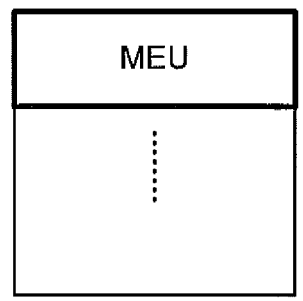
FIG. 5C illustrates another embodiment in which more than one MEU are selected from each plane for linking into a metablock.

FIG. 5C illustrates another embodiment in which more than one MEU are selected from each plane for linking into a metablock. In another embodiment, more than one MEU may be selected from each plane to form a super MEU. For example, a super MEU may be formed from two MEUs. In this case, it may take more than one pass for read or write operation.

The linking and re-linking of MEUs into metablocks is also disclosed in co-pending and co-owned U.S. patent application, entitled "Adaptive Deterministic Grouping of Blocks into Multi-Block Structures," filed by Carlos Gonzales et al, on the same day as the present application. The entire disclosure of the co-pending application is hereby incorporated herein by reference.

Metablock Management

Figure 6:
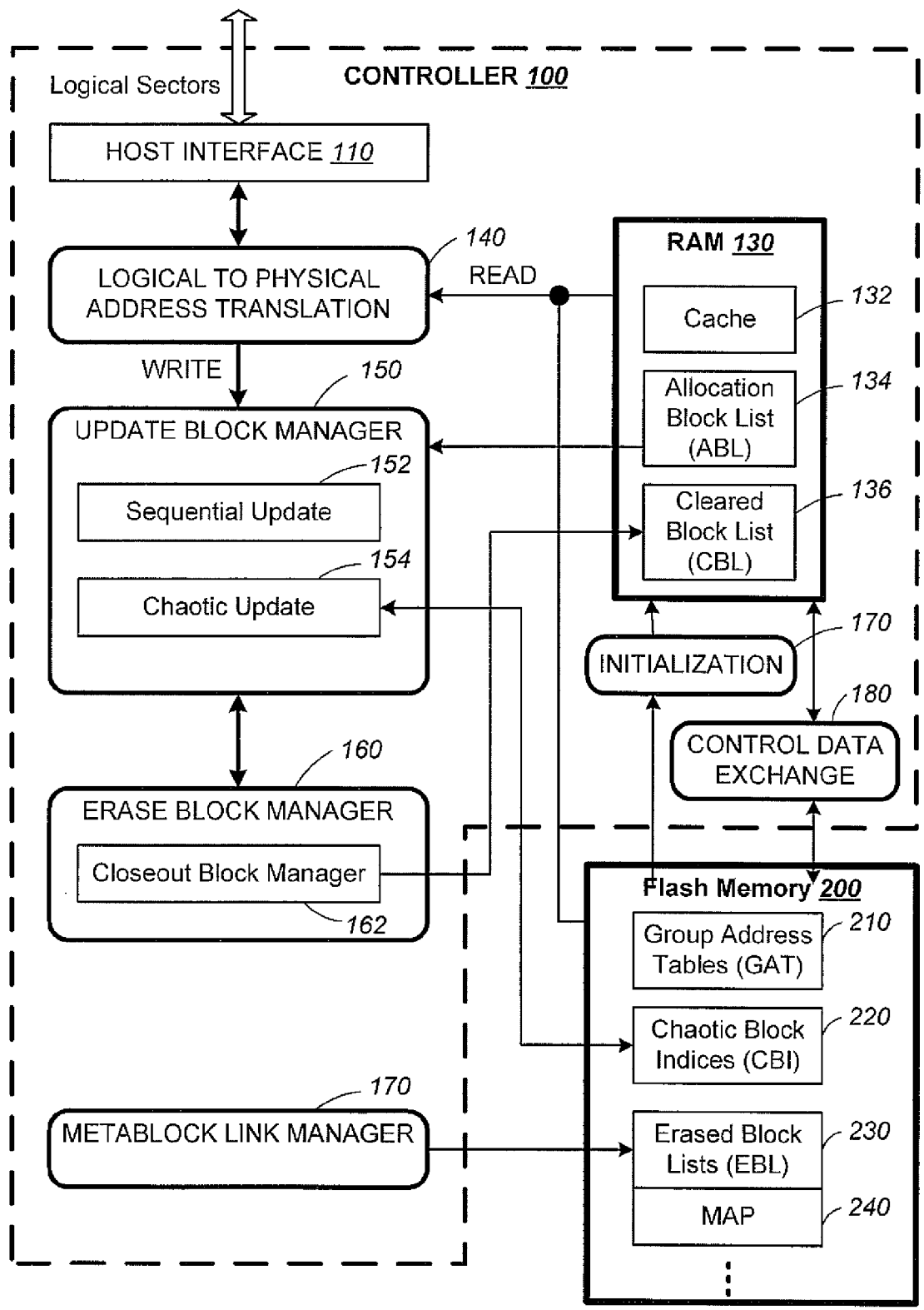
FIG. 6 is a schematic block diagram of the metablock management system as implemented in the controller and flash memory.

FIG. 6 is a schematic block diagram of the metablock management system as implemented in the controller and flash memory. The metablock management system comprises various functional modules implemented in the controller 100 and maintains various control data (including directory data) in tables and lists hierarchically distributed in the flash memory 200 and the controller RAM 130. The function modules implemented in the controller 100 includes an interface module 110, a logical-to-physical address translation module 140, an update block manager module 150, an erase block manager module 160 and a metablock link manager 170.

The interface 110 allows the metablock management system to interface with a host system. The logical to physical address translation module 140 maps the logical address from the host to a physical memory location. The update block Manager module 150 manages data update operations in memory for a given logical group of data. The erased block manager 160 manages the erase operation of the metablocks and their allocation for storage of new information. A metablock link manager 170 manages the linking of subgroups of minimum erasable blocks of sectors to constitute a given metablock. Detailed description of these modules will be given in their respective sections.

During operation the metablock management system generates and works with control data such as addresses, control and status information. Since much of the control data tends to be frequently changing data of small size, it can not be readily stored and maintained efficiently in a flash memory with a large block structure. A hierarchical and distributed scheme is employed to store the more static control data in the nonvolatile flash memory while locating the smaller amount of the more varying control data in controller RAM for more efficient update and access. In the event of a power shutdown or failure, the scheme allows the control data in the volatile controller RAM to be rebuilt quickly by scanning a small set of control data in the nonvolatile memory. This is possible because the invention restricts the number of blocks associated with the possible activity of a given logical group of data. In this way, the scanning is confined. In addition, some of the control data that requires persistence are stored in a nonvolatile metablock that can be updated sector-by-sector, with each update resulting in a new sector being recorded that supercedes a previous one. A sector indexing scheme is employed for control data to keep track of the sector-by-sector updates in a metablock.

The non-volatile flash memory 200 stores the bulk of control data that are relatively static. This includes group address tables (GAT) 210, chaotic block indices (CBI) 220, erased block lists (EBL) 230 and MAP 240. The GAT 210 keeps track of the mapping between logical groups of sectors and their corresponding metablocks. The mappings do not change except for those undergoing updates. The CBI 220 keeps track of the mapping of logically non-sequential sectors during an update. The EBL 230 keeps track of the pool of metablocks that have been erased. MAP 240 is a bitmap showing the erase status of all metablocks in the flash memory.

The volatile controller RAM 130 stores a small portion of control data that are frequently changing and accessed. This includes an allocation block list (ABL) 134 and a cleared block list (CBL) 136. The ABL 134 keeps track of the allocation of metablocks for recording update data while the CBL 136 keeps track of metablocks that have been deallocated and erased. In the preferred embodiment, the RAM 130 acts as a cache for control data stored in flash memory 200.

Update Block Manager

The update block manager 150 (shown in FIG. 2) handles the update of logical groups. According to one aspect of the invention, each logical group of sectors undergoing an update is allocated a dedicated update metablock for recording the update data. In the preferred embodiment, any segment of one or more sectors of the logical group will be recorded in the update block. An update block can be managed to receive updated data in either sequential order or non-sequential (also known as chaotic) order. A chaotic update block allows sector data to be updated in any order within a logical group, and with any repetition of individual sectors. In particular, a sequential update block can become a chaotic update block, without need for relocation of any data sectors. No predetermined allocation of blocks for chaotic data update is required; a non-sequential write at any logical address is automatically accommodated. Thus, unlike prior art systems, there is no special treatment whether the various update segments of the logical group is in logical sequential or non-sequential order. The generic update block will simply be used to record the various segments in the order they are requested by the host. For example, even if host system data or system control data tends to be updated in chaotic fashion, regions of logical address space corresponding to host system data do not need to be treated differently from regions with host user data.

Data of a complete logical group of sectors is preferably stored in logically sequential order in a single metablock. In this way, the index to the stored logical sectors is predefined. When the metablock has in store all the sectors of a given logical group in a predefined order it is said to be "intact." As for an update block, when it eventually fills up with update data in logically sequential order, then the update block will become an updated intact metablock that readily replace the original metablock. On the other hand, if the update block fills up with update data in a logically different order from that of the intact block, the update block is a non-sequential or chaotic update block and the out of order segments must be further processed so that eventually the update data of the logical group is stored in the same order as that of the intact block. In the preferred case, it is in logically sequential order in a single metablock. The further processing involves consolidating the updated sectors in the update block with unchanged sectors in the original block into yet another update metablock. The consolidated update block will then be in logically sequential order and can be used to replace the original block. Under some predetermined condition, the consolidation process is preceded by one or more compaction processes. The compaction process simply re-records the sectors of the chaotic update block into a replacing chaotic update block while eliminating any duplicate logical sector that has been rendered obsolete by a subsequent update of the same logical sector.

The update scheme allows for multiple update threads running concurrently, up to a predefined maximum. Each thread is a logical group undergoing updates using its dedicated update metablock.

Sequential Data Update

When data belonging to a logical group is first updated, a metablock is allocated and dedicated as an update block for the update data of the logical group. The update block is allocated when a command is received from the host to write a segment of one or more sectors of the logical group for which an existing metablock has been storing all its sectors intact. For the first host write operation, a first segment of data is recorded on the update block. Since each host write is a segment of one or more sector with contiguous logical address, it follows that the first update is always sequential in nature. In subsequent host writes, update segments within the same logical group are recorded in the update block in the order received from the host. A block continues to be managed as a sequential update block whilst sectors updated by the host within the associated logical group remain logically sequential. All sectors updated in this logical group are written to this sequential update block, until the block is either closed or converted to a chaotic update block.

Figure 7A:
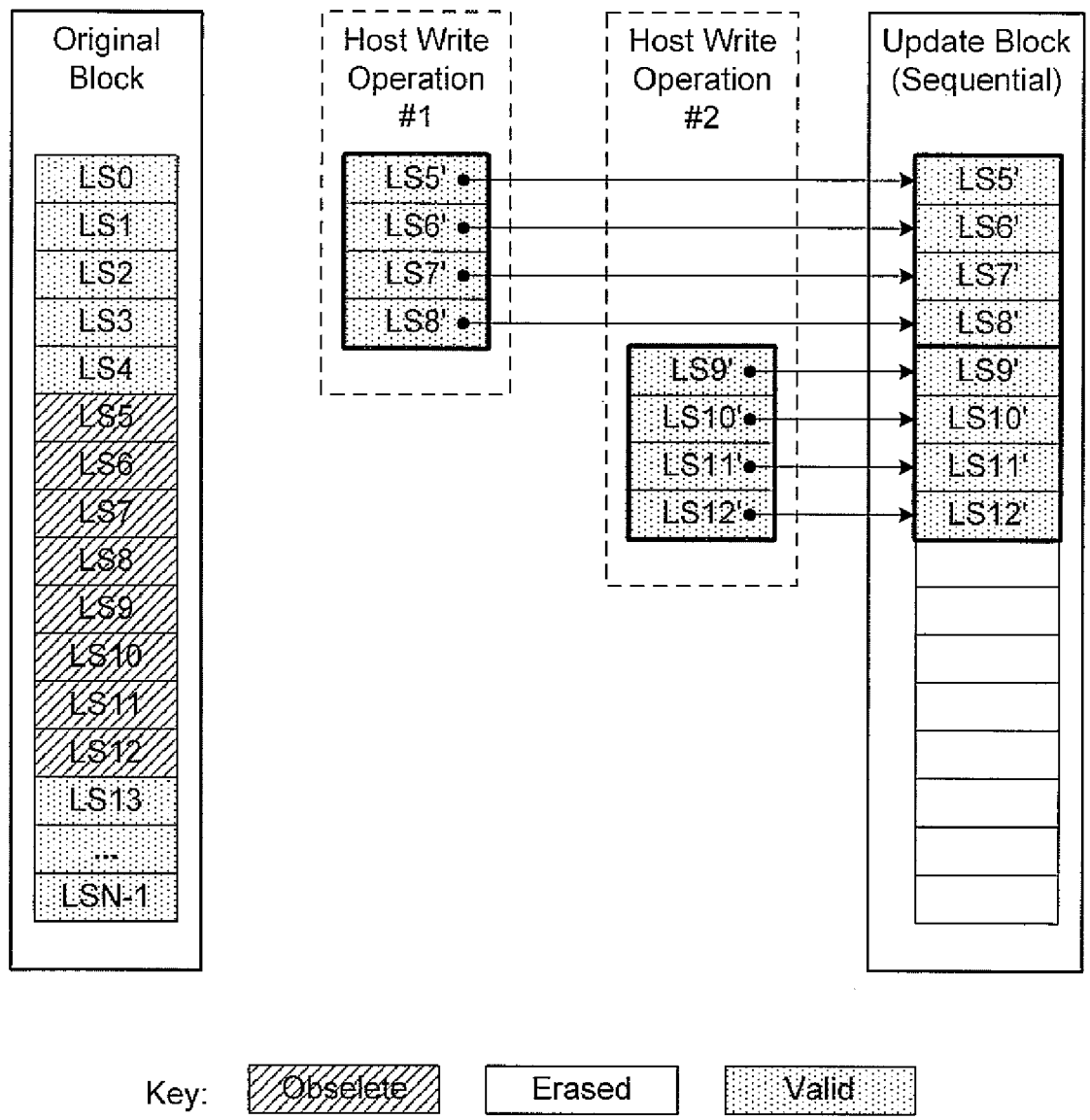
FIG. 7A illustrates an example of sectors in a logical group being written in sequential order to a sequential update block.

FIG. 7A illustrates an example of sectors in a logical group being written in sequential order to a sequential update block as a result of two separate host write operations, whilst the corresponding sectors in the original block for the logical group become obsolete. In host write operation #1, the data in the logical sectors LS5-LS8 are being updated. The updated data as LS5'-LS8' are recorded in a newly allocated dedicated update block.

For expediency, the first sector to be updated in the logical group is recorded in the dedicated update block starting from the first physical sector location. In general, the first logical sector to be updated is not necessarily the logical first sector of the group, and there may therefore be an offset between the start of the logical group and the start of the update block. This offset is known as page tag as described previously in connection with FIG. 3A. Subsequent sectors are updated in logically sequential order. When the last sector of the logical group is written, group addresses wrap around and the write sequence continues with the first sector of the group.

In host write operation #2, the segment of data in the logical sectors LS9-LS12 are being updated. The updated data as LS9'-LS12' are recorded in the dedicated update block in a location directly following where the last write ends. It can be seen that the two host writes are such that the update data has been recorded in the update block in logically sequential order, namely LS5'-LS12'. The update block is regarded as a sequential update block since it has been filled in logically sequential order. The update data recorded in the update block obsoletes the corresponding ones in the original block.

Chaotic Data Update

Chaotic update block management may be initiated for an existing sequential update block when any sector updated by the host within the associated logical group is logically non-sequential. A chaotic update block is a form of data update block in which logical sectors within an associated logical group may be updated in any order and with any amount of repetition. It is created by conversion from a sequential update block when a sector written by a host is logically non-sequential to the previously written sector within the logical group being updated. All sectors subsequently updated in this logical group are written in the next available sector location in the chaotic update block, whatever their logical sector address within the group.

Figure 7B:
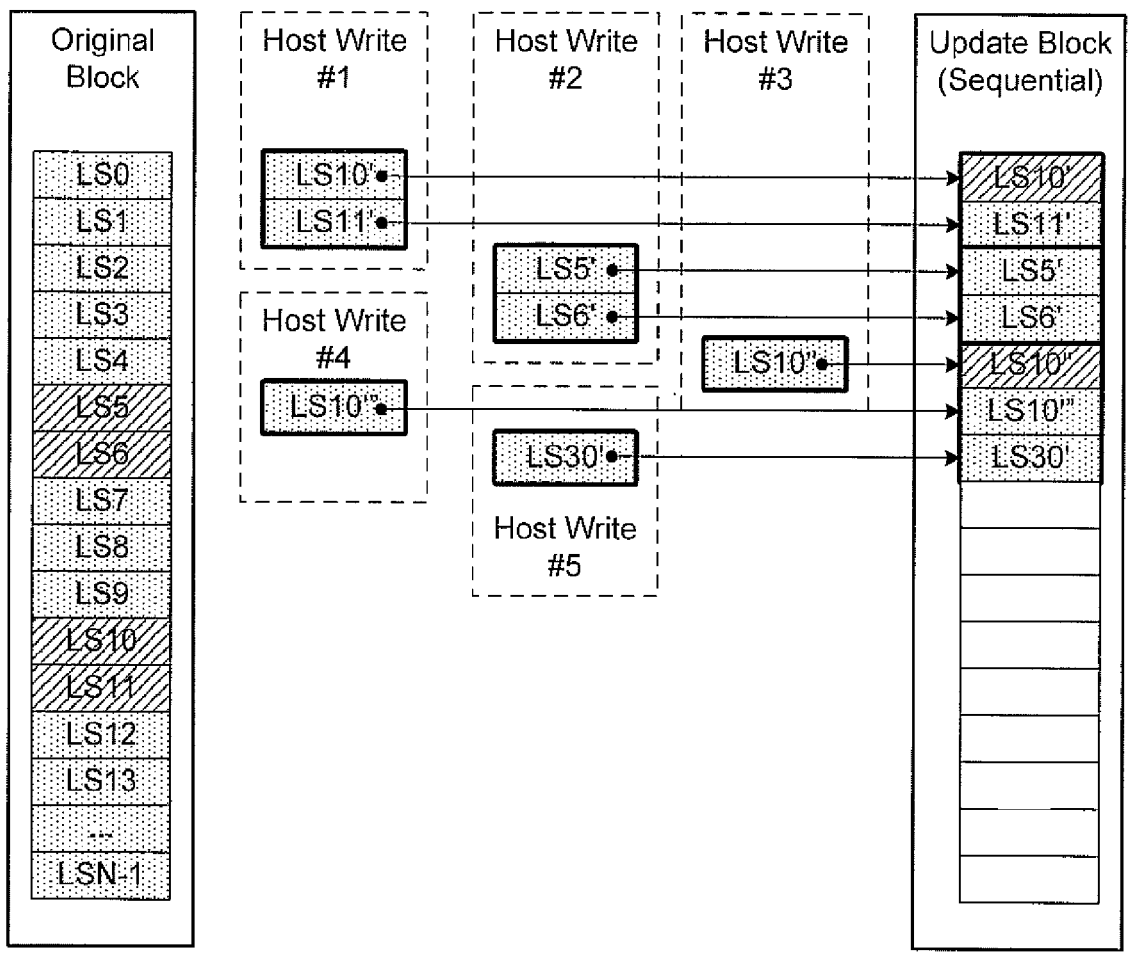
FIG. 7B illustrates an example of sectors in a logical group being written in chaotic order to a chaotic update block.

FIG. 7B illustrates an example of sectors in a logical group being written in chaotic order to a chaotic update block as a result of five separate host write operations, whilst superseded sectors in the original block for the logical group and duplicated sectors in the chaotic update block become obsolete. In host write operation #1, the logical sectors LS10-LS11 of a given logical group stored in an original metablock is updated. The updated logical sectors LS10'-LS11' are stored in a newly allocated update block. At this point, the update block is a sequential one. In host write operation #2, the logical sectors LS5-LS6 are updated as LS5'-LS6' and recorded in the update block in the location immediately following the last write. This converts the update block from a sequential to a chaotic one. In host write operation #3, the logical sector LS10 is being updated again and is recorded in the next location of the update block as LS10". At this point LS10" in the update block supersedes LS10' in a previous recording which in turns supercedes LS10 in the original block. In host write operation #4, the data in the logical sector LS10 is again updated and is recorded in the next location of the update block as LS10'''. Thus, LS10''' is now the latest and only valid data for the logical sector LS10. In host write operation #5, the data in logical sector LS30 is being updated and recorded in the update block as LS30'. Thus, the example illustrates that sectors within a logical group can be written in a chaotic update block in any order and with any repetition.

Forced Sequential Update

Figure 8:
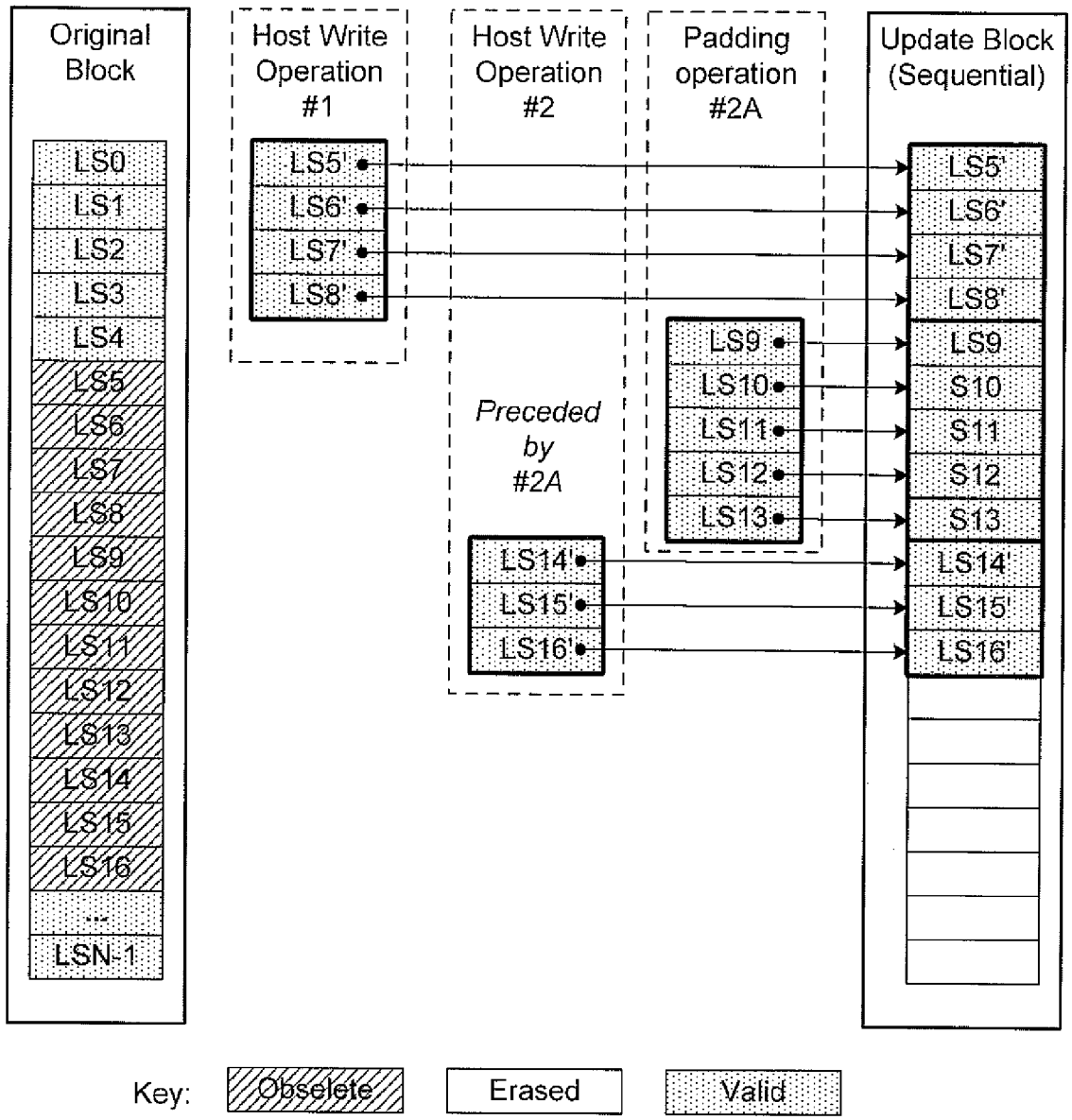
FIG. 8 illustrates an example of sectors in a logical group being written in sequential order to a sequential update block as a result of two separate host write operations that has a discontinuity in logical addresses.

FIG. 8 illustrates an example of sectors in a logical group being written in sequential order to a sequential update block as a result of two separate host write operations that has a discontinuity in logical addresses. In host write #1, the update data in the logical sectors LS5-LS8 is recorded in a dedicated update block as LS5'-LS8'. In host write #2, the update data in the logical sectors LS14-LS16 is being recorded in the update block following the last write as LS14'-LS16'. However, there is an address jump between LS8 and LS14 and the host write #2 would normally render the update block non-sequential. Since the address jump is not substantial, one option is to first perform a padding operation (#2A) by copying the data of the intervening sectors from the original block to the update block before executing host write #2. In this way, the sequential nature of the update block is preserved.

Figure 9:
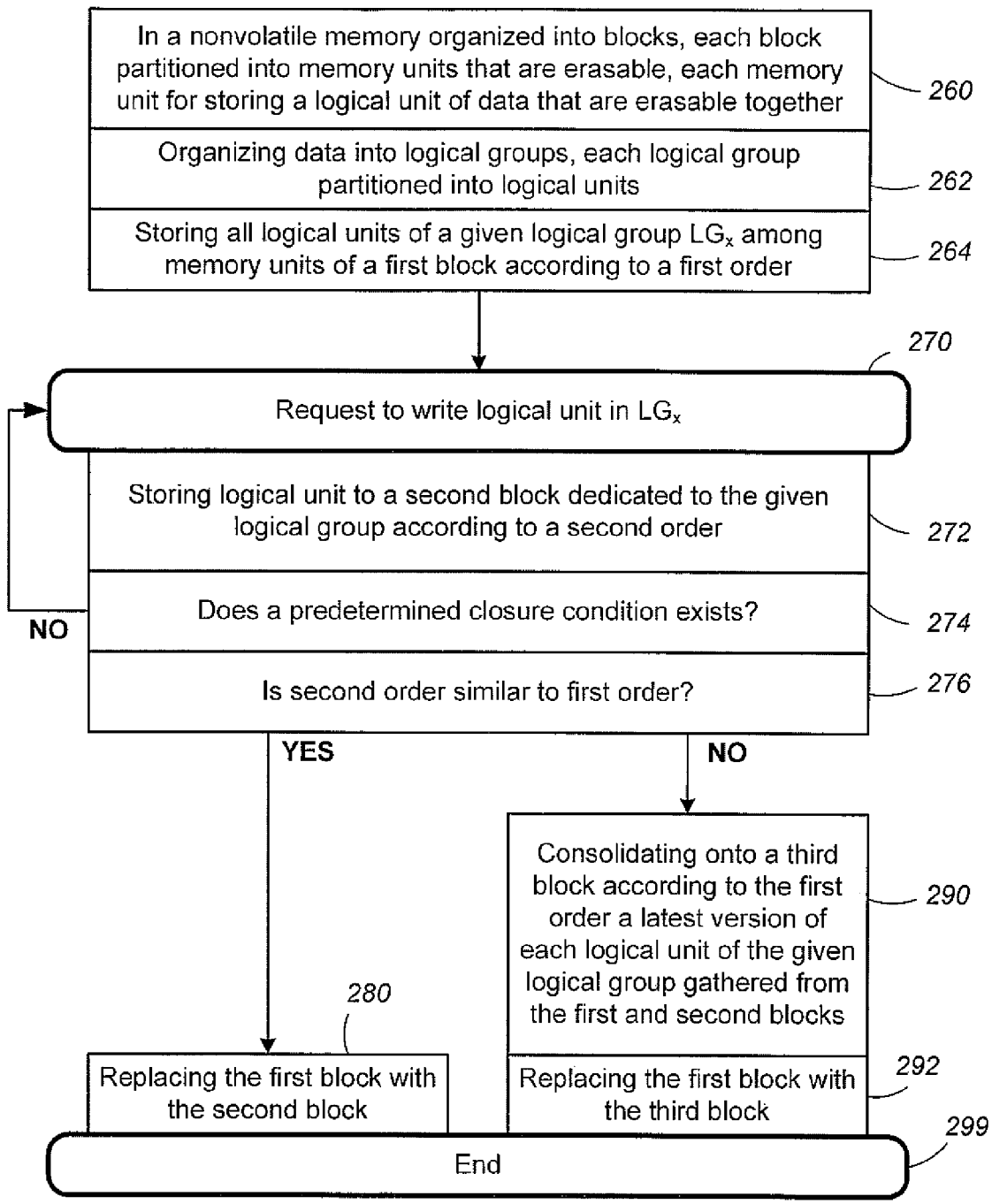
FIG. 9 is a flow diagram illustrating a process by the update block manager to update a logical group of data, according a general embodiment of the invention.

FIG. 9 is a flow diagram illustrating a process by the update block manager to update a logical group of data, according a general embodiment of the invention. The update process comprises the following steps:

STEP 260: The memory is organized into blocks, each block partitioned into memory units that are erasable together, each memory unit for storing a logical unit of data.

STEP 262: The data is organized into logical groups, each logical group partitioned into logical units.

STEP 264: In the standard case, all logical units of a logical group is stored among the memory units of an original block according to a first prescribed order, preferably, in logically sequential order. In this way, the index for accessing the individual logical units in the block is known.

STEP 270: For a given logical group (e.g., $LG_x$) of data, a request is made to update a logical unit within $LG_x$. (A logical unit update is given as an example. In general the update will be a segment of one or more contiguous logical units within $LG_X$.)

STEP 272: The requested update logical unit is to be stored in a second block, dedicated to recording the updates of $LG_X$. The recording order is according to a second order, typically, the order the updates are requested. One feature of the invention allows an update block to be set up initially generic to recording data in logically sequential or chaotic order. So depending on the second order, the second block can be a sequential one or a chaotic one.

STEP 274: The second block continues to have requested logical units recorded as the process loops back to STEP 270. The second block will be closed to receiving further update when a predetermined condition for closure materializes. In that case, the process proceeds to STEP 276.

STEP 276: Determination is made whether or not the closed, second block has its update logical units recorded in a similar order as that of the original block. The two blocks are considered to have similar order when they recorded logical units differ by only a page tag, as described in connection with FIG. 3A. If the two blocks have similar order the process proceeds to STEP 280, otherwise, some sort of garbage collection need to be performed in STEP 290.

STEP 280: Since the second block has the same order as the first block, it is used to replace the original, first block. The update process then ends at STEP 299.

STEP 290: The latest version of each logical units of the given logical group are gathered from among the second block (update block) and the first block (original block). The consolidated logical units of the given logical group are then written to a third block in an order similar to the first block.

STEP 292: Since the third block (consolidated block) has a similar order to the first block, it is used to replace the original, first block. The update process then ends at STEP 299.

STEP 299: When a closeout process creates an intact update block, it becomes the new standard block for the given logical group. The update thread for the logical group will be terminated.

Figure 10:
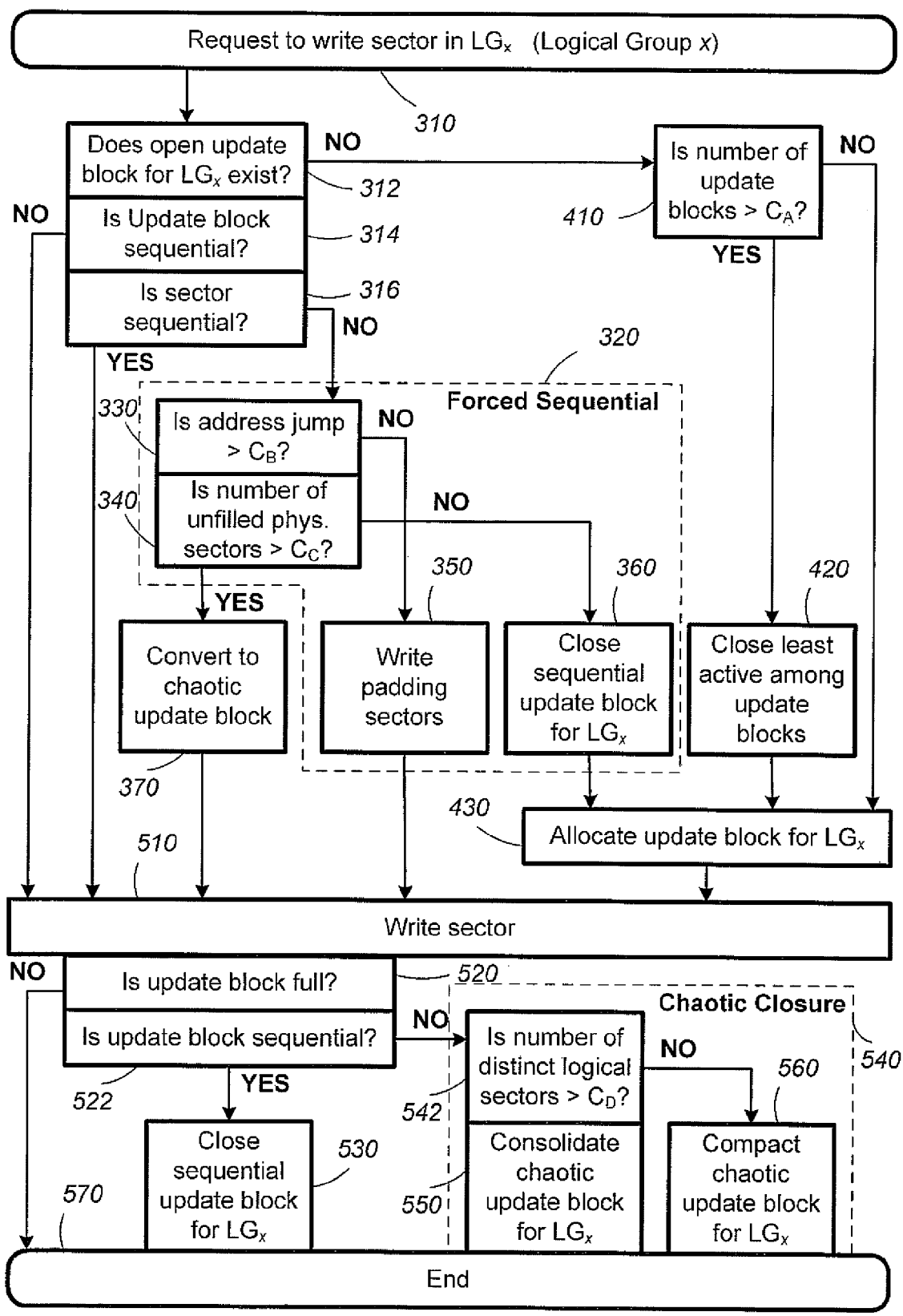
FIG. 10 is a flow diagram illustrating a process by the update block manager to update a logical group of data, according a preferred embodiment of the invention.

FIG. 10 is a flow diagram illustrating a process by the update block manager to update a logical group of data, according a preferred embodiment of the invention. The update process comprises the following steps:

STEP 310: For a given logical group (e.g., $LG_X$) of data, a request is made to update a logical sector within $LG_X$. (A sector update is given as an example. In general the update will be a segment of one or more contiguous logical sectors within $LG_X$.)

STEP 312: If an update block dedicated to $LG_X$ does not already exist, proceed to STEP 410 to initiate a new update thread for the logical group. This will be accomplished by allocating an update block dedicated to recording update data of the logical group. If there is already an update block open, proceed to STEP 314 to begin recording the update sector onto the update block.

STEP 314: If the current update block is already chaotic (i.e., non-sequential) then simply proceed to STEP 510 for recording the requested update sector onto the chaotic update block. If the current update block is sequential, proceed to STEP 316 for processing of a sequential update block.

STEP 316: One feature of the invention allows an update block to be set up initially generic to recording data in logically sequential or chaotic order. However, since the logical group ultimately has its data stored in a metablock in a logically sequential order, it is desirable to keep the update block sequential as far as possible. Less processing will then be required when an update block is closed to further updates as garbage collection will not be needed.

Thus determination is made whether the requested update will follow the current sequential order of the update block. If the update follows sequentially, then proceed to STEP 510 to perform a sequential update, and the update block will remain sequential. On the other hand, if the update does not follow sequentially (chaotic update), it will convert the sequential update block to a chaotic one if no other actions are taken.

In one embodiment, nothing more is done to salvage the situation and the process proceeds directly to STEP 370 where the update is allowed to turn the update block into a chaotic one.

Optional Forced Sequential Process

In another embodiment, a forced sequential process STEP 320 is optionally performed to preserve the sequential update block as far as possible in view of a pending chaotic update. There are two situations, both of which require copying missing sectors from the original block to maintain the sequential order of logical sectors recorded on the update block. The first situation is where the update creates a short address jump. The second situation is to prematurely close out an update block in order to keep it sequential. The forced sequential process STEP 320 comprises the following substeps:

STEP 330: If the update creates a logical address jump not greater a predetermined amount, $C_B$, the process proceeds to a forced sequential update process in STEP 350, otherwise the process proceeds to STEP 340 to consider if it qualifies for a forced sequential closeout.

STEP 340: If the number of unfilled physical sectors exceeds a predetermined design parameter, $C_C$, whose typical value is half of the size of the update block, then the update block is relatively unused and will not be prematurely closed. The process proceeds to STEP 370 and the update block will become chaotic. On the other hand, if the update block is substantially filled, it is considered to have been well utilized already and therefore is directed to STEP 360 for forced sequential closeout.

STEP 350: Forced sequential update allows current sequential update block to remain sequential as long as the address jump does not exceed a predetermined amount, CB. Essentially, sectors from the update block's associated original block are copied to fill the gap spanned by the address jump. Thus, the sequential update block will be padded with data in the intervening addresses before proceeding to STEP 510 to record the current update sequentially.

STEP 360: Forced sequential closeout allows the currently sequential update block to be closed out if it is already substantially filled rather than converted to a chaotic one by the pending chaotic update. A chaotic or non-sequential update is defined as one with a forward address transition not covered by the address jump exception described above, a backward address transition, or an address repetition. To prevent a sequential update block to be converted by a chaotic update, the unwritten sector locations of the update block are filled by copying sectors from the update block's associated original partly-obsolete block. The original block is then fully obsolete and may be erased. The current update block now has the full set of logical sectors and is then closed out as an intact metablock replacing the original metablock. The process then proceeds to STEP 430 to have a new update block allocated in its place to accept the recording of the pending sector update that was first requested in STEP 310.

Conversion to Chaotic Update Block

STEP 370: When the pending update is not in sequential order and optionally, if the forced sequential conditions are not satisfied, the sequential update block is allowed to be converted to a chaotic one by virtue of allowing the pending update sector, with non-sequential address, to be recorded on the update block when the process proceeds to STEP 510. If the maximum number of chaotic update blocks exist, it is necessary to close the least recently accessed chaotic update block before allowing the conversion to proceed; thus preventing the maximum number of chaotic blocks from being exceeded. The identification of the least recently accessed chaotic update block is the same as the general case described in STEP 420, but is constrained to chaotic update blocks only. Closing a chaotic update block at this time is achieved by consolidation as described in STEP 550.

Allocation of New Update Block subject to System Restriction

STEP 410: The process of allocating an erase metablock as an update block begins with the determination whether a predetermined system limitation is exceeded or not. Due to finite resources, the memory management system typically allows a predetermined maximum number of update blocks, $C_A$, to exist concurrently. This limit is the aggregate of sequential update blocks and chaotic update blocks, and is a design parameter. In a preferred embodiment, the limit is, for example, a maximum of 8 update blocks. Also, due to the higher demand on system resources, there may also be a corresponding predetermined limit on the maximum number of chaotic update blocks that can be open concurrently (e.g., 4.)

Thus, when $C_A$ update blocks have already been allocated, then the next allocation request could only be satisfied after closing one of the existing allocated ones. The process proceeds to STEP 420. When the number of open update blocks is less than $C_A$, the process proceeds directly to STEP 430.

STEP 420: In the event the maximum number of update blocks, $C_A$, is exceeded, the least-recently accessed update block is closed and garbage collection is performed. The least recently accessed update block is identified as the update block associated with the logical block that has been accessed least recently. For the purpose of determining the least recently accessed blocks, an access includes writes and optionally reads of logical sectors. A list of open update blocks is maintained in order of access; at initialization, no access order is assumed. The closure of an update block follows along the similar process described in connection with STEP 360 and STEP 530 when the update block is sequential, and in connection with STEP 540 when the update block is chaotic. The closure makes room for the allocation of a new update block in STEP 430.

STEP 430: The allocation request is fulfilled with the allocation of a new metablock as an update block dedicated to the given logical group $LG_X$. The process then proceeds to STEP 510.

Record Update Data Onto Update Block

STEP 510: The requested update sector is recorded onto next available physical location of the update block. The process then proceeds to STEP 520 to determine if the update block is ripe for closeout.

Update Block Closeout

STEP 520: If the update block still has room for accepting additional updates, proceed to STEP 570. Otherwise proceed to STEP 522 to closeout the update block. There are two possible implementations of filling up an update block when the current requested write attempts to write more logical sectors than the block has room for. In the first implementation, the write request is split into two portions, with the first portion writing up to the last physical sector of the block. The block is then closed and the second portion of the write will be treated as the next requested write. In the other implementation, the requested write is withheld while the block has it remaining sectors padded and is then closed. The requested write will be treated as the next requested write.

STEP 522: If the update block is sequential, proceed to STEP 530 for sequential closure. If the update block is chaotic, proceed to STEP 540 for chaotic closure.

Sequential Update Block Closeout

STEP 530: Since the update block is sequential and fully filled, the logical group stored in it is intact. The metablock is intact and replaces the original one. At this time, the original block is fully obsolete and may be erased. The process then proceeds to STEP 570 where the update thread for the given logical group ends.

Chaotic Update Block Closeout

STEP 540: Since the update block is non-sequentially filled and may contain multiple updates of some logical sectors, garbage collection is performed to salvage the valid data in it. The chaotic update block will either be compacted or consolidated. Which process to perform will be determined in STEP 542.

STEP 542: To perform compaction or consolidation will depend on the degeneracy of the update block. If a logical sector is updated multiple times, its logical address is highly degenerate. There will be multiple versions of the same logical sector recorded on the update block and only the last recorded version is the valid one for that logical sector. In an update block containing logical sectors with multiple versions, the number of distinct logical sectors will be much less than that of a logical group.

In the preferred embodiment, when the number of distinct logical sectors in the update block exceeds a predetermined design parameter, $C_D$, whose typical value is half of the size of a logical group, the closeout process will perform a consolidation in STEP 550, otherwise the process will proceed to compaction in STEP 560.

STEP 550: If the chaotic update block is to be consolidated, the original block and the update block will be replaced by a new standard metablock containing the consolidated data. After consolidation the update thread will end in STEP 570.

STEP 560: If the chaotic update block is to be compacted, it will be replaced by a new update block carrying the compacted data. After compaction the processing of the compacted update block will end in STEP 570. Alternatively, compaction can be delayed until the update block is written to again, thus removing the possibility of compaction being followed by consolidation without intervening updates.

The new update block will then be used in further updating of the given logical block when a next request for update in $LG_X$ appears in STEP 502.

STEP 570: When a closeout process creates an intact update block, it becomes the new standard block for the given logical group. The update thread for the logical group will be terminated. When a closeout process creates a new update block replacing an existing one, the new update block will be used to record the next update requested for the given logical group. When an update block is not closed out, the processing will continue when a next request for update in $LG_X$ appears in STEP 310.

As can be seen from the process described above, when a chaotic update block is closed, the update data recorded on it is further processed. In particular its valid data is garbage collected either by a process of compaction to another chaotic block, or by a process of consolidation with its associated original block to form a new standard sequential block.

Figure 11A:
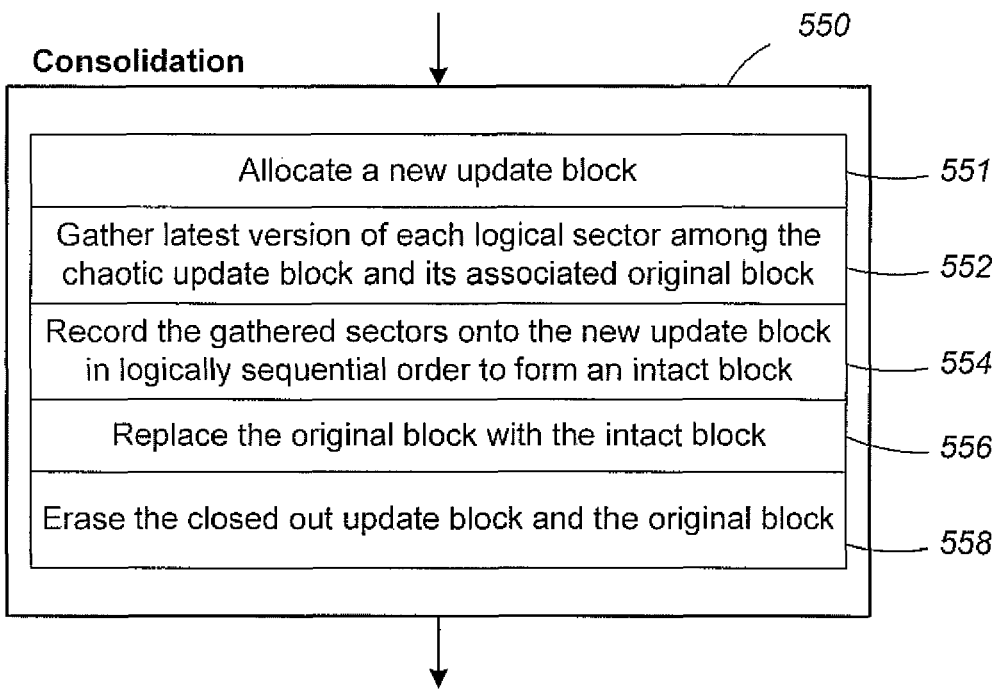
FIG. 11A is a flow diagram illustrating in more detail the consolidation process of closing a chaotic update block shown in FIG. 10.

FIG. 11A is a flow diagram illustrating in more detail the consolidation process of closing a chaotic update block shown in FIG. 10. Chaotic update block consolidation is one of two possible processes performed when the update block is being closed out, e.g., when the update block is full with its last physical sector location written. Consolidation is chosen when the number of distinct logical sectors written in the block exceeds a predetermined design parameter, $C_D$. The consolidation process STEP 550 shown in FIG. 10 comprises the following substeps:

STEP 551: When a chaotic update block is being closed, a new metablock replacing it will be allocated.

STEP 552: Gather the latest version of each logical sector among the chaotic update block and its associated original block, ignoring all the obsolete sectors.

STEP 554: Record the gathered valid sectors onto the new metablock in logically sequential order to form an intact block, i.e., a block with all the logical sectors of a logical group recorded in sequential order.

STEP 556: Replace the original block with the new intact block.

STEP 558: Erase the closed out update block and the original block.

Figure 11B:
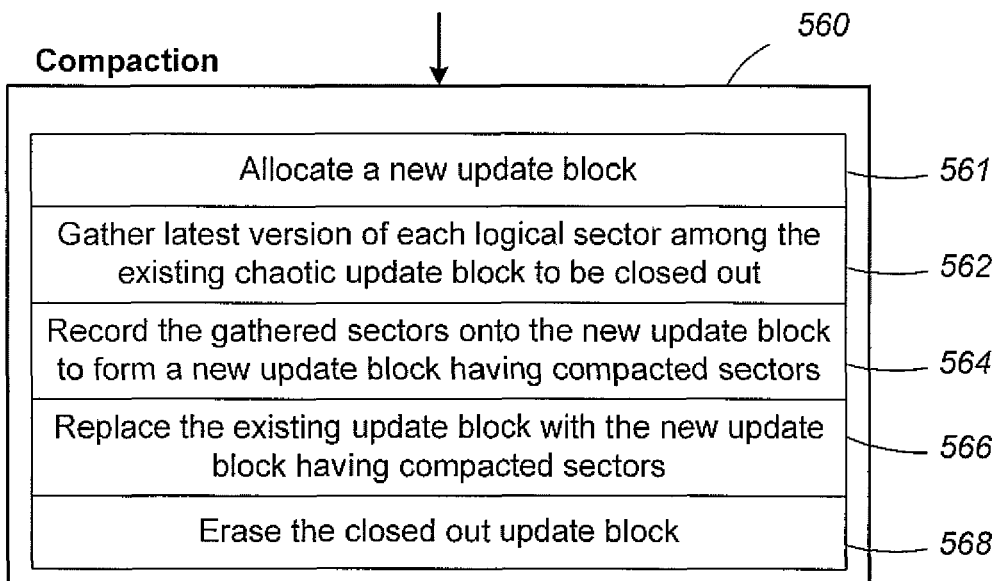
FIG. 11B is a flow diagram illustrating in more detail the compaction process for closing a chaotic update block shown in FIG. 10.

FIG. 11B is a flow diagram illustrating in more detail the compaction process for closing a chaotic update block shown in FIG. 10. Compaction is chosen when the number of distinct logical sectors written in the block is below a predetermined design parameter, $C_D$. The compaction process STEP 560 shown in FIG. 10 comprises the following substeps:

STEP 561: When a chaotic update block is being compacted, a new metablock replacing it will be allocated.

STEP 562: Gather the latest version of each logical sector among the existing chaotic update block to be compacted.

STEP 564: Record the gathered sectors onto the new update block to form a new update block having compacted sectors.

STEP 566: Replace the existing update block with the new update block having compacted sectors.

STEP 568: Erase the closed out update block

Logical and Metablock States

Figure 12A:
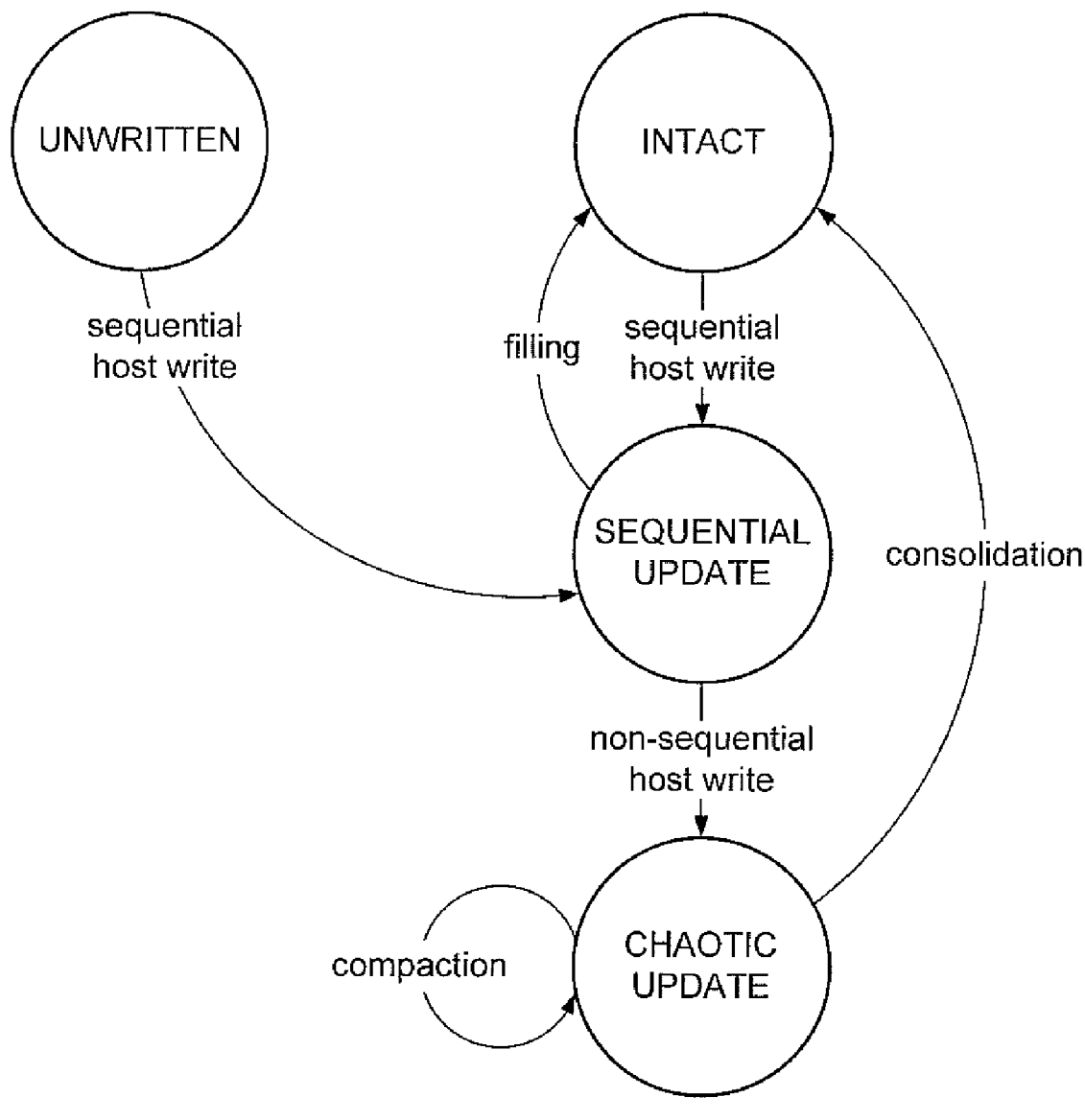
FIG. 12A illustrates all possible states of a Logical Group, and the possible transitions between them under various operations.

FIG. 12A illustrates all possible states of a Logical Group, and the possible transitions between them under various operations.

FIG. 12B is a table listing the possible states of a Logical Group. The Logical Group states are defined as follows:
1. Intact: All logical sectors in the Logical Group have been written in logically sequential order, possibly using page tag wrap around, in a single metablock.
2. Unwritten: No logical sector in the Logical Group has ever been written. The Logical Group is marked as unwritten in a group address table and has no allocated metablock. A predefined data pattern is returned in response to a host read for every sector within this group.
3. Sequential Update: Some sectors within the Logical Group have been written in logically sequential order in a metablock, possibly using page tag, so that they supersede the corresponding logical sectors from any previous Intact state of the group.
4. Chaotic Update: Some sectors within the Logical Group have been written in logically non-sequential order in a metablock, possibly using page tag, so that they supersede the corresponding logical sectors from any previous Intact state of the group. A sector within the group may be written more than once, with the latest version superseding all previous versions.

Figure 13A:
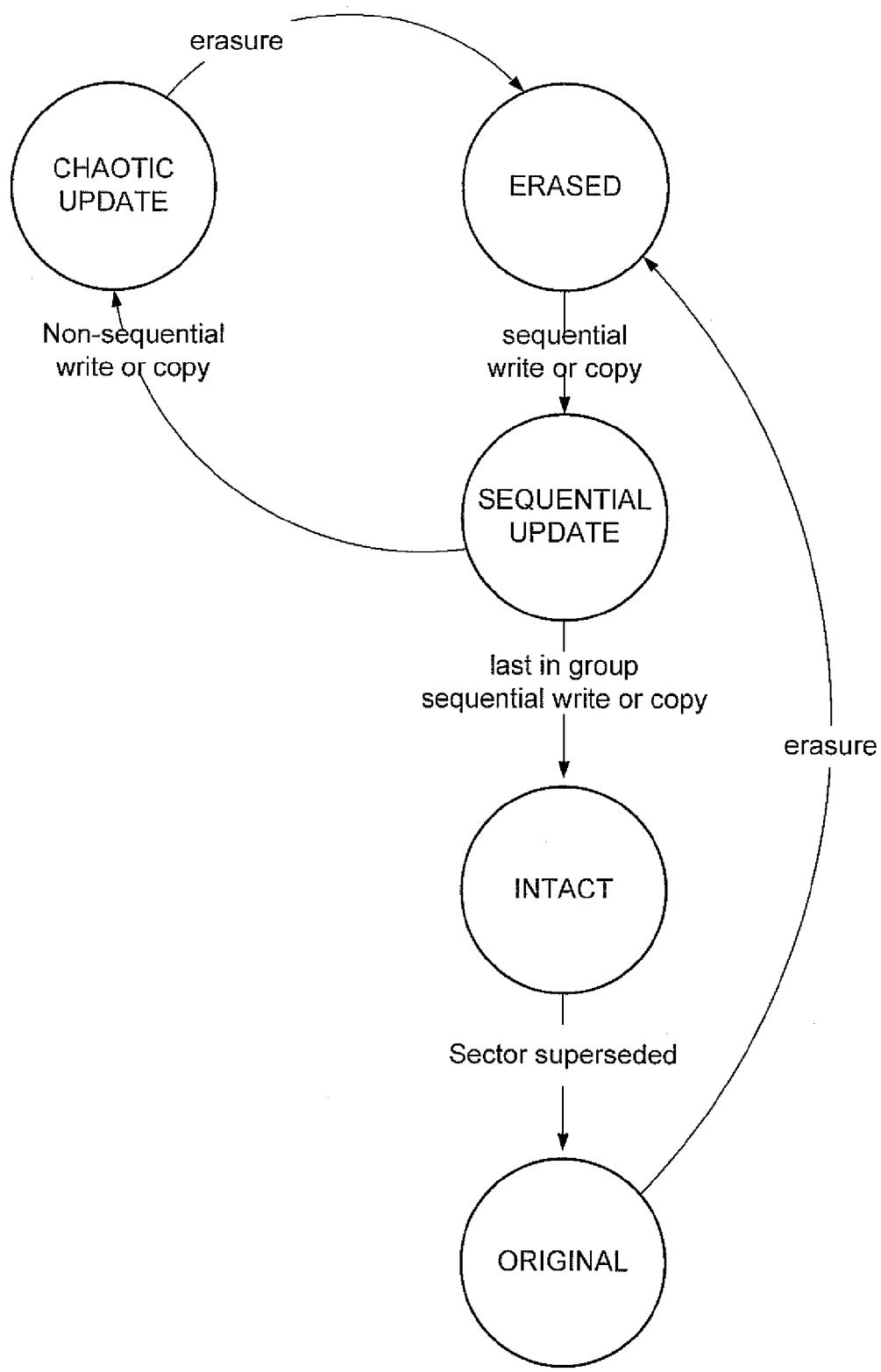
FIG. 13A illustrates all possible states of a metablock, and the possible transitions between them under various operations. A metablock is a Physical Group corresponding to a Logical Group.

FIG. 13A illustrates all possible states of a metablock, and the possible transitions between them under various operations.

FIG. 13B is a table listing the possible states of a metablock. The metablock states are defined as follows:
1. Erased: All the sectors in the metablock are erased.
2. Sequential Update: The metablock is partially written with sectors in logically sequential order, possibly using page tag. All the sectors belong to the same Logical Group.
3. Chaotic Update: The metablock is partially or fully written with sectors in logically non-sequential order. Any sector can be written more than once. All sectors belong to the same Logical Group.
4: Intact: The metablock is fully written in logically sequential order, possibly using page tag.
5: Original: The metablock was previously Intact but at least one sector has been made obsolete by a host data update.

FIGS. 14(A)-14(J) are state diagrams showing the effect of various operations on the state of the logical group and also on the physical metablock.

Figures 14A, 14B:
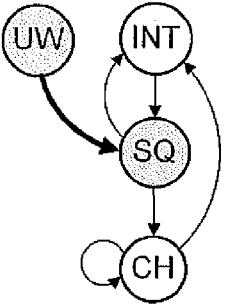

FIG. 14(A) shows state diagrams corresponding to the logical group and the metablock transitions for a first write operation. The host writes one or more sectors of a previously unwritten Logical Group in logically sequential order to a newly allocated Erased metablock. The Logical Group and the metablock go to the Sequential Update state.

FIG. 14(B) shows state diagrams corresponding to the logical group and the metablock transitions for a first intact operation. A previously unwritten Sequential Update Logical Group becomes Intact as all the sectors are written sequentially by the host. The transition can also happen if the card fills up the group by filling the remaining unwritten sectors with a predefined data pattern. The metablock becomes Intact.

Figures 14C, 14D, 14E:
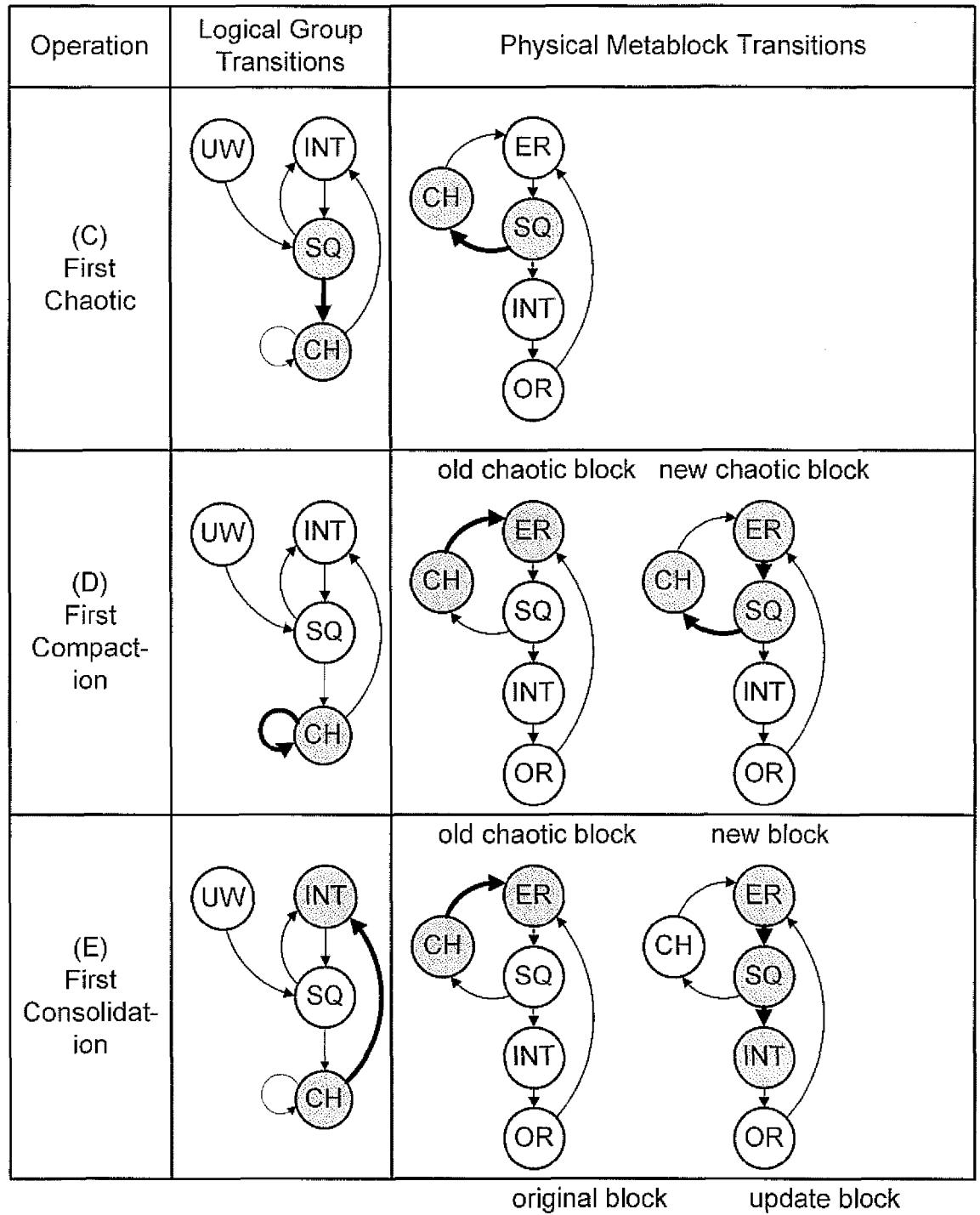

FIG. 14(C) shows state diagrams corresponding to the logical group and the metablock transitions for a first chaotic operation. A previously unwritten Sequential Update Logical Group becomes Chaotic when at least one sector has been written non-sequentially by the host.

FIG. 14(D) shows state diagrams corresponding to the logical group and the metablock transitions for a first compaction operation. All valid sectors within a previously unwritten Chaotic Update Logical Group are copied to a new Chaotic metablock from the old block, which is then erased.

FIG. 14(E) shows state diagrams corresponding to the logical group and the metablock transitions for a first consolidation operation. All valid sectors within a previously unwritten Chaotic Update Logical Group are moved from the old Chaotic block to fill a newly allocated Erased block in logically sequential order. Sectors unwritten by the host are filled with a predefined data pattern. The old chaotic block is then erased.

Figures 14F, 14G, 14H:
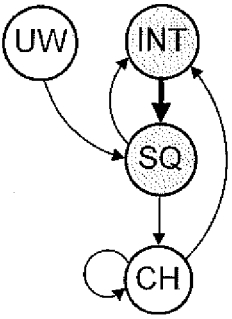

FIG. 14(F) shows state diagrams corresponding to the logical group and the metablock transitions for a sequential write operation. The host writes one or more sectors of an Intact Logical Group in logically sequential order to a newly allocated Erased metablock. The Logical Group and the metablock go to Sequential Update state. The previously Intact metablock becomes an Original metablock.

FIG. 14(G) shows state diagrams corresponding to the logical group and the metablock transitions for a sequential fill operation. A Sequential Update Logical Group becomes Intact when all its sectors are written sequentially by the host. This may also occur during garbage collection when the Sequential Update Logical Group is filled with valid sectors from the original block in order to make it Intact, after which the original block is erased.

FIG. 14(H) shows state diagrams corresponding to the logical group and the metablock transitions for a non-sequential write operation. A Sequential Update Logical Group becomes Chaotic when at least one sector is written non-sequentially by the host. The non-sequential sector writes may cause valid sectors in either the Update block or the corresponding Original block to become obsolete.

FIG. 14(I) shows state diagrams corresponding to the logical group and the metablock transitions for a compaction operation. All valid sectors within a Chaotic Update Logical Group are copied into a new chaotic metablock from the old block, which is then erased. The Original block is unaffected.

FIG. 14(J) shows state diagrams corresponding to the logical group and the metablock transitions for a consolidation operation. All valid sectors within a Chaotic Update Logical Group are copied from the old chaotic block and the Original block to fill a newly allocated Erased block in logically sequential order. The old chaotic block and the Original block are then erased.

Update Block Tracking and Management

Figure 15:
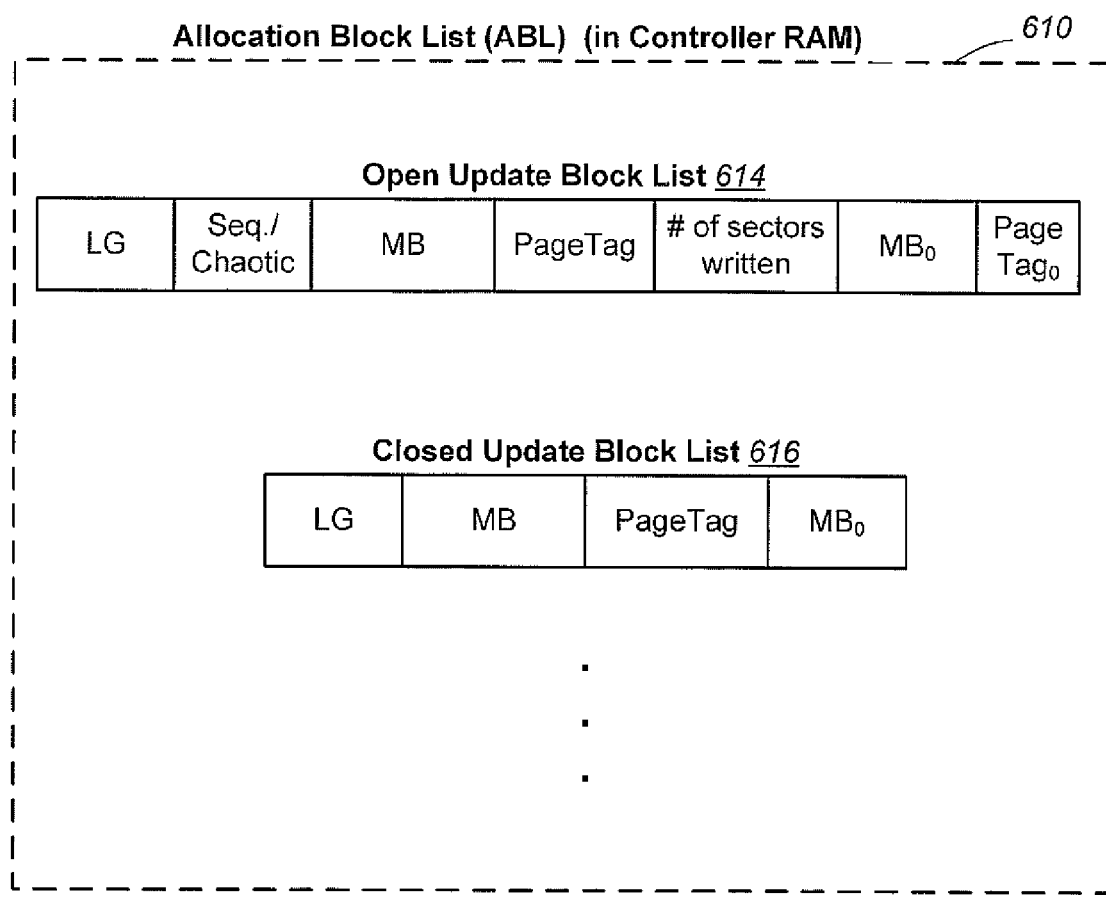
FIG. 15 illustrates a preferred embodiment of the structure of an allocation block list (ABL) for keeping track of opened and closed update blocks and erased blocks for allocation.

FIG. 15 illustrates a preferred embodiment of the structure of an allocation block list (ABL) for keeping track of opened and closed update blocks and erased blocks for allocation. The allocation block list (ABL) 610 is held in controller RAM 130, to allow management of allocation of erased blocks, allocated update blocks, associated blocks and control structures, and to enable correct logical to physical address translation. In the preferred embodiment, the ABL includes a list of erased blocks, an open update block list 614 and a closed update block list 616.

The open update block list 614 is the set of block entries in the ABL with the attributes of Open Update Block. The open update block list has one entry for each data update block currently open. Each entry holds the following information. LG is the logical group address the current update metablock is dedicated to. Sequential/Chaotic is a status indicating whether the update block has been filled with sequential or chaotic update data. MB is the metablock address of the update block. Page tag is the starting logical sector recorded at the first physical location of the update block. Number of sectors written indicates the number of sectors currently written onto the update block. $MB_0$ is the metablock address of the associated original block. Page $Tag_0$ is the page tag of the associated original block.

The closed update block list 616 is a subset of the Allocation Block List (ABL). It is the set of block entries in the ABL with the attributes of Closed Update Block. The closed update block list has one entry for each data update block which has been closed, but whose entry has not been updated in a logical to a main physical directory. Each entry holds the following information. LG is the logical group address the current update block is dedicated to. MB is the metablock address of the update block. Page tag is the starting logical sector recorded at the first physical location of the update block. $MB_0$ is the metablock address of the associated original block.

Chaotic Block Indexing

A sequential update block has the data stored in logically sequential order, thus any logical sector among the block can be located easily. A chaotic update block has its logical sectors stored out of order and may also store multiple update generations of a logical sector. Additional information must be maintained to keep track of where each valid logical sector is located in the chaotic update block.

In the preferred embodiment, chaotic block indexing data structures allow tracking and fast access of all valid sectors in a chaotic block. Chaotic block indexing independently manages small regions of logical address space, and efficiently handles system data and hot regions of user data. The indexing data structures essentially allow indexing information to be maintained in flash memory with infrequent update requirement so that performance is not significantly impacted. On the other hand, lists of recently written sectors in chaotic blocks are held in a chaotic sector list in controller RAM. Also, a cache of index information from flash memory is held in controller RAM in order to minimize the number of flash sector accesses for address translation. Indexes for each chaotic block are stored in chaotic block index (CBI) sectors in flash memory.

Figures 16A, 16B:
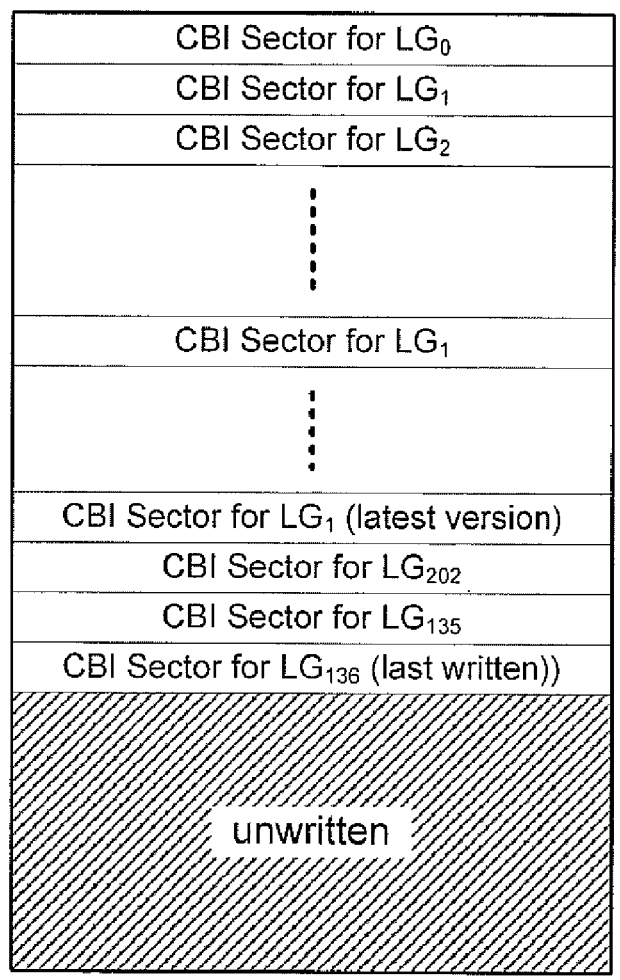
FIG. 16A illustrates the data fields of a chaotic block index (CBI) sector.
FIG. 16B illustrates an example of the chaotic block index (CBI) sectors being recorded in a dedicated metablock.

FIG. 16A illustrates the data fields of a chaotic block index (CBI) sector. A Chaotic Block Index Sector (CBI sector) contains an index for each sector in a logical group mapped to a chaotic update block, defining the location of each sector of the logical group within the chaotic update block or its associated original block. A CBI sector includes a chaotic block index field for keeping track of valid sectors within the chaotic block, a chaotic block info field for keeping track of address parameters for the chaotic block, and a sector index field for keeping track of the valid CBI sectors within the metablock (CBI block) storing the CBI sectors.

FIG. 16B illustrates an example of the chaotic block index (CBI) sectors being recorded in a dedicated metablock. The dedicated metablock will be referred to as a CBI block 620. When a CBI sector is updated, it is written in the next available physical sector location in the CBI block 620. Multiple copies of a CBI sector may therefore exist in the CBI block, with only the last written copy being valid. For example the CBI sector for the logical group $LG_1$ has been updated three times with the latest version being the valid one. The location of each valid sector in the CBI block is identified by a set of indices in the last written CBI sector in the block. In this example, the last written CBI sector in the block is CBI sector for $LG_{136}$ and its set of indices is the valid one superceding all previous ones. When the CBI block eventually becomes fully filled with CBI sectors, the block is compacted during a control write operation by rewriting all valid sectors to a new block location. The full block is then erased.

The chaotic block index field within a CBI sector contains an index entry for each logical sector within a logical group or sub-group mapped to a chaotic update block. Each index entry signifies an offset within the chaotic update block at which valid data for the corresponding logical sector is located. A reserved index value indicates that no valid data for the logical sector exists in the chaotic update block, and that the corresponding sector in the associated original block is valid. A cache of some chaotic block index field entries is held in controller RAM.

The chaotic block info field within a CBI sector contains one entry for each chaotic update block that exists in the system, recording address parameter information for the block. Information in this field is only valid in the last written sector in the CBI block. This information is also present in data structures in RAM.

The entry for each chaotic update block includes three address parameters. The first is the logical address of the logical group (or logical group number) associated with the chaotic update block. The second is the metablock address of the chaotic update block. The third is the physical address offset of the last sector written in the chaotic update block. The offset information sets the start point for scanning of the chaotic update block during initialization, to rebuild data structures in RAM.

The sector index field contains an entry for each valid CBI sector in the CBI block. It defines the offsets within the CBI block at which the most recently written CBI sectors relating to each permitted chaotic update block are located. A reserved value of an offset in the index indicates that a permitted chaotic update block does not exist.

Figure 16C:
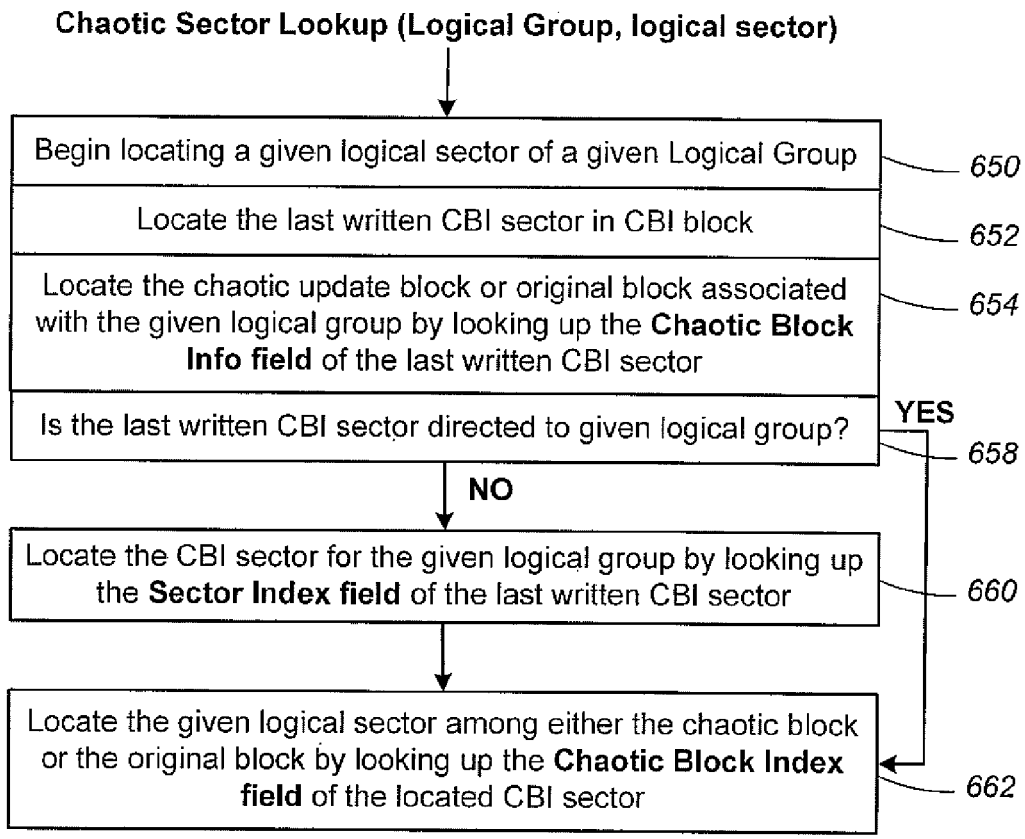
FIG. 16C is a flow diagram illustrating access to the data of a logical sector of a given logical group undergoing chaotic update.

FIG. 16C is a flow diagram illustrating access to the data of a logical sector of a given logical group undergoing chaotic update. During the update process, the update data is recorded in the chaotic update block while the unchanged data remains in the original metablock associated with the logical group. The process of accessing a logical sector of the logical group under chaotic update is as follows:

STEP 650: Begin locating a given logical sector of a given logical group.

STEP 652: Locate last written CBI sector in the CBI block

STEP 654: Locate the chaotic update block or original block associated with the given logical group by looking up the Chaotic Block Info field of the last written CBI sector. This step can be performed any time just before STEP 662.

STEP 658: If the last written CBI sector is directed to the given logical group, the CBI sector is located. Proceed to STEP 662. Otherwise, proceed to STEP 660.

STEP 660: Locate the CBI sector for the given logical group by looking up the sector index field of the last written CBI sector.

STEP 662: Locate the given logical sector among either the chaotic block or the original block by looking up the Chaotic Block Index field of the located CBI sector.

Figure 16D:
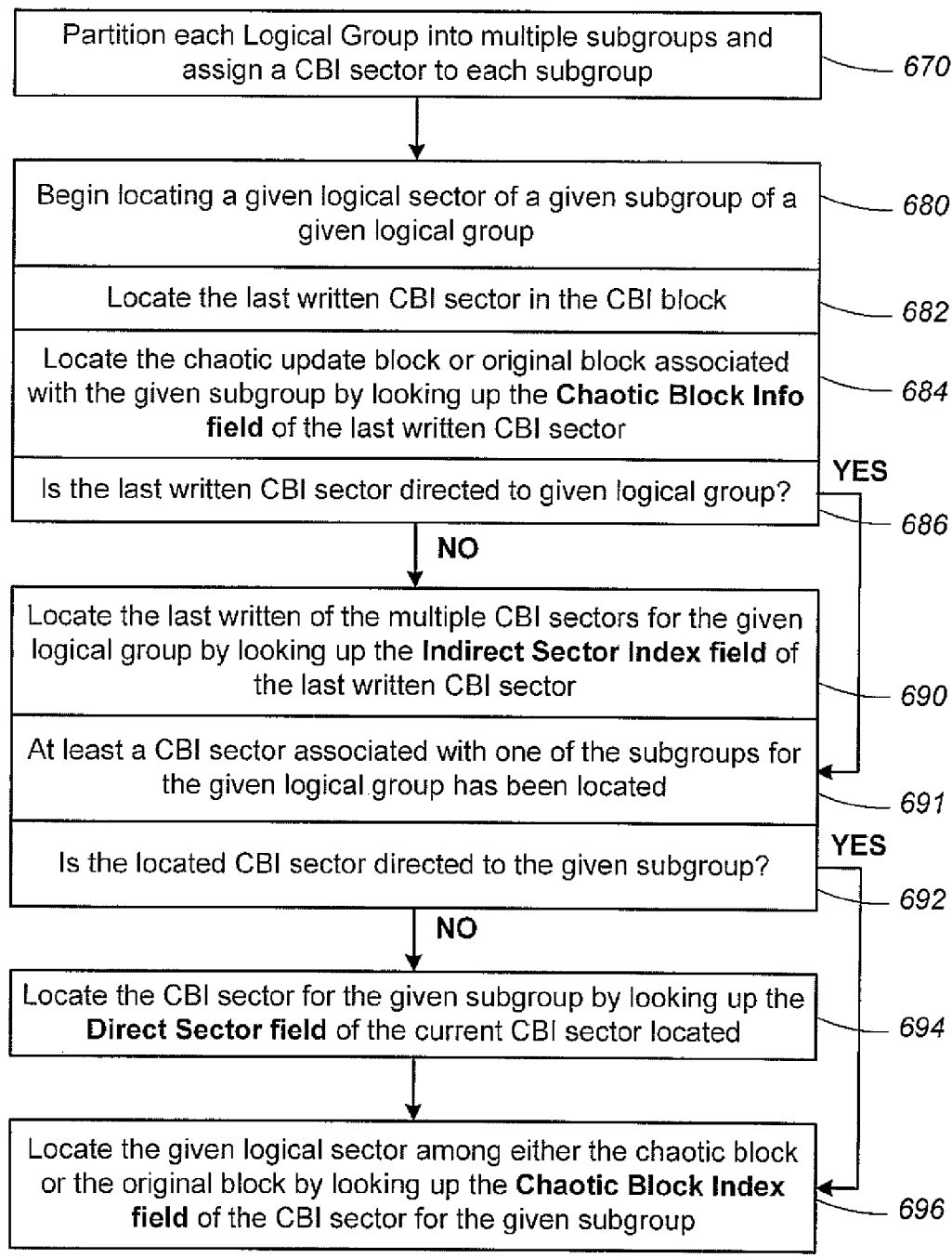
FIG. 16D is a flow diagram illustrating access to the data of a logical sector of a given logical group undergoing chaotic update, according to an alternative embodiment in which logical group has been partitioned into subgroups.

FIG. 16D is a flow diagram illustrating access to the data of a logical sector of a given logical group undergoing chaotic update, according to an alternative embodiment in which logical group has been partitioned into subgroups. The finite capacity of a CBI sector can only keep track of a predetermined maximum number of logical sectors. When the logical group has more logical sectors than a single CBI sector can handle, the logical group is partitioned into multiple subgroups with a CBI sector assigned to each subgroup. In one example, each CBI sector has enough capacity for tracking a logical group consisting of 256 sectors and up to 8 chaotic update blocks. If the logical group has a size exceeding 256 sectors, a separate CBI sector exists for each 256-sector subgroup within the logical group. CBI sectors may exist for up to 8 sub-groups within a logical group, giving support for logical groups up to 2048 sectors in size.

In the preferred embodiment, an indirect indexing scheme is employed to facilitate management of the index. Each entry of the sector index has direct and indirect fields.

The direct sector index defines the offsets within the CBI block at which all possible CBI sectors relating to a specific chaotic update block are located. Information in this field is only valid in the last written CBI sector relating to that specific chaotic update block. A reserved value of an offset in the index indicates that the CBI sector does not exist because the corresponding logical subgroup relating to the chaotic update block either does not exist, or has not been updated since the update block was allocated.

The indirect sector index defines the offsets within the CBI block at which the most recently written CBI sectors relating to each permitted chaotic update block are located. A reserved value of an offset in the index indicates that a permitted chaotic update block does not exist.

FIG. 16D shows the process of accessing a logical sector of the logical group under chaotic update as follows:

STEP 670: Partition each Logical Group into multiple subgroups and assign a CBI sector to each subgroup STEP 680: Begin locating a given logical sector of a given subgroup of a given logical group.

STEP 682: Locate the last written CBI sector in the CBI block.

STEP 684: Locate the chaotic update block or original block associated with the given subgroup by looking up the Chaotic Block Info field of the last written CBI sector. This step can be performed any time just before STEP 696.

STEP 686: If the last written CBI sector is directed to the given logical group, proceed to STEP 691. Otherwise, proceed to STEP 690.

STEP 690: Locate the last written of the multiple CBI sectors for the given logical group by looking up the Indirect Sector Index field of the last written CBI sector.

STEP 691: At least a CBI sector associate with one of the subgroups for the given logical group has been located. Continue.

STEP 692: If the located CBI sector directed to the given subgroup, the CBI sector for the given subgroup is located. Proceed to STEP 696. Otherwise, proceed to STEP 694.

STEP 694: Locate the CBI sector for the given subgroup by looking up the direct sector index field of the currently located CBI sector.

STEP 696: Locate the given logical sector among either the chaotic block or the original block by looking up the Chaotic Block Index field of the CBI sector for the given subgroup.

Figure 16E:
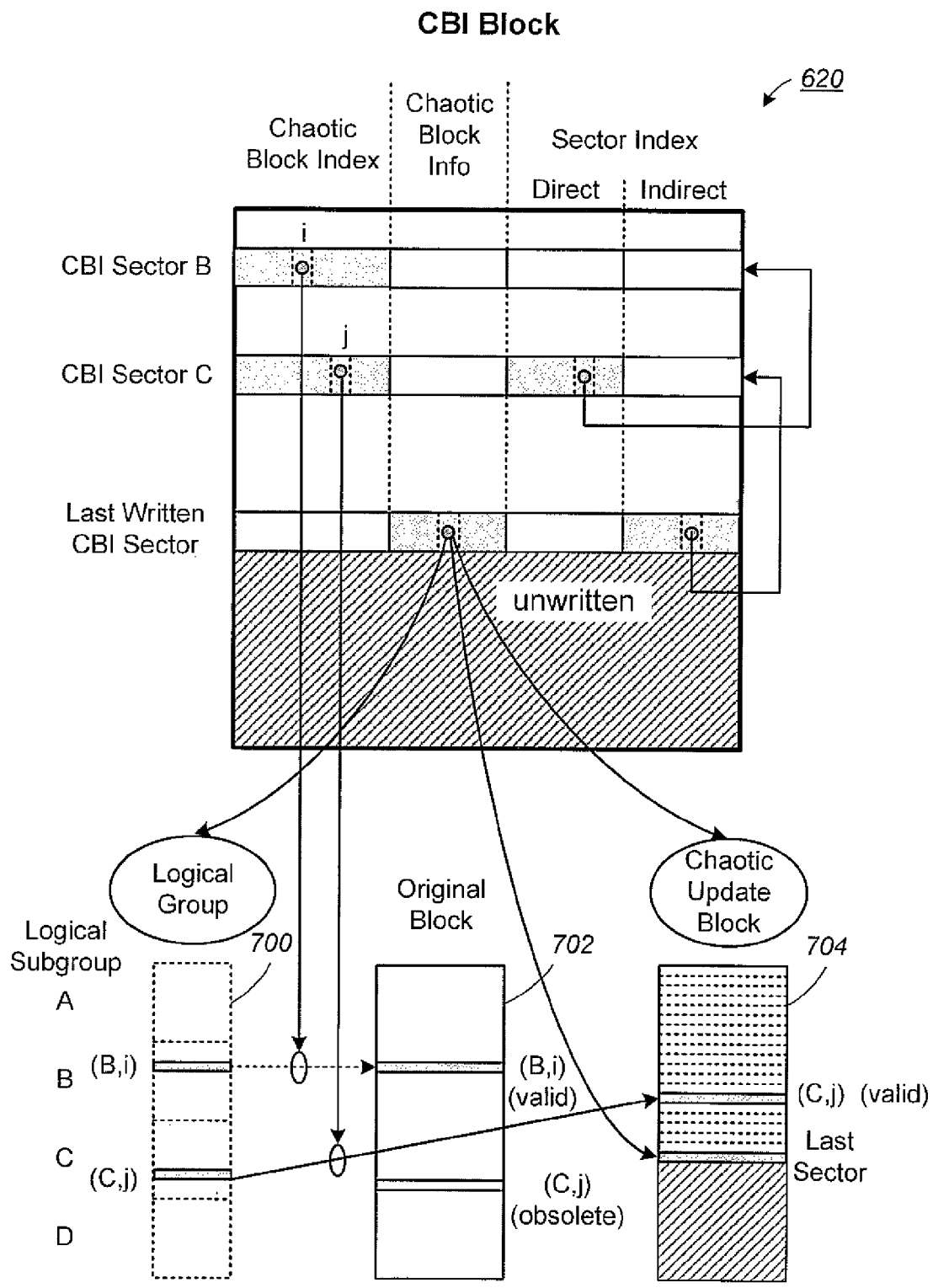
FIG. 16E illustrates examples of Chaotic Block Indexing (CBI) sectors and their functions for the embodiment where each logical group is partitioned into multiple subgroups.

FIG. 16E illustrates examples of Chaotic Block Indexing (CBI) sectors and their functions for the embodiment where each logical group is partitioned into multiple subgroups. A logical group 700 originally has its intact data stored in an original metablock 702. The logical group is then undergoing updates with the allocation of a dedicated chaotic update block 704. In the present examples, the logical group 700 is partitioned into subgroups, such subgroups A, B, C, D, each having 256 sectors.

In order to locate the ith sector in the subgroup B, the last written CBI sector in the CBI block 620 is first located. The chaotic block info field of the last written CBI sector provides the address to locate the chaotic update block 704 for the given logical group. At the same time it provides the location of the last sector written in the chaotic block. This information is useful in the event of scanning and rebuilding indices.

If the last written CBI sector turns out to be one of the four CBI sectors of the given logical group, it will be further determined if it is exactly the CBI sector for the given subgroup B that contains the ith logical sector. If it is, then the CBI sector's chaotic block index will point to the metablock location for storing the data for the ith logical sector. The sector location could be either in the chaotic update block 704 or the original block 702.

If the last written CBI sector turns out to be one of the four CBI sectors of the given logical group but is not exactly for the subgroup B, then its direct sector index is looked up to locate the CBI sector for the subgroup B. Once this exact CBI sector is located, its chaotic block index is looked up to locate the ith logical sector among the chaotic update block 704 and the original block 702.

If the last written CBI sector turns out not to be anyone of the four CBI sectors of the given logical group, its indirect sector index is looked up to locate one of the four. In the example shown in FIG. 16E, the CBI sector for subgroup C is located. Then this CBI sector for subgroup C has its direct sector index looked up to locate the exact CBI sector for the subgroup B. The example shows that when its chaotic block index is looked up, the ith logical sector is found to be unchanged and it valid data will be located in the original block.

Similar consideration applies to locating the jth logical sector in subgroup C of the given logical group. The example shows that the last written CBI sector turns out not to be any one of the four CBI sectors of the given logical group. Its indirect sector index points to one of the four CBI sectors for the given group. The last written of four pointed to also turns out to be exactly the CBI sector for the subgroup C. When its chaotic block index is looked up, the jth logical sector is found to be located at a designated location in the chaotic update block 704.

A list of chaotic sectors exists in controller RAM for each chaotic update block in the system. Each list contains a record of sectors written in the chaotic update block since a related CBI sector was last updated in flash memory. The number of logical sector addresses for a specific chaotic update block, which can be held in a chaotic sector list, is a design parameter with a typical value of 8 to 16. The optimum size of the list is determined as a tradeoff between its effects on overhead for chaotic data-write operations and sector scanning time during initialization.

During system initialization, each chaotic update block is scanned as necessary to identify valid sectors written since the previous update of one of its associated CBI sectors. A chaotic sector list in controller RAM for each chaotic update block is constructed. Each block need only be scanned from the last sector address defined in its chaotic block info field in the last written CBI sector.

When a chaotic update block is allocated, a CBI sector is written to correspond to all updated logical sub-groups. The logical and physical addresses for the chaotic update block are written in an available chaotic block info field in the sector, with null entries in the chaotic block index field. A chaotic sector list is opened in controller RAM.

When a chaotic update block is closed, a CBI sector is written with the logical and physical addresses of the block removed from the chaotic block info field in the sector. The corresponding chaotic sector list in RAM becomes unused.

The corresponding chaotic sector list in controller RAM is modified to include records of sectors written to a chaotic update block. When a chaotic sector list in controller RAM has no available space for records of further sector writes to a chaotic update block, updated CBI sectors are written for logical sub-groups relating to sectors in the list, and the list is cleared.

When the CBI block 620 becomes full, valid CBI sectors are copied to an allocated erased block, and the previous CBI block is erased.

Address Tables

The logical to physical address translation module 140 shown in FIG. 2 is responsible for relating a host's logical address to a corresponding physical address in flash memory. Mapping between logical groups and physical groups (metablocks) are stored in a set of table and lists distributed among the nonvolatile flash memory 200 and the volatile but more agile RAM 130 (see FIG. 1.) An address table is maintained in flash memory, containing a metablock address for every logical group in the memory system. In addition, logical to physical address records for recently written sectors are temporarily held in RAM. These volatile records can be reconstructed from block lists and data sector headers in flash memory when the system is initialized after power-up. Thus, the address table in flash memory need be updated only infrequently, leading to a low percentage of overhead write operations for control data.

The hierarchy of address records for logical groups includes the open update block list, the closed update block list in RAM and the group address table (GAT) maintained in flash memory.

The open update block list is a list in controller RAM of data update blocks which are currently open for writing updated host sector data. The entry for a block is moved to the closed update block list when the block is closed. The closed update block list is a list in controller RAM of data update blocks which have been closed. A subset of the entries in the list is moved to a sector in the Group Address Table during a control write operation.

The Group Address Table (GAT) is a list of metablock addresses for all logical groups of host data in the memory system. The GAT contains one entry for each logical group, ordered sequentially according to logical address. The nth entry in the GAT contains the metablock address for the logical group with address n. In the preferred embodiment, it is a table in flash memory, comprising a set of sectors (referred to as GAT sectors) with entries defining metablock addresses for every logical group in the memory system. The GAT sectors are located in one or more dedicated control blocks (referred to as GAT blocks) in flash memory.

Figure 17A:
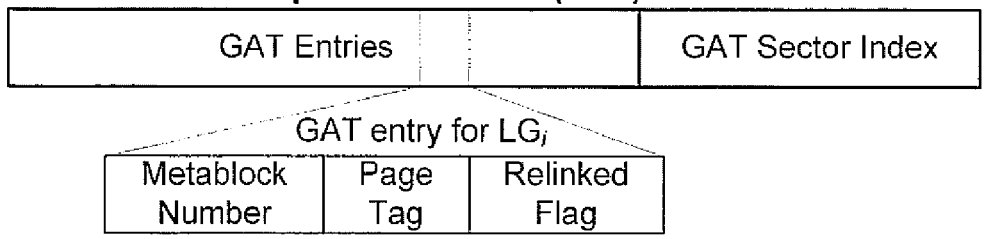
FIG. 17A illustrates the data fields of a group address table (GAT) sector.

FIG. 17A illustrates the data fields of a group address table (GAT) sector. A GAT sector may for example have sufficient capacity to contain GAT entries for a set of 128 contiguous logical groups. Each GAT sector includes two components, namely a set of GAT entries for the metablock address of each logical group within a range, and a GAT sector index. The first component contains information for locating the metablock associated with the logical address. The second component contains information for locating all valid GAT sectors within the GAT block. Each GAT entry has three fields, namely, the metablock number, the page tag as defined earlier in connection with FIG. 3A(iii), and a flag indicating whether the metablock has been relinked. The GAT sector index lists the positions of valid GAT sectors in a GAT block. This index is in every GAT sector but is superceded by the version of the next written GAT sector in the GAT block. Thus only the version in the last written GAT sector is valid.

Figure 17B:
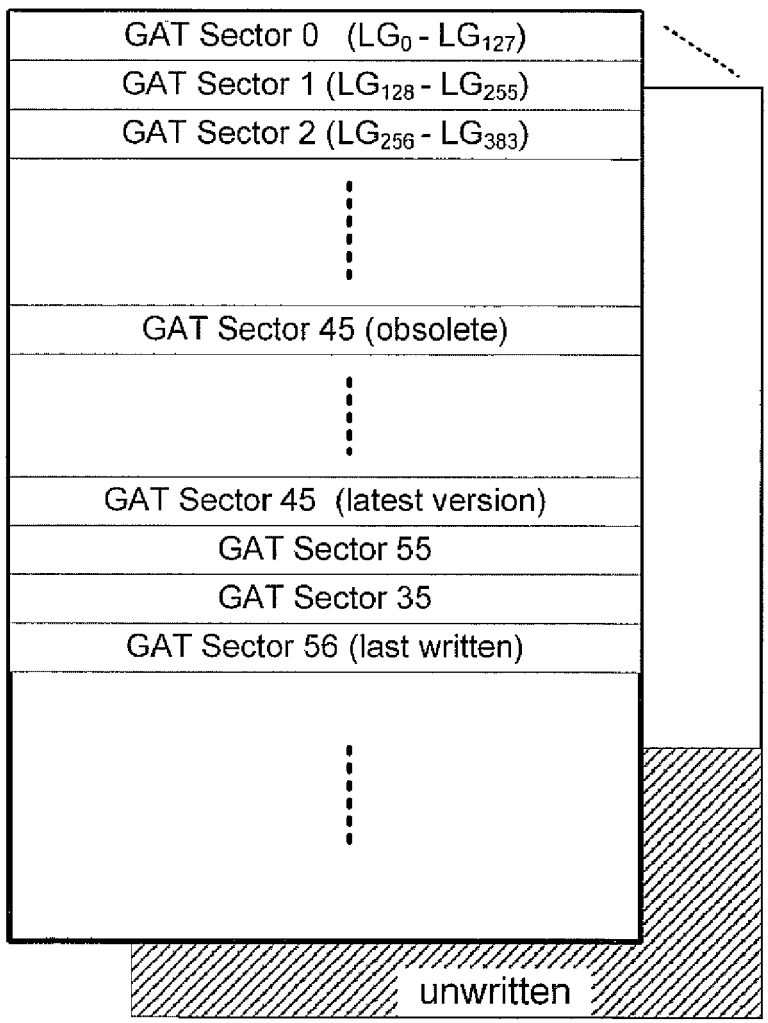
FIG. 17B illustrates an example of the group address table (GAT) sectors being recorded in a GAT block.

FIG. 17B illustrates an example of the group address table (GAT) sectors being recorded in one or more GAT block. A GAT block is a metablock dedicated to recording GAT sectors. When a GAT sector is updated, it is written in the next available physical sector location in the GAT block 720. Multiple copies of a GAT sector may therefore exist in the GAT block, with only the last written copy being valid. For example the GAT sector 255 (containing pointers for the logical groups $LG_{3968}$-$LG_{4098}$) has been updated at least two times with the latest version being the valid one. The location of each valid sector in the GAT block is identified by a set of indices in the last written GAT sector in the block. In this example, the last written GAT sector in the block is GAT sector 236 and its set of indices is the valid one superceding all previous ones. When the GAT block eventually becomes fully filled with GAT sectors, the block is compacted during a control write operation by rewriting all valid sectors to a new block location. The full block is then erased.

As described earlier, a GAT block contains entries for a logically contiguous set of groups in a region of logical address space. GAT sectors within a GAT block each contain logical to physical mapping information for 128 contiguous logical groups. The number of GAT sectors required to store entries for all logical groups within the address range spanned by a GAT block occupy only a fraction of the total sector positions in the block. A GAT sector may therefore be updated by writing it at the next available sector position in the block. An index of all valid GAT sectors and their position in the GAT block is maintained in an index field in the most recently written GAT sector. The fraction of the total sectors in a GAT block occupied by valid GAT sectors is a system design parameter, which is typically 25%. However, there is a maximum of 64 valid GAT sectors per GAT block. In systems with large logical capacity, it may be necessary to store GAT sectors in more than one GAT block. In this case, each GAT block is associated with a fixed range of logical groups.

Figure 18:
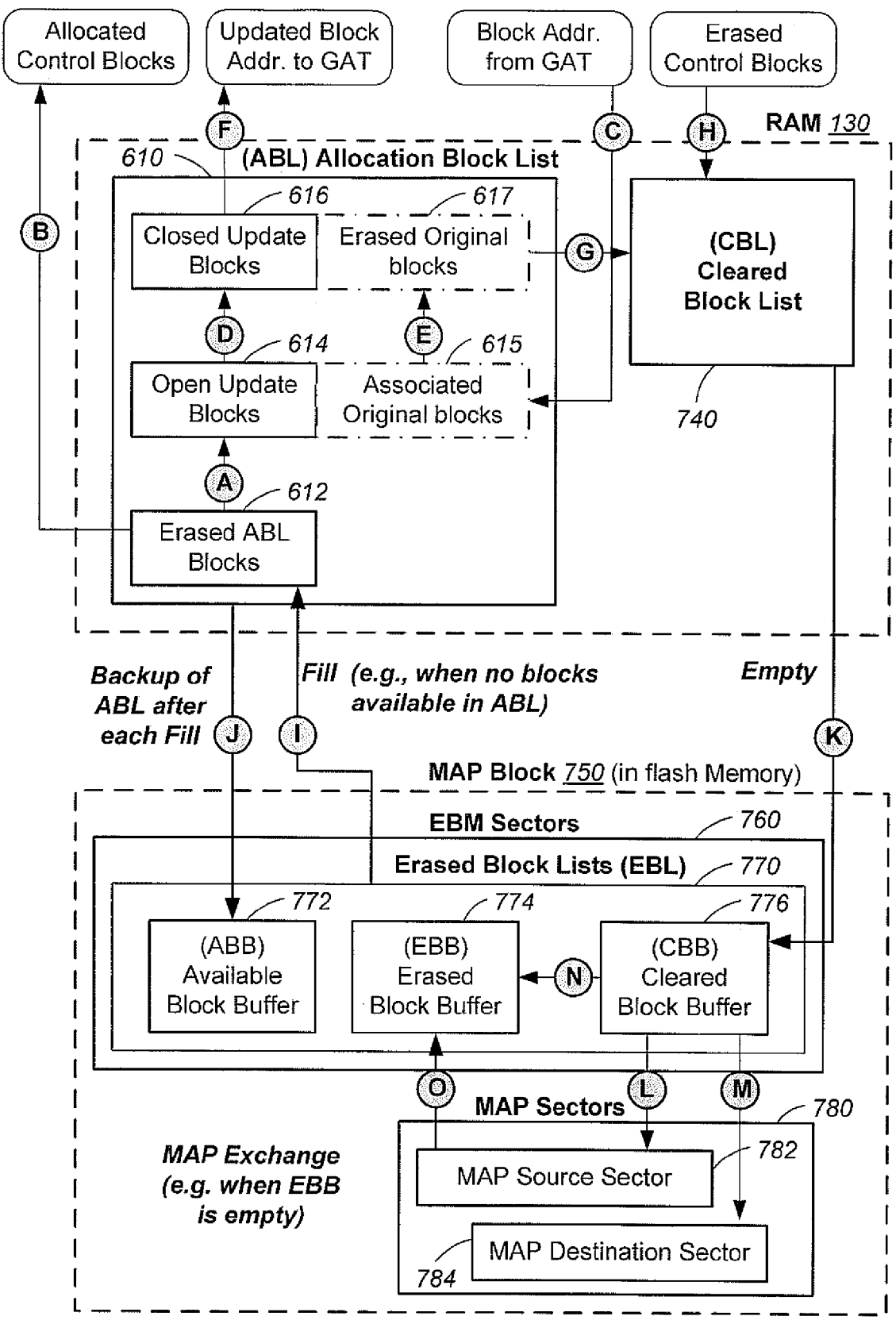
FIG. 18 is a schematic block diagram illustrating the distribution and flow of the control and directory information for usage and recycling of erased blocks.

A GAT update is performed as part of a control write operation, which is triggered when the ABL runs out of blocks for allocation (see FIG. 18.) It is performed concurrently with ABL fill and CBL empty operations. During a GAT update operation, one GAT sector has entries updated with information from corresponding entries in the closed update block list. When a GAT entry is updated, any corresponding entries are removed from the closed update block list (CUBL). For example, the GAT sector to be updated is selected on the basis of the first entry in the closed update block list. The updated sector is written to the next available sector location in the GAT block.

A GAT rewrite operation occurs during a control write operation when no sector location is available for an updated GAT sector. A new GAT block is allocated, and valid GAT sectors as defined by the GAT index are copied in sequential order from the full GAT block. The full GAT block is then erased.

A GAT cache is a copy in controller RAM 130 of entries in a subdivision of the 128 entries in a GAT sector. The number of GAT cache entries is a system design parameter, with typical value 32. A GAT cache for the relevant sector subdivision is created each time an entry is read from a GAT sector. Multiple GAT caches are maintained. The number is a design parameter with a typical value of 4. A GAT cache is overwritten with entries for a different sector subdivision on a least-recently-used basis.

Erased Metablock Management

The erase block manager 160 shown in FIG. 2 manages erase blocks using a set of lists for maintaining directory and system control information. These lists are distributed among the controller RAM 130 and flash memory 200. When an erased metablock must be allocated for storage of user data, or for storage of system control data structures, the next available metablock number in the allocation block list (ABL) (see FIG. 15) held in controller RAM is selected. Similarly, when a metablock is erased after it has been retired, its number is added to a cleared block list (CBL) also held in controller RAM. Relatively static directory and system control data are stored in flash memory. These include erased block lists and a bitmap (MAP) listing the erased status of all metablocks in the flash memory. The erased block lists and MAP are stored in individual sectors and are recorded to a dedicated metablock, known as a MAP block. These lists, distributed among the controller RAM and flash memory, provide a hierarchy of erased block records to efficiently manage erased metablock usage.

FIG. 18 is a schematic block diagram illustrating the distribution and flow of the control and directory information for usage and recycling of erased blocks. The control and directory data are maintained in lists which are held either in controller RAM 130 or in a MAP block 750 residing in flash memory 200.

In the preferred embodiment, the controller RAM 130 holds the allocation block list (ABL) 610 and a cleared block list (CBL) 740. As described earlier in connection with FIG. 15, the allocation block list (ABL) keeps track of which metablocks have recently been allocated for storage of user data, or for storage of system control data structures. When a new erased metablock need be allocated, the next available metablock number in the allocation block list (ABL) is selected. Similarly, the cleared block list (CBL) is used to keep track of update metablocks that have been de-allocated and erased. The ABL and CBL are held in controller RAM 130 (see FIG. 1) for speedy access and easy manipulation when tracking the relatively active update blocks.

The allocation block list (ABL) keeps track of a pool of erased metablocks and the allocation of the erased metablocks to be an update block. Thus, each of these metablocks that may be described by an attribute designating whether it is an erased block in the ABL pending allocation, an open update block, or a closed update block. FIG. 18 shows the ABL containing an erased ABL list 612, the open update block list 614 and the closed update block list 616. In addition, associated with the open update block list 614 is the associated original block list 615. Similarly, associated with the closed update block list is the associated erased original block list 617. As shown previously in FIG. 15, these associated lists are subset of the open update block list 614 and the closed update block list 616 respectively. The erased ABL block list 612, the open update block list 614, and the closed update block list 616 are all subsets of the allocation block list (ABL) 610, the entries in each having respectively the corresponding attribute.

The MAP block 750 is a metablock dedicated to storing erase management records in flash memory 200. The MAP block stores a time series of MAP block sectors, with each MAP sector being either an erase block management (EBM) sector 760 or a MAP sector 780. As erased blocks are used up in allocation and recycled when a metablock is retired, the associated control and directory data is preferably contained in a logical sector which may be updated in the MAP block, with each instance of update data being recorded to a new block sector. Multiple copies of EBM sectors 760 and MAP sectors 780 may exist in the MAP block 750, with only the latest version being valid. An index to the positions of valid MAP sectors is contained in a field in the EMB block. A valid EMB sector is always written last in the MAP block during a control write operation. When the MAP block 750 is full, it is compacted during a control write operation by rewriting all valid sectors to a new block location. The full block is then erased.

Each EBM sector 760 contains erased block lists (EBL) 770, which are lists of addresses of a subset of the population of erased blocks. The erased block lists (EBL) 770 act as a buffer containing erased metablock numbers, from which metablock numbers are periodically taken to re-fill the ABL, and to which metablock numbers are periodically added to re-empty the CBL. The EBL 770 serves as buffers for the available block buffer (ABB) 772, the erased block buffer (EBB) 774 and the cleared block buffer (CBB) 776.

The available block buffer (ABB) 772 contains a copy of the entries in the ABL 610 immediately following the previous ABL fill operation. It is in effect a backup copy of the ABL just after an ABL fill operation.

The erased block buffer (EBB) 774 contains erased block addresses which have been previously transferred either from MAP sectors 780 or from the CBB list 776 (described below), and which are available for transfer to the ABL 610 during an ABL fill operation.

The cleared block buffer (CBB) 776 contains addresses of erased blocks which have been transferred from the CBL 740 during a CBL empty operation and which will be subsequently transferred to MAP sectors 780 or to the EBB list 774.

Each of the MAP sectors 780 contains a bitmap structure referred to as MAP. The MAP uses one bit for each metablock in flash memory, which is used to indicate the erase status of each block. Bits corresponding to block addresses listed in the ABL, CBL, or erased block lists in the EBM sector are not set to the erased state in the MAP.

Any block which does not contain valid data structures and which is not designated as an erased block within the MAP, erased block lists, ABL or CBL is never used by the block allocation algorithm and is therefore inaccessible for storage of host or control data structures. This provides a simple mechanism for excluding blocks with defective locations from the accessible flash memory address space.

The hierarchy shown in FIG. 18 allows erased block records to be managed efficiently and provides full security of the block address lists stored in the controller's RAM. Erased block entries are exchanged between these block address lists and one or more MAP sectors 780, on an infrequent basis. These lists may be reconstructed during system initialization after a power-down, via information in the erased block lists and address translation tables stored in sectors in flash memory, and limited scanning of a small number of referenced data blocks in flash memory.

The algorithms adopted for updating the hierarchy of erased metablock records results in erased blocks being allocated for use in an order which interleaves bursts of blocks in address order from the MAP block 750 with bursts of block addresses from the CBL 740 which reflect the order blocks were updated by the host. For most metablock sizes and system memory capacities, a single MAP sector can provide a bitmap for all metablocks in the system. In this case, erased blocks are always allocated for use in address order as recorded in this MAP sector.

Erase Block Management Operations

As described earlier, the ABL 610 is a list with address entries for erased metablocks which may be allocated for use, and metablocks which have recently been allocated as data update blocks. The actual number of block addresses in the ABL lies between maximum and minimum limits, which are system design variables. The number of ABL entries formatted during manufacturing is a function of the card type and capacity. In addition, the number of entries in the ABL may be reduced near the end of life of the system, as the number of available erased blocks is reduced by failure of blocks during life. For example, after a fill operation, entries in the ABL may designate blocks available for the following purposes. Entries for Partially written data update blocks with one entry per block, not exceeding a system limit for a maximum of concurrently opened update blocks. Between one to twenty entries for Erased blocks for allocation as data update blocks. Four entries for erased blocks for allocation as control blocks.

ABL Fill Operation

As the ABL 610 becomes depleted through allocations, it will need to be refilled. An operation to fill the ABL occurs during a control write operation. This is triggered when a block must be allocated, but the ABL contains insufficient erased block entries available for allocation as a data update block, or for some other control data update block. During a control write, the ABL fill operation is concurrent with a GAT update operation.

The following actions occur during an ABL fill operation.
1. ABL entries with attributes of current data update blocks are retained.
2. ABL entries with attributes of closed data update blocks are retained, unless an entry for the block is being written in the concurrent GAT update operation, in which case the entry is removed from the ABL.
3. ABL entries for unallocated erase blocks are retained.
4. The ABL is compacted to remove gaps created by removal of entries, maintaining the order of entries.
5. The ABL is completely filled by appending the next available entries from the EBB list.
6. The ABB list is over-written with the current entries in the ABL.

CBL Empty Operation

The CBL is a list of erased block addresses in controller RAM with the same limitation on the number of erased block entries as the ABL. An operation to empty the CBL occurs during a control write operation. It is therefore concurrent with an ABL fill/GAT update operations, or CBI block write operations. In a CBL empty operation, entries are removed from the CBL 740 and written to the CBB list 776.

MAP Exchange Operation

A MAP exchange operation between the erase block information in the MAP sectors 780 and the EBM sectors 760 may occur periodically during a control write operation, when the EBB list 774 is empty. If all erased metablocks in the system are recorded in the EBM sector 760, no MAP sector 780 exists and no MAP exchange is performed. During a MAP exchange operation, a MAP sector feeding the EBB 774 with erased blocks is regarded as a source MAP sector 782. Conversely, a MAP sector receiving erased blocks from the CBB 776 is regarded as a destination MAP sector 784. If only one MAP sector exists, it acts as both source and destination MAP sector, as defined below.

The following actions are performed during a MAP exchange.
1. A source MAP sector is selected, on the basis of an incremental pointer.
2. A destination MAP sector is selected, on the basis of the block address in the first CBB entry that is not in the source MAP sector.
3. The destination MAP sector is updated, as defined by relevant entries in the CBB, and the entries are removed from the CBB.
4. The updated destination MAP sector is written in the MAP block, unless no separate source MAP sector exists.
5. The source MAP sector is updated, as defined by relevant entries in the CBB, and the entries are removed from the CBB.
6. Remaining entries in the CBB are appended to the EBB.
7. The EBB is filled to the extent possible with erased block addresses defined from the source MAP sector.
8. The updated source MAP sector is written in the MAP block.
9. An updated EBM sector is written in the MAP block.

List Management

FIG. 18 shows the distribution and flow of the control and directory information between the various lists. For expediency, operations to move entries between elements of the lists or to change the attributes of entries, identified in FIG. 18 as [A] to [O], are as follows.

[A] When an erased block is allocated as an update block for host data, the attributes of its entry in the ABL are changed from Erased ABL Block to Open Update Block.

[B] When an erased block is allocated as a control block, its entry in the ABL is removed.

[C] When an ABL entry is created with Open Update Block attributes, an Associated Original Block field is added to the entry to record the original metablock address for the logical group being updated. This information is obtained from the GAT.

[D] When an update block is closed, the attributes of its entry in the ABL are changed from Open Update Block to Closed Update Block.

[E] When an update block is closed, its associated original block is erased and the attributes of the Associated Original Block field in its entry in the ABL are changed to Erased Original Block.

[F] During an ABL fill operation, any closed update block whose address is updated in the GAT during the same control write operation has its entry removed from the ABL.

[G] During an ABL fill operation, when an entry for a closed update block is removed from the ABL, an entry for its associated erased original block is moved to the CBL.

[H] When a control block is erased, an entry for it is added to the CBL.

[I] During an ABL fill operation, erased block entries are moved to the ABL from the EBB list, and are given attributes of Erased ABL Blocks.

[J] After modification of all relevant ABL entries during an ABL fill operation, the block addresses in the ABL replace the block addresses in the ABB list.

[K] Concurrently with an ABL fill operation during a control write, entries for erased blocks in the CBL are moved to the CBB list.

[L] During a MAP exchange operation, all relevant entries are moved from the CBB list to the MAP destination sector.

[M] During a MAP exchange operation, all relevant entries are moved from the CBB list to the MAP source sector.

[N] Subsequent to [L] and [M] during a MAP exchange operation, all remaining entries are moved from the CBB list to the EBB list.

[o] Subsequent to [N] during a MAP exchange operation, entries other than those moved in [M] are moved from the MAP source sector to fill the EBB list, if possible.

Logical to Physical Address Translation

To locate a logical sector's physical location in flash memory, the logical to physical address translation module 140 shown in FIG. 2 performs a logical to physical address translation. Except for those logical groups that have recently been updated, the bulk of the translation could be performed using the group address table (GAT) residing in the flash memory 200 or the GAT cache in controller RAM 130. Address translations for the recently updated logical groups will require looking up address lists for update blocks which reside mainly in controller RAM 130. The process for logical to physical address translation for a logical sector address is therefore dependent on the type of block associated with the logical group within which the sector is located. The types of blocks are: intact block, sequential data update block, chaotic data update block, closed data update block.

Figure 19:
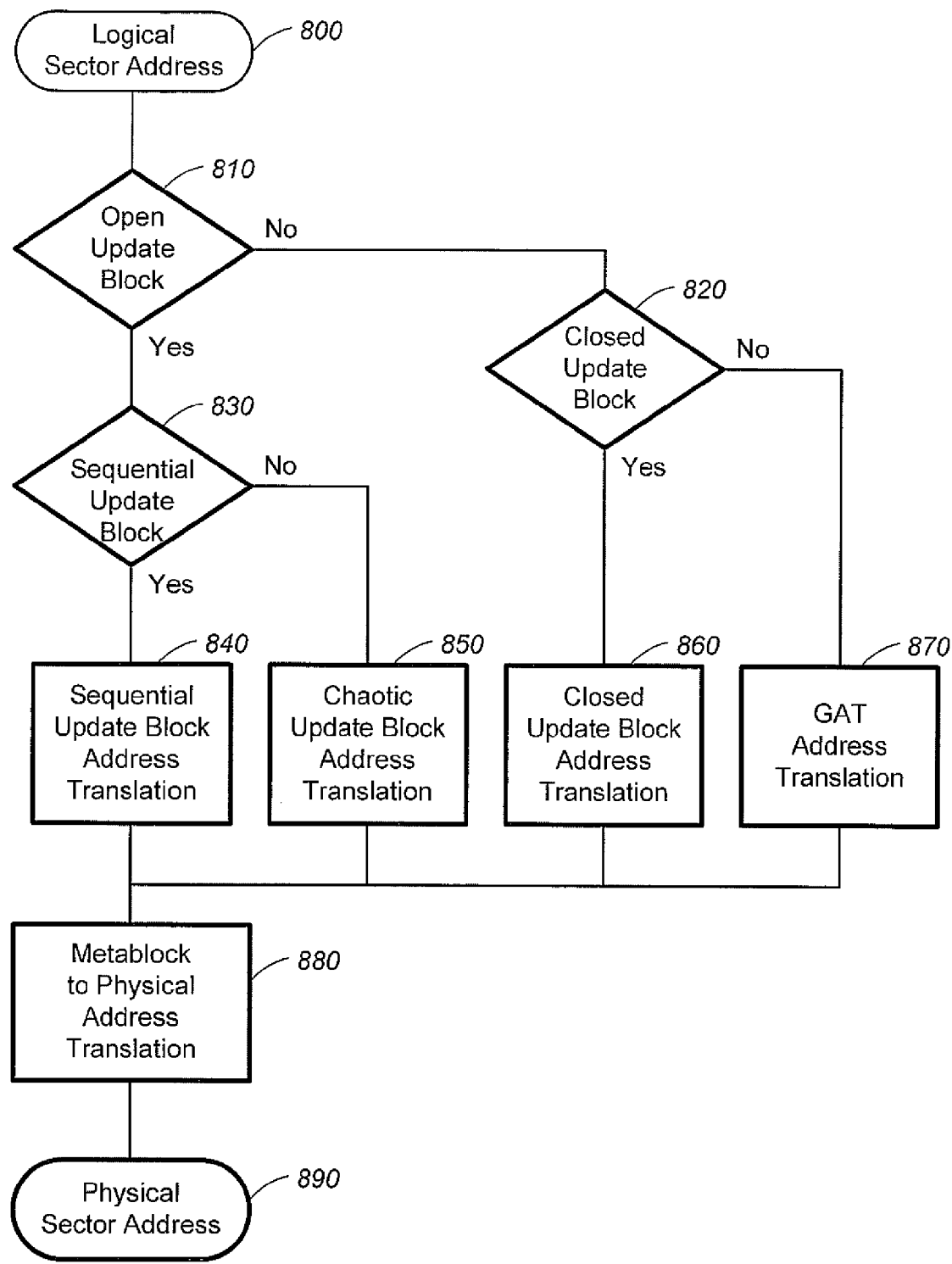
FIG. 19 is a flow chart showing the process of logical to physical address translation.

FIG. 19 is a flow chart showing the process of logical to physical address translation. Essentially, the corresponding metablock and the physical sector is located by using the logical sector address first to lookup the various update directories such as the open update block list and the close update block list. If the associated metablock is not part of an update process, then directory information is provided by the GAT. The logical to physical address translation includes the following steps:

STEP 800: A logical sector address is given.

STEP 810: Look up given logical address in the open update blocks list 614 (see FIGS. 15 and 18) in controller RAM. If lookup fails, proceed to STEP 820, otherwise proceed to STEP 830.

STEP 820: Look up given logical address in the closed update block list 616. If lookup fails, the given logical address is not part of any update process; proceed to STEP 870 for GAT address translation. Otherwise proceed to STEP 860 for closed update block address translation.

STEP 830: If the update block containing the given logical address is sequential, proceed to STEP 840 for sequential update block address translation. Otherwise proceed to STEP 850 for chaotic update block address translation.

STEP 840: Obtain the metablock address using sequential update block address translation. Proceed to STEP 880.

STEP 850: Obtain the metablock address using chaotic update block address translation. Proceed to STEP 880.

STEP 860: Obtain the metablock address using closed update block address translation. Proceed to STEP 880.

STEP 870: Obtain the metablock address using group address table (GAT) translation. Proceed to STEP 880.

STEP 880: Convert the Metablock Address to a physical address. The translation method depends on whether the metablock has been relinked.

STEP 890: Physical sector address obtained.

The various address translation processes are described in more detail as follows:

Sequential Update Block Address Translation (STEP 840)

Address translation for a target logical sector address in a logical group associated with a sequential update block can be accomplished directly from information in the open update block list 614 (FIGS. 15 and 18), as follows.

1. It is determined from the "page tag" and "number of sectors written" fields in the list whether the target logical sector is located in the update block or its associated original block.

2. The metablock address appropriate to the target logical sector is read from the list.

3. The sector address within the metablock is determined from the appropriate "page tag" field.

Chaotic Update Block Address Translation (STEP 850)

The address translation sequence for a target logical sector address in a logical group associated with a chaotic update block is as follows.

1. If it is determined from the chaotic sector list in RAM that the sector is a recently written sector, address translation may be accomplished directly from its position in this list.

2. The most recently written sector in the CBI block contains, within its chaotic block data field, the physical address of the chaotic update block relevant to the target logical sector address. It also contains, within its indirect sector index field, the offset within the CBI block of the last written CBI sector relating to this chaotic update block (see FIGS. 16A-16E).

3. The information in these fields is cached in RAM, eliminating the need to read the sector during subsequent address translation.

4. The CBI sector identified by the indirect sector index field at step 3 is read.

5. The direct sector index field for the most recently accessed chaotic update sub-group is cached in RAM, eliminating the need to perform the read at step 4 for repeated accesses to the same chaotic update block.

6. The direct sector index field read at step 4 or step 5 identifies in turn the CBI sector relating to the logical sub-group containing the target logical sector address.

7. The chaotic block index entry for the target logical sector address is read from the CBI sector identified in step 6.

8. The most recently read chaotic block index field may be cached in controller RAM, eliminating the need to perform the reads at step 4 and step 7 for repeated accesses to the same logical sub-group.

9. The chaotic block index entry defines the location of the target logical sector either in the chaotic update block or in the associated original block. If the valid copy of the target logical sector is in the original block, it is located by use of the original metablock and page tag information.

Closed Update Block Address Translation (STEP 860)

Address translation for a target logical sector address in a logical group associated with a closed update block can be accomplished directly from information in the closed block update list (see FIG. 18), as follows.

1. The metablock address assigned to the target logical group is read from the list.
2. The sector address within the metablock is determined from the "page tag" field in the list.

GAT Address Translation (STEP 870)

If a logical group is not referenced by either the open or closed block update lists, its entry in the GAT is valid. The address translation sequence for a target logical sector address in a logical group referenced by the GAT is as follows.

1. The ranges of the available GAT caches in RAM are evaluated to determine if an entry for the target logical group is contained in a GAT cache.
2. If the target logical group is found in step 1, the GAT cache contains full group address information, including both metablock address and page tag, allowing translation of the target logical sector address.
3. If the target address is not in a GAT cache, the GAT index must be read for the target GAT block, to identify the location of the GAT sector relating to the target logical group address.
4. The GAT index for the last accessed GAT block is held in controller RAM, and may be accessed without need to read a sector from flash memory.
5. A list of metablock addresses for every GAT block, and the number of sectors written in each GAT block, is held in controller RAM. If the required GAT index is not available at step 4, it may therefore be read immediately from flash memory.
6. The GAT sector relating to the target logical group address is read from the sector location in the GAT block defined by the GAT index obtained at step 4 or step 6. A GAT cache is updated with the subdivision of the sector containing the target entry.
7. The target sector address is obtained from the metablock address and "page tag" fields within the target GAT entry.

Metablock to Physical Address Translation (STEP 880)

If a flag associated with the metablock address indicates that the metablock has been re-linked, the relevant LT sector is read from the BLM block, to determine the erase block address for the target sector address. Otherwise, the erase block address is determined directly from the metablock address.

Control Data Management

Figure 20:
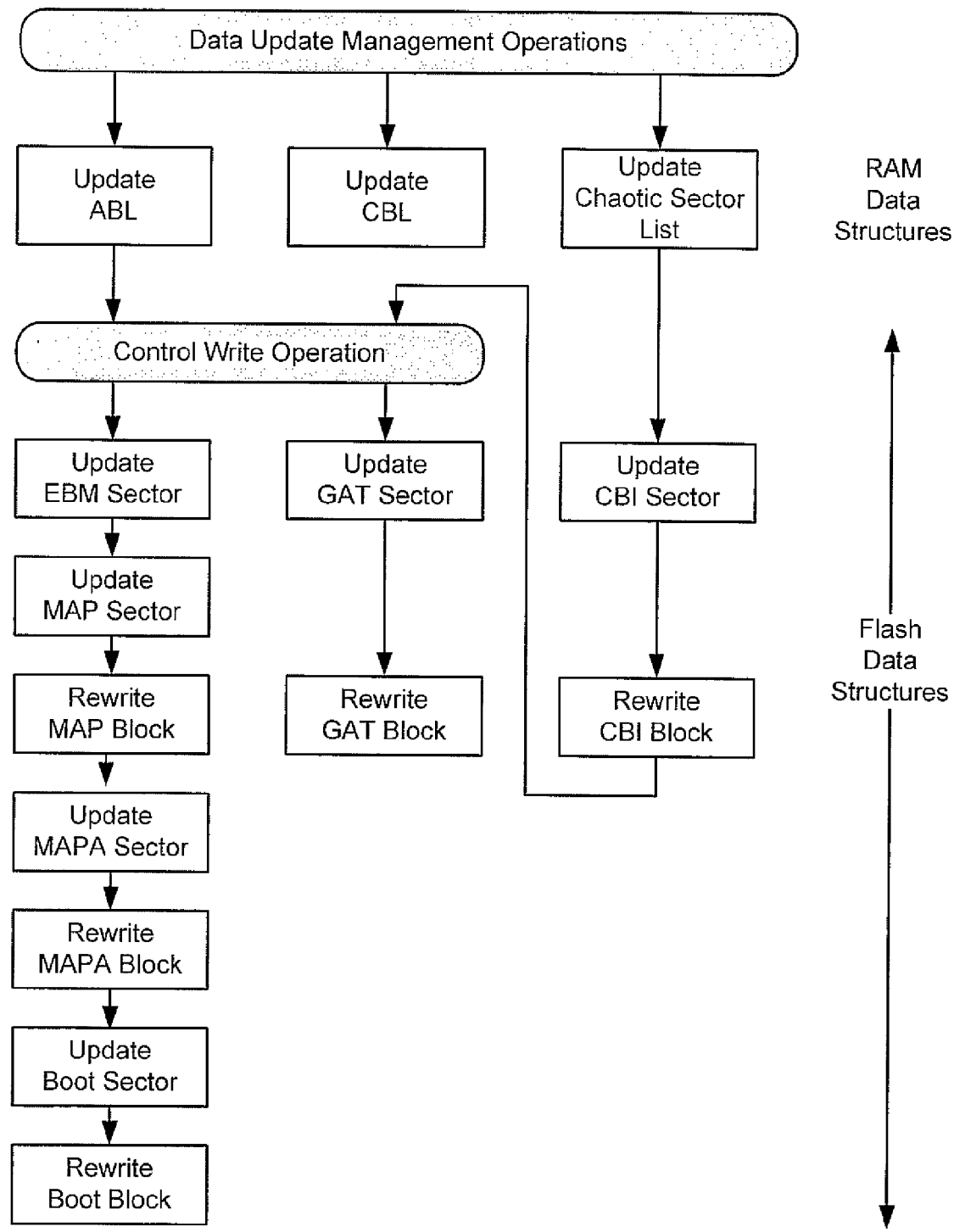
FIG. 20 illustrates the hierarchy of the operations performed on control data structures in the course of the operation of the memory management.

FIG. 20 illustrates the hierarchy of the operations performed on control data structures in the course of the operation of the memory management. Data Update Management Operations act on the various lists that reside in RAM. Control write operations act on the various control data sectors and dedicated blocks in flash memory and also exchange data with the lists in RAM.

Data update management operations are performed in RAM on the ABL, the CBL and the chaotic sector list. The ABL is updated when an erased block is allocated as an update block or a control block, or when an update block is closed. The CBL is updated when a control block is erased or when an entry for a closed update block is written to the GAT. The update chaotic sector list is updated when a sector is written to a chaotic update block.

A control write operation causes information from control data structures in RAM to be written to control data structures in flash memory, with consequent update of other supporting control data structures in flash memory and RAM, if necessary. It is triggered either when the ABL contains no further entries for erased blocks to be allocated as update blocks, or when the CBI block is rewritten.

In the preferred embodiment, the ABL fill operation, the CBL empty operation and the EBM sector update operation are performed during every control write operation. When the MAP block containing the EBM sector becomes full, valid EBM and MAP sectors are copied to an allocated erased block, and the previous MAP block is erased.

One GAT sector is written, and the Closed Update Block List is modified accordingly, during every control write operation. When a GAT block becomes full, a GAT rewrite operation is performed.

A CBI sector is written, as described earlier, after certain chaotic sector write operations. When the CBI block becomes full, valid CBI sectors are copied to an allocated erased block, and the previous CBI block is erased.

A MAP exchange operation, as described earlier, is performed when there are no further erased block entries in the EBB list in the EBM sector.

A MAP Address (MAPA) sector, which records the current address of the MAP block, is written in a dedicated MAPA block on each occasion the MAP block is rewritten. When the MAPA block becomes full, the valid MAPA sector is copied to an allocated erased block, and the previous MAPA block is erased.

A Boot sector is written in a current Boot block on each occasion the MAPA block is rewritten. When the boot block becomes full, the valid Boot sector is copied from the current version of the Boot block to the backup version, which then becomes the current version. The previous current version is erased and becomes the backup version, and the valid Boot sector is written back to it.

Alignment for Memory Distributed Over Multiple Memory Planes

As described earlier in connection with FIG. 4 and FIGS. 5A-5C, in order to increase performance, multiple memory planes are operated in parallel. Basically each plane has its own set of sense amplifiers as part of read and program circuits to service in parallel a corresponding page of memory cells that spans the plane. When multiple planes are combined, multiple pages may be operated on in parallel, resulting in even greater performance.

According to another aspect of the invention, for a memory array organized into erasable blocks and constituted from multiple memory planes so that logical units can be read or programmed into the multiple planes in parallel, when an original logical unit of a first block stored in a given memory plane is to be updated, provisions are made to keep the updated logical unit in the same plane as the original. This is accomplished by recording the updated logical unit to the next available location of a second block but in the same plane. Preferably, the logical unit is stored with an identical offset position in the plane as its other versions so that all versions of a given logical units are serviced by an identical set of sensing circuits.

In a preferred embodiment, any intervening gaps from the last programmed memory unit to the next available plane-aligned memory unit are padded accordingly with the current versions of logical units. The padding is accomplished by filling in a gap with current versions of the logical units that follow logically from the last programmed logical unit, and with current versions of the logical units that precede logically from the logical unit stored in the next available plane-aligned memory unit.

In this way, all versions of a logical unit are maintained in the same plane with the same offsets as the original so that in a garbage collection operation, the latest version of the logical unit need not be retrieved from a different plane, resulting in reduced performance. In a preferred embodiment, each memory unit across each plane is either updated or padded with the latest versions. Thus in a parallel operation across the multiple planes, the logical units will be in logical sequential order without the need for further rearrangement.

This scheme reduces the time for consolidation of a chaotic block by allowing on-plane rearrangement of the latest versions of the logical units of a logical group and avoiding having to gather the latest versions from different memory planes. This is of benefit where the performance specification for the host interface defines a maximum latency for completion of a sector write operation by the memory system.

Figure 21:
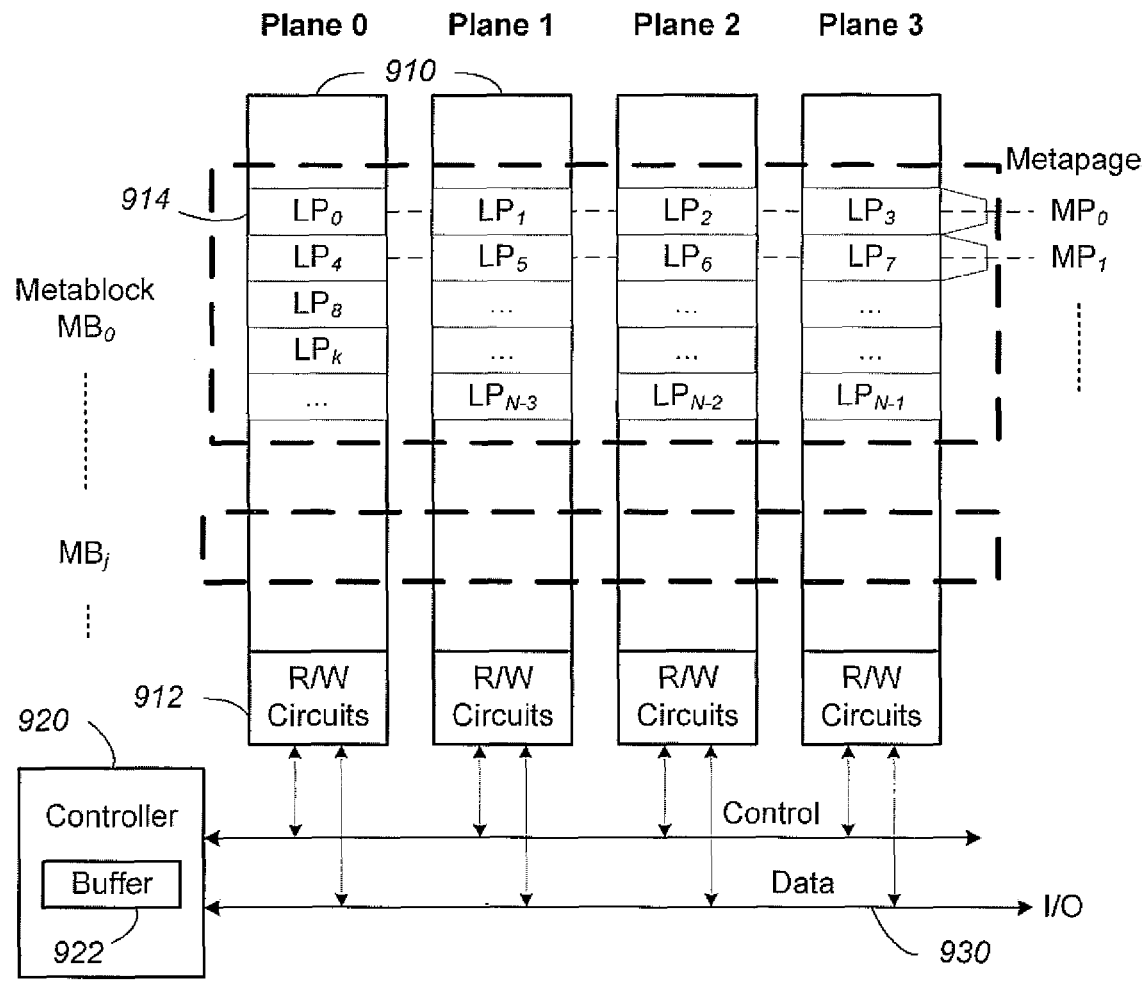
FIG. 21 illustrates a memory array constituted from multiple memory planes.

FIG. 21 illustrates a memory array constituted from multiple memory planes. The memory planes could be from the same memory chip or from multiple memory chips. Each plane 910 has its own set of read and program circuits 912 to service a page 914 of memory cells in parallel. Without loss of generality, in the example shown, the memory array has four planes operating in parallel.

Generally, a logical unit is a minimum unit of access by a host system. Typically a logical unit is a sector of size 512 bytes. A page is a maximum unit of parallel read or program in a plane. Typically a logical page contains one or more logical units. Therefore, when combining multiple planes, a maximum aggregated unit of parallel read or program could be regarded as a metapage of memory cells, where the metapage is constituted by a page from each of the multiple planes. For example, a metapage such as $MP_0$ has four pages, one from each of the planes, P0, P1, P2 and P3, storing in parallel logical pages $LP_0$, $LP_1$, $LP_2$, $LP_3$. Thus, the read and write performance of the memory is increased four fold as compared to operating only in one plane.

The memory array is further organized into metablocks such as $MB_0, \ldots, MB_j$ where all memory cells within each metablock are erasable together as a unit. A metablock such as $MB_0$ is constituted from multiple memory locations, for storing logical pages 914 of data, such as $LP_0$-$LP_{N-1}$. The logical pages in a metablock are distributed over the four planes P0, P1, P2 and P3 in a predetermined sequence according to the order they are filled in the metablock. For example, when the logical pages are filled in logically sequential order, the planes are visited in cyclic order with the first page in the first plane, the second page in the second plane, etc. After the last plane is reached, the filling returns cyclically to start from the first plane again in the next metapage. In this way, a contiguous run of logical pages can be accessed in parallel when all planes are operated in parallel.

In general, if there are W planes operating in parallel and the metablock is filled in logically sequential order, the kth logical page in a metablock would reside in plane x where x=k MOD W. For example, with four planes, W=4, and when filling the block in logical sequential order, the $5^{th}$ logical page LP5 would reside in a plane given by 5 MOD 4, which is plane 1, as can be seen in FIG. 21.

The memory operations in each memory plane are performed by the set of read/write circuits 912. Data in and out of each of the read/write circuits is transferred through a data bus 930 under the control of a controller 920. A buffer 922 in the controller 920 helps to buffer the transfer of data via the data bus 930. In particular when operations in a first plane require access to data in a second plane, a two-step process is required. The data is first read out from the second plane by the controller and then transferred to the first plane via the data bus and the buffer. In fact, in most memory architectures, transfer of data between two different bit lines also requires the data to be exchanged through the data bus 920.

At the very least, this involved transfer out of one set of read/write circuits in one plane and into another set of read/write circuits in another plane. In the case where the planes are from different chips, it will require transfer between chips.

The present invention provides structures and schemes for memory block management such that access of data by one plane from another is avoided in order to maximize performance.

As shown in FIG. 21, a metapage is formed by multiple logical pages, one in each plane. Each logical page may consist of one or more logical units. As data are being recorded logical unit by logical unit into a block across the planes, each logical unit will fall in one of the four memory planes.

The issue of plane alignment arises when a logical unit is updated. In the current example, for the purpose of illustration, a logical unit is taken as a logical sector of 512 byte and a logical page is also a logical unit wide. Since flash memory does not allow rewrite of a portion of a block without first erasing the whole block, updates to a logical page is not written over the existing location but recorded in an unused location of the block. The previous version(s) of the logical unit is then deemed obsolete. After a number of updates, a block may contain a number of logical units that have since been updated and thus become obsolete. The block is then said to be "dirty" and a garbage collection operation will ignore the dirty logical units but collect the latest version of each individual logical units and re-record them in logically sequential order in one or more new blocks. The dirty block is then erased and recycled.

When the updated logical unit is recorded in the next unused location in a block, it will generally not be recorded in the same memory plane as its previous versions. When it comes to a garbage collection operation, such as a consolidation or compaction, the latest version of a logical unit would be re-recorded in the same plane as the original to maintain the original order. However, performance would degrade if the latest version has to be retrieved from another plane.

Thus, according to another aspect of the invention, when an original logical unit of a first block stored in a given plane is to be updated, provisions are made to keep the updated logical unit in the same plane as the original. This is accomplished by recording the updated logical unit to the next available location of a second block but in the same plane. In a preferred embodiment, any intervening gaps from the last programmed memory unit to the next available plane-aligned memory unit are padded (i.e., filled in by copying) with the current versions of logical units in the same relative location as the original logical units in the original block.)

Figure 22A:
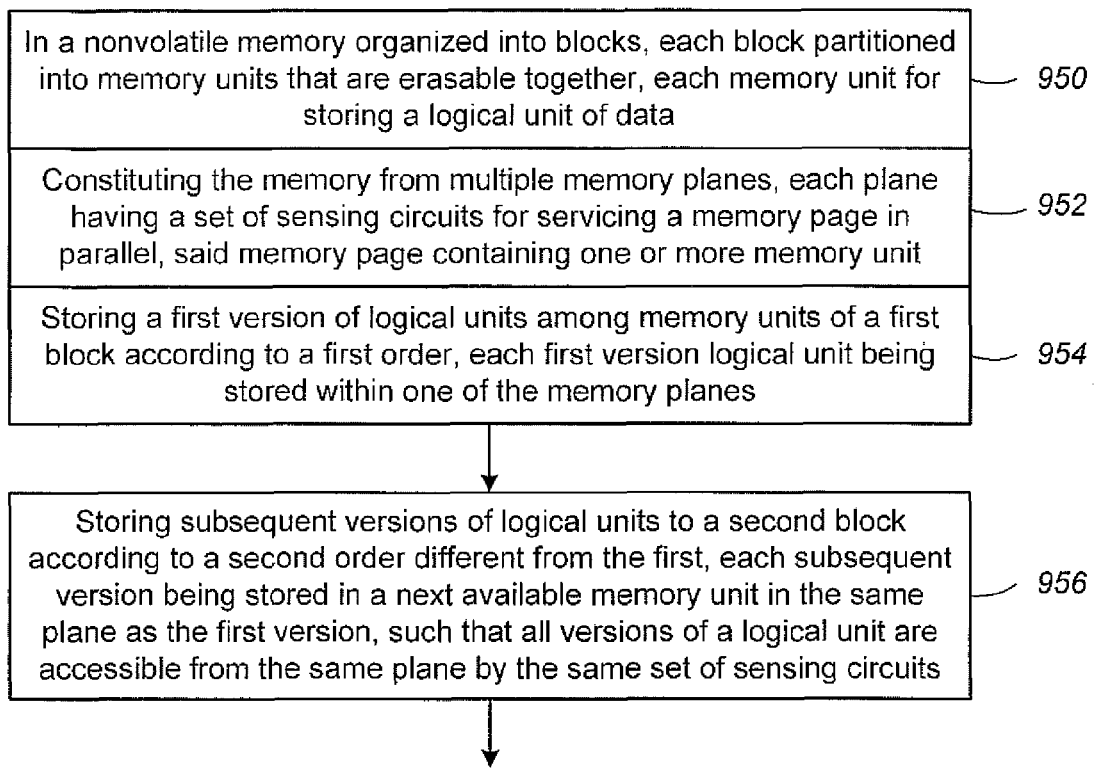
FIG. 22A is a flow diagram illustrating a method of update with plane alignment, according to a general implementation of the invention.

FIG. 22A is a flow diagram illustrating a method of update with plane alignment, according to a general implementation of the invention.

STEP 950: In a nonvolatile memory organized into blocks, each block partitioned into memory units that are erasable together, each memory unit for storing a logical unit of data.

STEP 952: Constituting the memory from multiple memory planes, each plane having a set of sensing circuits for servicing a memory page in parallel, said memory page containing one or more memory unit.

STEP 954: Storing a first version of logical units among memory units of a first block according to a first order, each first version logical unit being stored within one of the memory planes.

STEP 956: Storing subsequent versions of logical units to a second block according to a second order different from the first, each subsequent version being stored in a next available memory unit in the same plane as the first version, such that all versions of a logical unit are accessible from the same plane by the same set of sensing circuits.

Figure 22B:
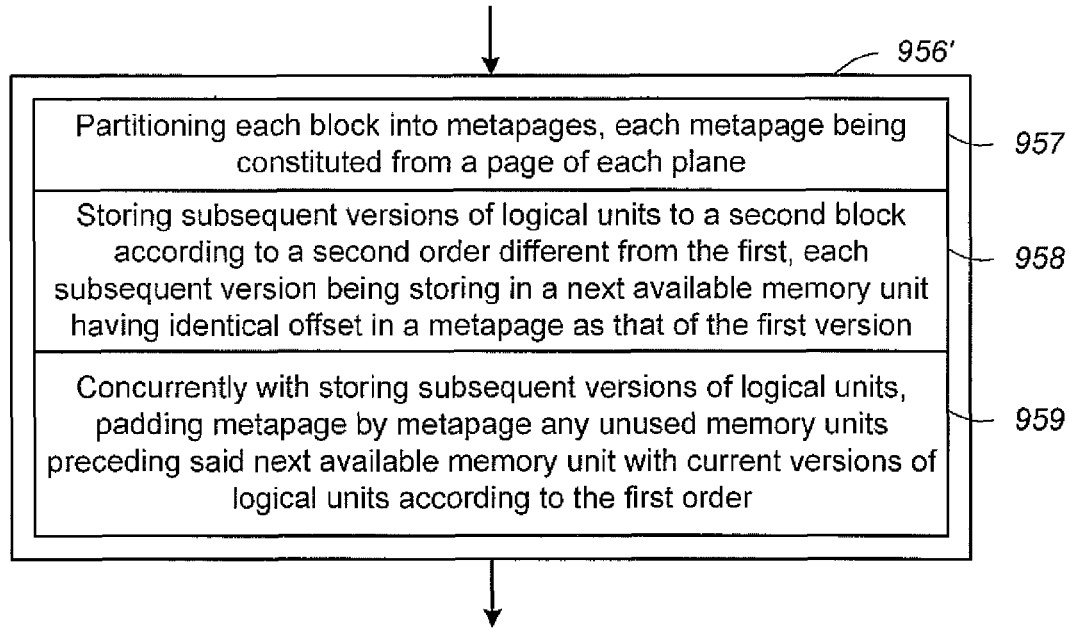
FIG. 22B illustrates a preferred embodiment of the step of storing updates in the flow diagram shown in FIG. 22A.

FIG. 22B illustrates a preferred embodiment of the step of storing updates in the flow diagram shown in FIG. 22A.

STEP 956' includes STEP 957, STEP 958 and STEP 959.

STEP 957: Partitioning each block into metapages, each metapage being constituted from a page of each plane. This step can be performed prior to any of the storing steps.

STEP 958: Storing subsequent versions of logical units to a second block according to a second order different from the first, each subsequent version being storing in a next available memory unit having identical offset in a metapage as that of the first version STEP 959: Concurrently with storing subsequent versions of logical units, padding metapage by metapage any unused memory units preceding said next available memory unit by copying current versions of logical units according to the first order.

Figure 23A:
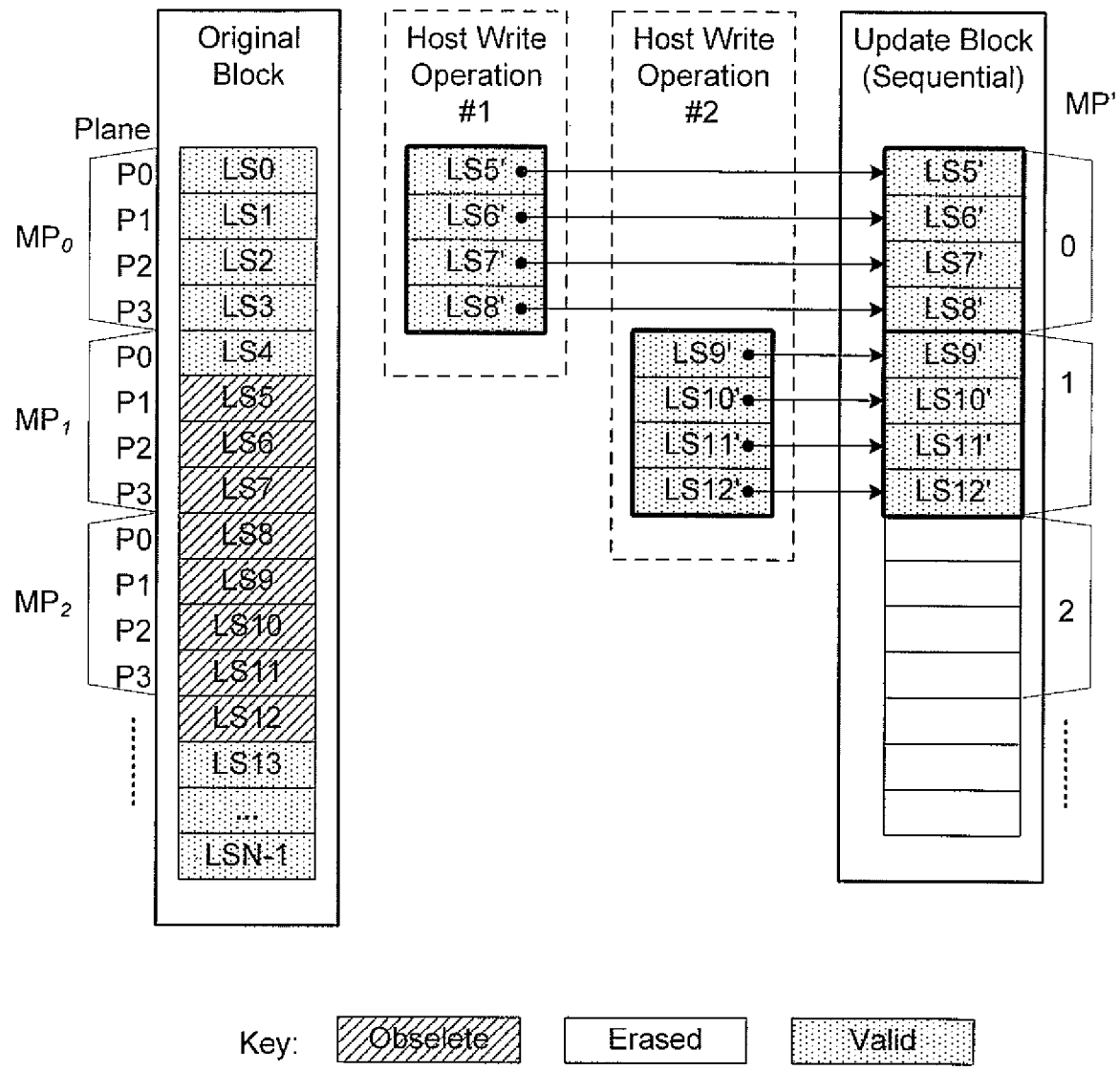
FIG. 23A illustrates an example of logical units being written in sequential order to a sequential update block without regard to plane alignment.

FIG. 23A illustrates an example of logical units being written in sequential order to a sequential update block without regard to plane alignment. The example shows each logical page being the size of a logical sector, such as LS0, LS1, . . . . In the four-plane example, each block, such as MB$_0$ can be regarded as partitioned into metapages MP$_0$, MP$_1$, . . . , with each metapage, such as MP$_0$ containing four sectors such as LS0, LS1, LS2 and LS3, respectively from the planes P0, P1, P2 and P3. Therefore the block is filled in logical units of sector by sector in cyclic order in planes P0, P1, P2 and P3.

In host write operation #1, the data in the logical sectors LS5-LS8 are being updated. The updated data as LS5'-LS8' are recorded in a newly allocated update block starting from the first available location.

In host write operation #2, the segment of data in the logical sectors LS9-LS12 are being updated. The updated data as LS9'-LS12' are recorded in the update block in a location directly following where the last write ends. It can be seen that the two host writes are such that the update data has been recorded in the update block in logically sequential order, namely LS5'-LS12'. The update block is regarded as a sequential update block since it has been filled in logically sequential order. The update data recorded in the update block obsoletes the corresponding ones in the original block.

However, the update logical sectors are being recorded in the update block according to the next available location but without regard to plane alignment. For example, the sector LS5 is originally recorded in plane P1, but the updated LS5' is now recorded in P0. Similarly the other update sectors are all misaligned.

Figure 23B:
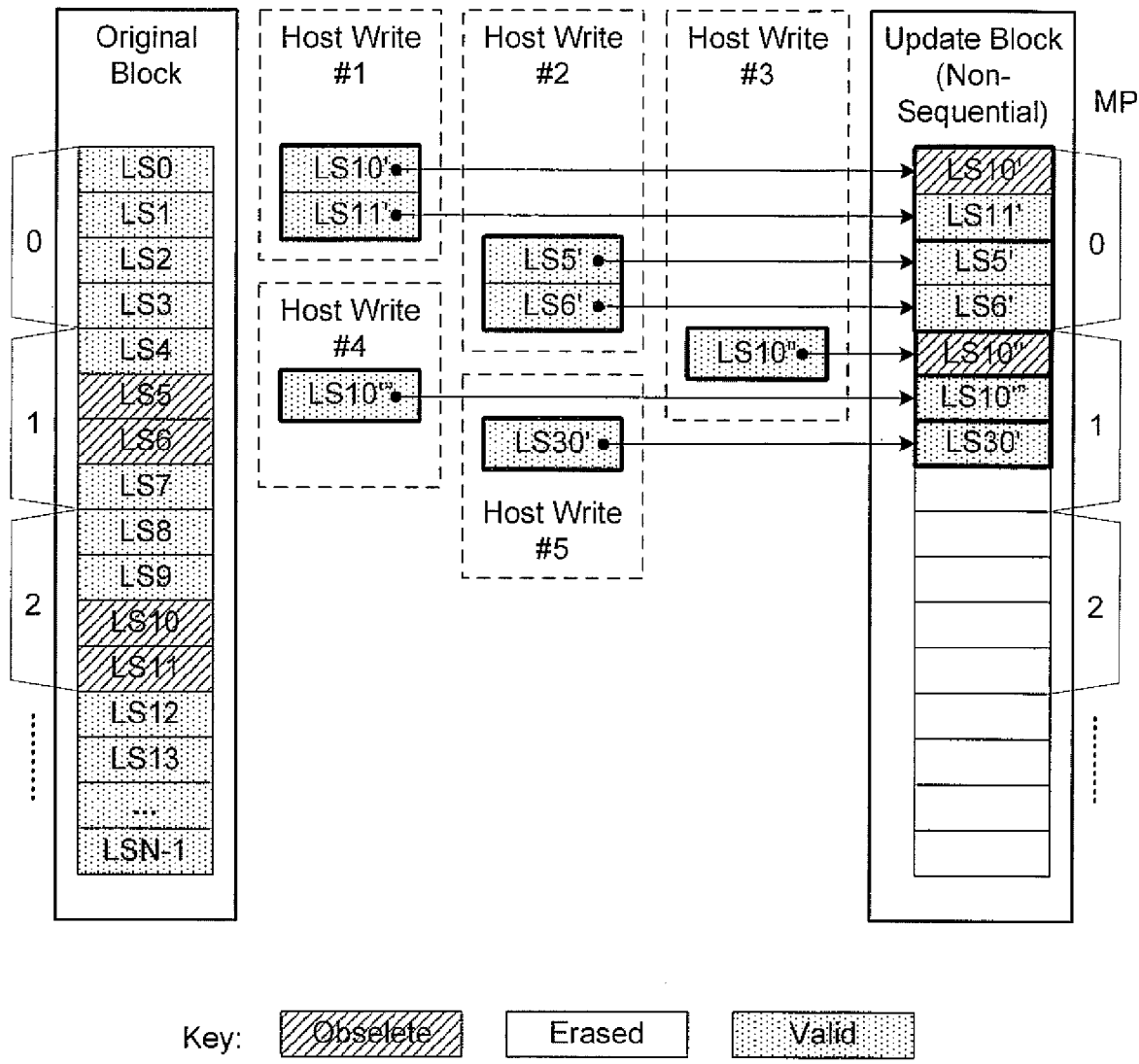
FIG. 23B illustrates an example of logical units being written in non-sequential order to a chaotic update block without regard to plane alignment.

FIG. 23B illustrates an example of logical units being written in non-sequential order to a chaotic update block without regard to plane alignment.

In host write operation #1, the logical sectors LS10-LS11 of a given logical group stored in an original metablock are updated. The updated logical sectors LS10'-LS11' are stored in a newly allocated update block. At this point, the update block is a sequential one. In host write operation #2, the logical sectors LS5-LS6 are updated as LS5'-LS6' and recorded in the update block in the location immediately following the last write. This converts the update block from a sequential to a chaotic one. In host write operation #3, the logical sector LS10' is being updated again and is recorded in the next location of the update block as LS10". At this point LS10" in the update block supersedes LS10' in a previous recording which in turn supercedes LS10 in the original block. In host write operation #4, the data in the logical sector LS10" is again updated and is recorded in the next location of the update block as LS10'''. Thus, LS10''' is now the latest and only valid version for the logical sector LS10. All previous versions of LS10 are now obsolete. In host write operation #5, the data in logical sector LS30 is being updated and recorded in the update block as LS30'. In this example, logical units within a logical group can be written in a chaotic update block in any order and with any repetition.

Again, the update logical sectors are being recorded in the update block according to the next available location but without regard to plane alignment. For example, the sector LS10 is originally recorded in plane P2 (i.e., MP$_2$, $3^{rd}$ plane), but the updated LS10' is now recorded in P0 (i.e., MP$_0$', $1^{st}$ plane). Similarly, in host write #3, the logical sector LS10' is updated again as LS10" and is placed in the next available location which turns out to be also in plane P0 ($1^{st}$ plane in MP$_1$'). Thus, it can be seen that in general, recording an update sector into the next available location of a block could result in the updated sector being stored in a plane different from its earlier versions.

Figure 24A:
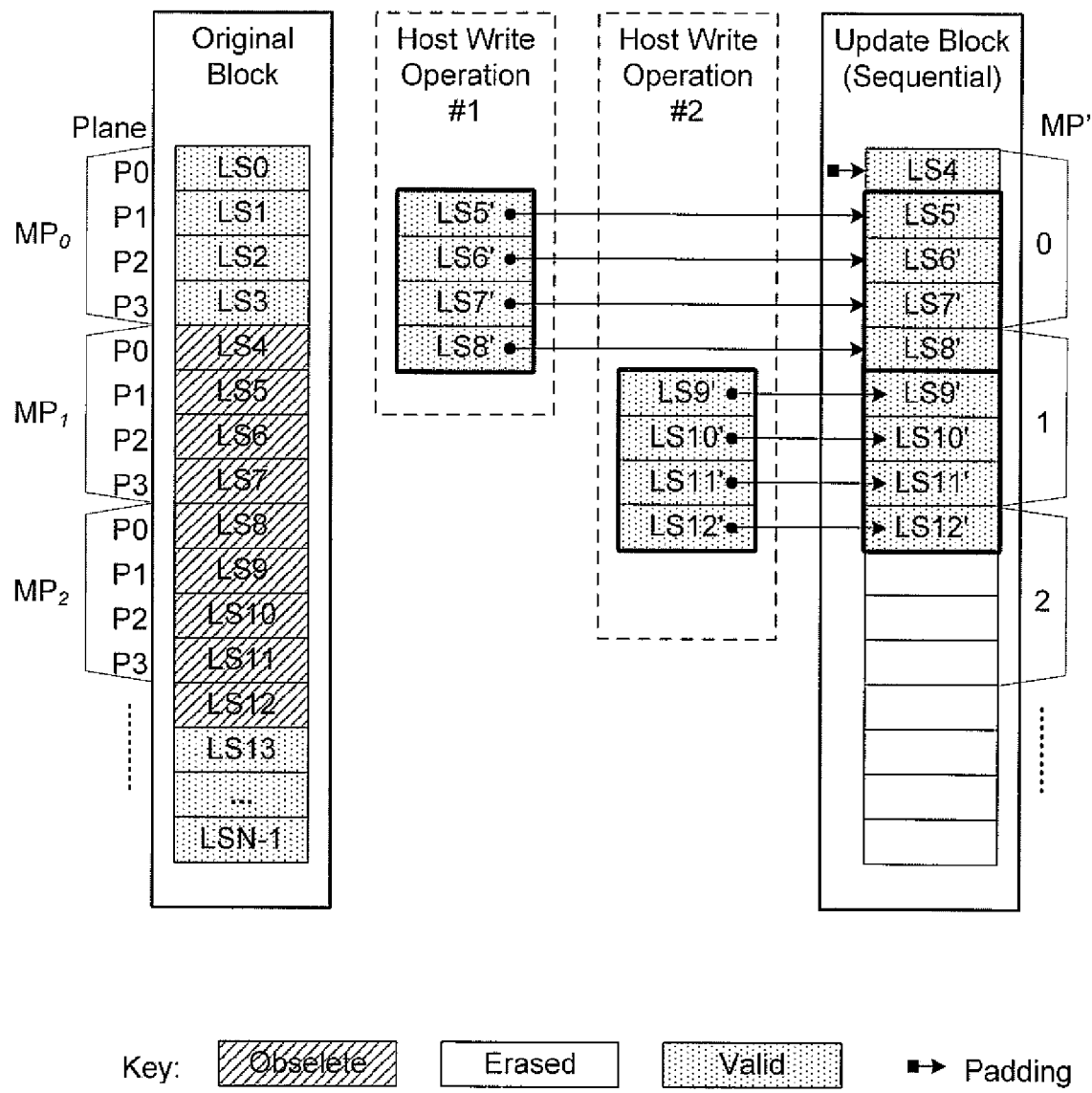
FIG. 24A illustrates the sequential update example of FIG. 23A with plane alignment and padding, according to a preferred embodiment of the invention.

Plane-aligned Sequential Update Block with Intervening Gaps Filled in by Padding FIG. 24A illustrates the sequential update example of FIG. 23A with plane alignment and padding, according to a preferred embodiment of the invention.

In host write operation #1, the updated data as LS5'-LS8' are recorded in a newly allocated update block starting from the first available plane-aligned location. In this case LS5 is originally in P1, which is the $2^{nd}$ plane of a metapage. Therefore, LS5'-LS7' will be programmed in corresponding planes in the first available metapage, MP$_0$, of the update block. At the same time, the gap of the unused $1^{st}$ plane in MP$_0$' is being padded with a current version of the logical sector LS4 that precedes LS5 in the metapage of the original block. The original LS4 is then treated as obsolete data. The left over LS8' is then recorded in the $1^{st}$ plane of the next metapage, MP$_1$', and is plane-aligned.

In host write operation #2, the updated data as LS9'-LS12' are recorded in the update block in the next available plane-aligned location. Therefore, LS9' is recorded in the next available plane-aligned memory unit, which is the $2^{nd}$ plane of MP$_1$'. In this case, no gaps result and no padding is necessary. The update block is regarded as a sequential update block since it has been filled in logically sequential order. Furthermore, it is plane-aligned since each update logical unit is in the same plane as its original.

Plane-aligned, Chaotic Update Block with Intervening Gaps

Figure 24B:
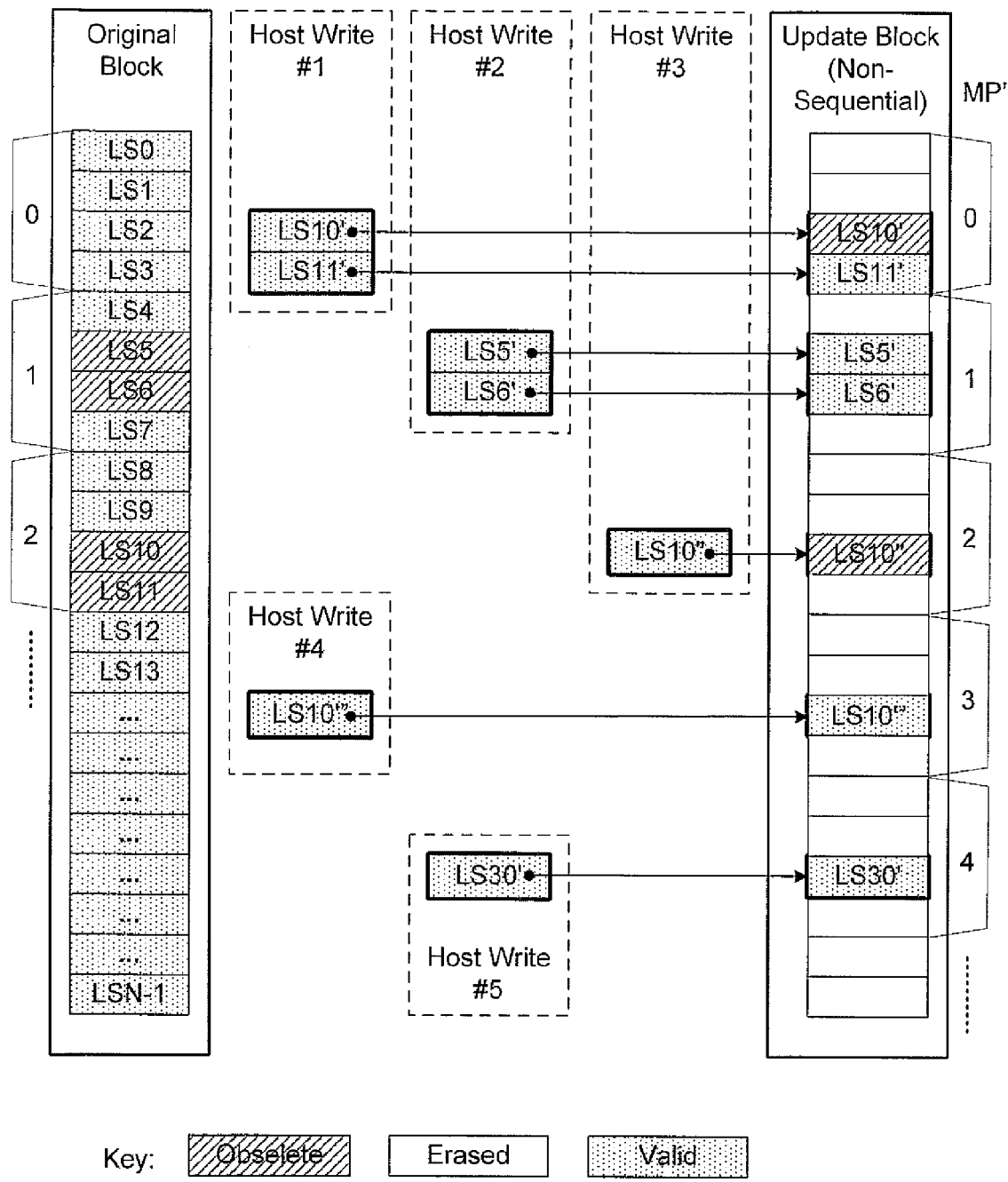
FIG. 24B illustrates the chaotic update example of FIG. 23B with plane alignment and with no padding, according to one preferred embodiment of the invention.

FIG. 24B illustrates the chaotic update example of FIG. 23B with plane alignment and with no padding, according to one preferred embodiment of the invention.

In host write operation #1, the updated logical sectors LS10'-LS11' are stored in a newly allocated update block. Instead of storing them in the next available memory units, they are stored in the next available plane-aligned memory units. Since LS10' and LS11' are originally stored in planes P2 and P3 ($3^{rd}$ and $4^{th}$ planes of MP$_2$ of the original block) respectively, the next available plane-aligned memory units would be that in the $3^{rd}$ and $4^{th}$ planes of MP$_0$' of the update block. At this point, the update block is non-sequential, with the pages of metapage MP$_0$' filled in the order UNFILLED, UNFILLED, LS10' and LS11'.

In host write operation #2, the logical sectors LS5-LS6 are updated as LS5'-LS6' and recorded in the update block in next available plane-aligned location. Thus, LS5' and LS6', being in the $2^{nd}$ (P1) and $3^{d}$ (P2) planes or memory unit of MP$_1$ of the original block, would be programmed into corresponding planes in the next available metapage MP$_1$' in the update block. This leaves a preceding, unused $1^{st}$ plane in MP$_1$'.

In host write operation #3, the logical sector LS10' is being updated again and is recorded in the next plane-aligned location of the update block as LS10". Thus, it will be written to the next available 3$^{rd}$ plane, which will be in MP$_2$'. This leaves a preceding gap of the last plane in MP$_1$' and the first two planes of MP$_2$'. This will obsolete LS10' in MP$_0$'.

In host write operation #4, the data in the logical sector LS10" is again updated and is recorded in the next available 3$^{rd}$ plane of the metapage MP$_2$' in the update block as LS10'''. Thus, LS10''' is now the latest and only valid version for the logical sector LS10. This leaves a gap consisting of the last plane in MP$_2$' and the first two planes in MP$_3$'.

In host write operation #5, the data in logical sector LS30 is being updated and recorded in the update block as LS30'. Since the original LS30 resides in P2 or the 3$^{rd}$ plane of a metapage, it will be written to the next available 3$^{rd}$ plane in the update block. In this case, it will be the 3$^{rd}$ plane of MP$_4$'. A gap is created from the last plane of MP$_3$' to the first two planes of MP$_4$'. Thus, the example illustrates that logical sectors within a logical group can be written in a chaotic update block in any order and with any repetition in a plane-aligned manner. In a subsequent garbage collection operation, all versions, especially the latest version of a given logical sector will be conveniently serviced by an identical set of sensing circuits.

Plane-aligned, Chaotic Update Block with Intervening Gaps Filled in by Padding

Figure 24C:
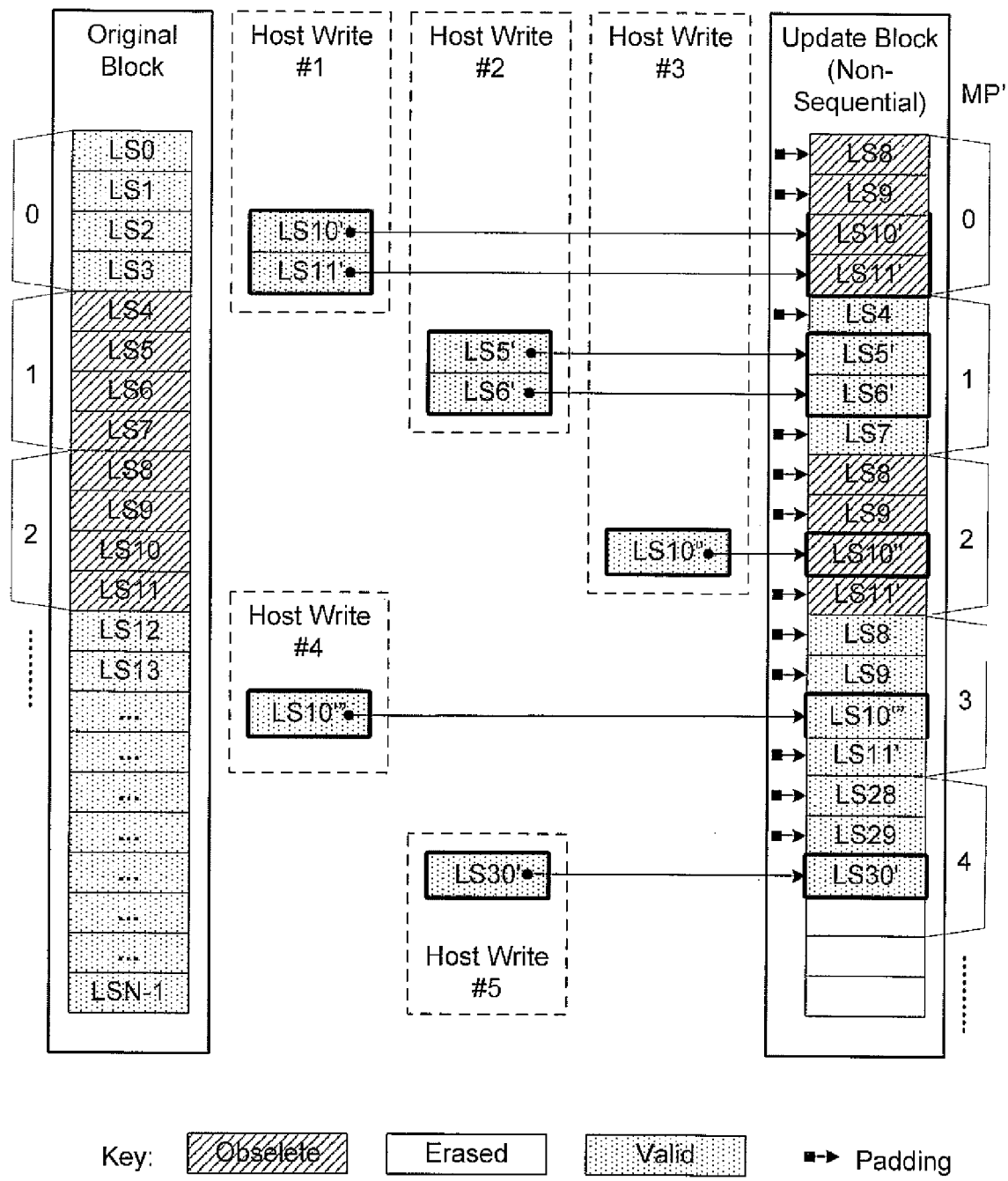
FIG. 24C illustrates the chaotic update example of FIG. 23B with plane alignment and padding, according to another preferred embodiment of the invention.

FIG. 24C illustrates the chaotic update example of FIG. 23B with plane alignment and padding, according to another preferred embodiment of the invention.

The operation is similar to that shown in FIG. 24B, except the intervening gaps are first filled in with padding. In host write operation #1, the gap created by the 1$^{st}$ and 2$^{nd}$ unused planes of the metapage MP$_0$' are first padded with current versions of LS8 and LS9, which reside in the original block. This renders the LS8 and LS9 in the original block obsolete. At this point, the update block is a sequential one, with the metapage MP$_0$' filled in the order LS8, LS9, LS10' and LS11'.

In host write operation #2, a gap is created by a preceding, unused 1$^{st}$ plane in MP$_1$' and it is first padded with LS4. This will render the LS4 in the original block obsolete. As before, the second write converts the update block from a sequential to a chaotic one.

In host write operation #3, a gap is created by unused, last plane in MP$_1$' and the first two planes of MP$_2$'. The last plane of MP$_1$' is first padded with LS7 which follows the last programmed LS6' and the first two planes of MP$_2$' are padded with logical units preceding LS10, namely LS8 and LS9. This will obsoletes LS10' in MP$_0$' and LS7-LS9 in the original block.

In host write operation #4, a gap is created consisting of the last plane in MP$_2$' and the first two planes in MP$_3$'. The last plane of MP$_2$' is padded by LS11' which is the current version of the logical unit following the last written LS10" in the metapage MP$_2$'. The first two planes of MP$_3$' are padded by LS8 and LS9 respectively, as the logical units preceding LS10''' in the metapage MP$_3$'.

In host write operation #5, a gap from the last plane of MP$_3$' to the first two planes of MP$_4$' will be padded accordingly, namely with LS11', LS28 and LS29 respectively. Thus, the example illustrates that logical sectors within a logical group can be written in a chaotic update block in any order and with any repetition in a plane-aligned manner.

In the preferred embodiment, a metapage contains a cyclic run of pages from the individual planes. Since a metapage can be read or programmed in parallel, it is expedient to implement each host update with the granularity of a metapage. The padding, if any, is recorded together with the updated logical units, metapage by metapage.

In the embodiment illustrated by the examples of FIG. 24A and FIG. 24C, during each host write, padding is performed on unused memory units preceding the plane-aligned memory unit to which the update is to be programmed. The action of any unused memory units following the last programmed memory unit is deferred until the next host write. Generally, any preceding unused memory units are padded within each metapage's boundary. In other words, if a preceding gap straddles over two metapages, padding will performed on each metapage in a logically sequential order appropriate to each metapage, but without regard to continuity across the boundary. In the event of a consolidation of the block, the last written metapage, if partially written, will be completely filled by padding.

In another embodiment, any partially filled metapage is fully padded before moving to the next metapage.

Memory Unit Granularity

Variations to the unit of read or program are possible, depending on the flexibility supported by the individual memory architectures. The independent nature of the individual planes allows each page from individual planes in a metapage to be read and programmed independently. The examples given earlier have the maximum unit of program to be a page in each plane. Within a metapage, a partial metapage programming of less than all the pages is possible. For example, it is possible to program the first three pages of a metapage and then program the fourth page subsequently.

Also, at the plane level, a physical page may contain one or more memory units. If each memory unit can store a sector of data, then a physical page may store one or more sectors. Some memory architecture supports partial-page programming, in which by inhibiting programming of selected memory units within a page, selected logical units may be programmed individually at different times over multiple programming passes.

Logical Unit Alignment Within a Memory Plane for Chaotic Update of a Logical Group In a block memory management system, a logical group of logical units is stored in logically sequential order in an original block. When the logical group is updated, subsequent versions of the logical units are stored in an update block. If the logical units are stored chaotically (i.e., non-sequentially) in the update block, a garbage collection is eventually performed to collect the latest versions of the logical units among the original block and the update block and to consolidate them sequentially into a new original block. The garbage collection operation will be more efficient if the updated versions of a given logical unit are all stored in the update block in alignment with its original version in the original block such that all versions are accessible by an identical set of sensing circuits.

According to another aspect of the invention, in the above-described block memory management system, when the memory is organized into a series of memory pages, where each page of memory units are serviced in parallel by a set of sensing circuits, all versions of a given logical unit are aligned if they all have identical offset location in the page they are stored.

Figure 25:
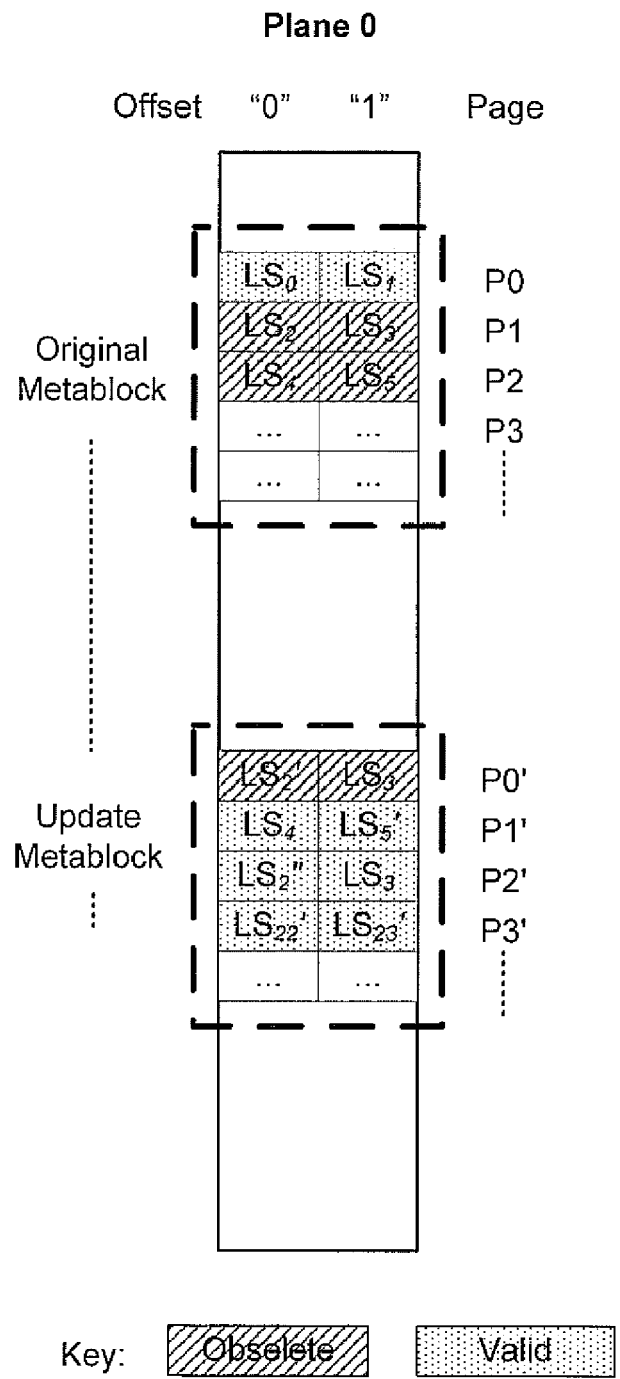
FIG. 25 illustrates an example memory organization in which each page contains two memory units for storing two logical units, such as two logical sectors.

FIG. 25 illustrates an example memory organization in which each page contains two memory units for storing two logical units, such as two logical sectors. In an original block, since the logical sectors are stored in logically sequential order, the logical sectors, LS0 and LS1 are stored in the page P0, the logical sectors LS2 and LS3 are stored in the page P1, and the logical sectors LS4 and LS5 are stored in the page P3, etc. It will be seen that in this two-sector page, the first sector from the left has a page offset of "0", and the second sector has a page offset of "1".

When the logical group of logical sectors stored sequentially in the original block is updated, the updated logical sectors are recorded in an update block. For example, the logical sector LS2 resides in page P0 with offset "0" in the original block. If in a first write, if LS2 is updated to LS2', it will be stored in the first available location in the update block having the same page offset "0". This will be in the first memory unit of the page P0'. If in a second write, LS5 is update to LS5', it will be stored in the first available location in the update block having the same page offset "1". This will be in the second memory unit with offset "1" of the page P1'. However, before storing LS5', the unused memory units with offset "1" in P0' and offset "0" in P1' will first be padded by copying to them the latest versions of the logical sectors that will maintain logical sequential order at least within each page. In this case, LS3 will be copied to the offset "1" location in P0' and LS4 to the offset "0" location in P1'. If in a third write, LS2' is again updated to LS2", it will be stored in offset "0" of P2'. If in a fourth write, LS22 and LS23 are respectively updated to LS22' and LS23', they will be stored respectively in offsets "0" and "1" of P3'. However, before that, the unused memory unit with offset "1" in P2' is padded with LS3.

The updating sequence described above assumes that it is possible to program individual sectors within a page. For some memory architecture where partial page programming is not support, all sectors within a page must be programmed together. In that case, in the first write, LS2' and LS3 are programmed together into P0'. In the second write, LS4 and LS5' are programmed together into P1'. In the third write, LS2" and LS3 are programmed together into P2', etc.

Plane Alignment Within Metapage

Alternatively, the unit of program may have the granularity of a metapage. If the granularity of writing to a chaotic update block becomes a metapage, the entries in the CBI block described in connection with FIGS. 16A and 16B, may relate to metapages instead of sectors. The increased granularity reduces the number of entries that must be recorded for a chaotic update block, and allows direct indices to be eliminated and a single CBI sector to be used per metablock.

Figure 26A:
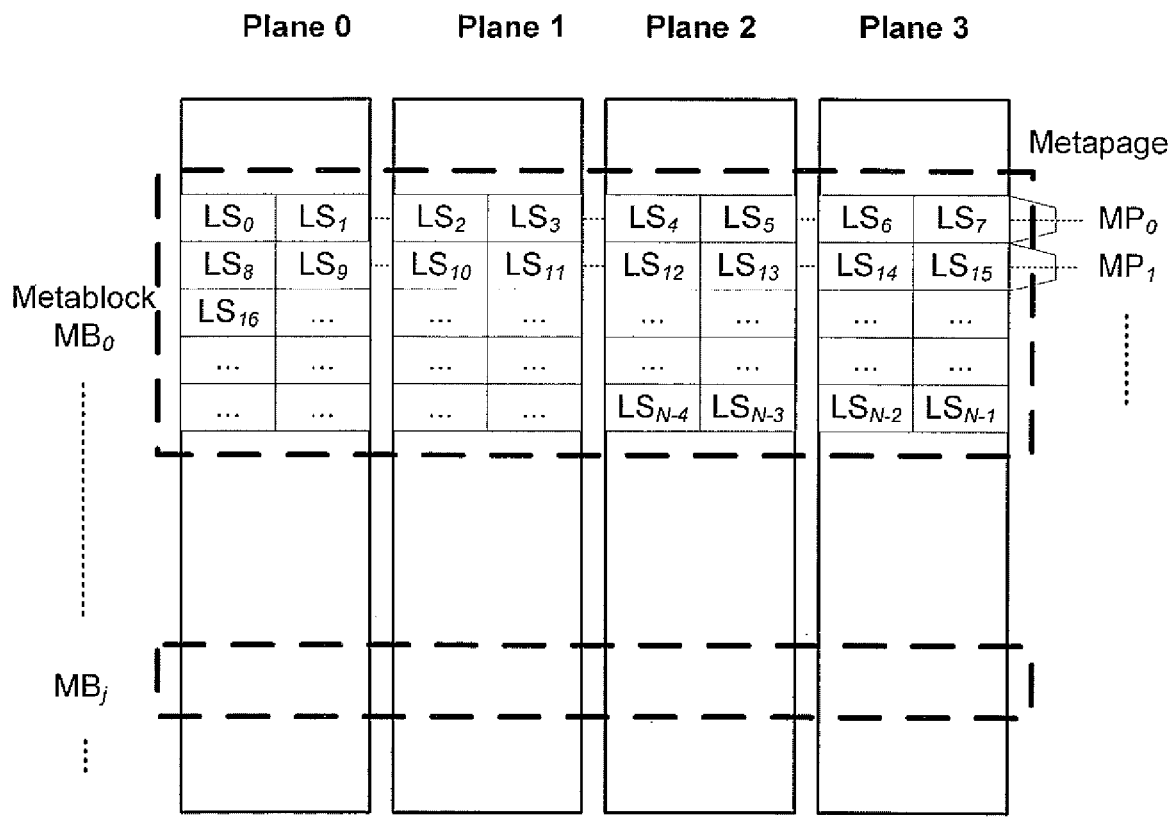
FIG. 26A is similar to the memory structure of FIG. 21 except each page contains two sectors instead of one.

FIG. 26A is similar to the memory structure of FIG. 21 except each page contains two sectors instead of one. Thus, it can be seen that a metapage $MP_0$ now has each of its pages capable of storing two logical units of data. If each logical unit is a sector then logical sectors are stored sequentially in $MP_0$ with LS0 and LS1 in plane P0, LS2 and LS3 in plane P1, etc.

Figure 26B:
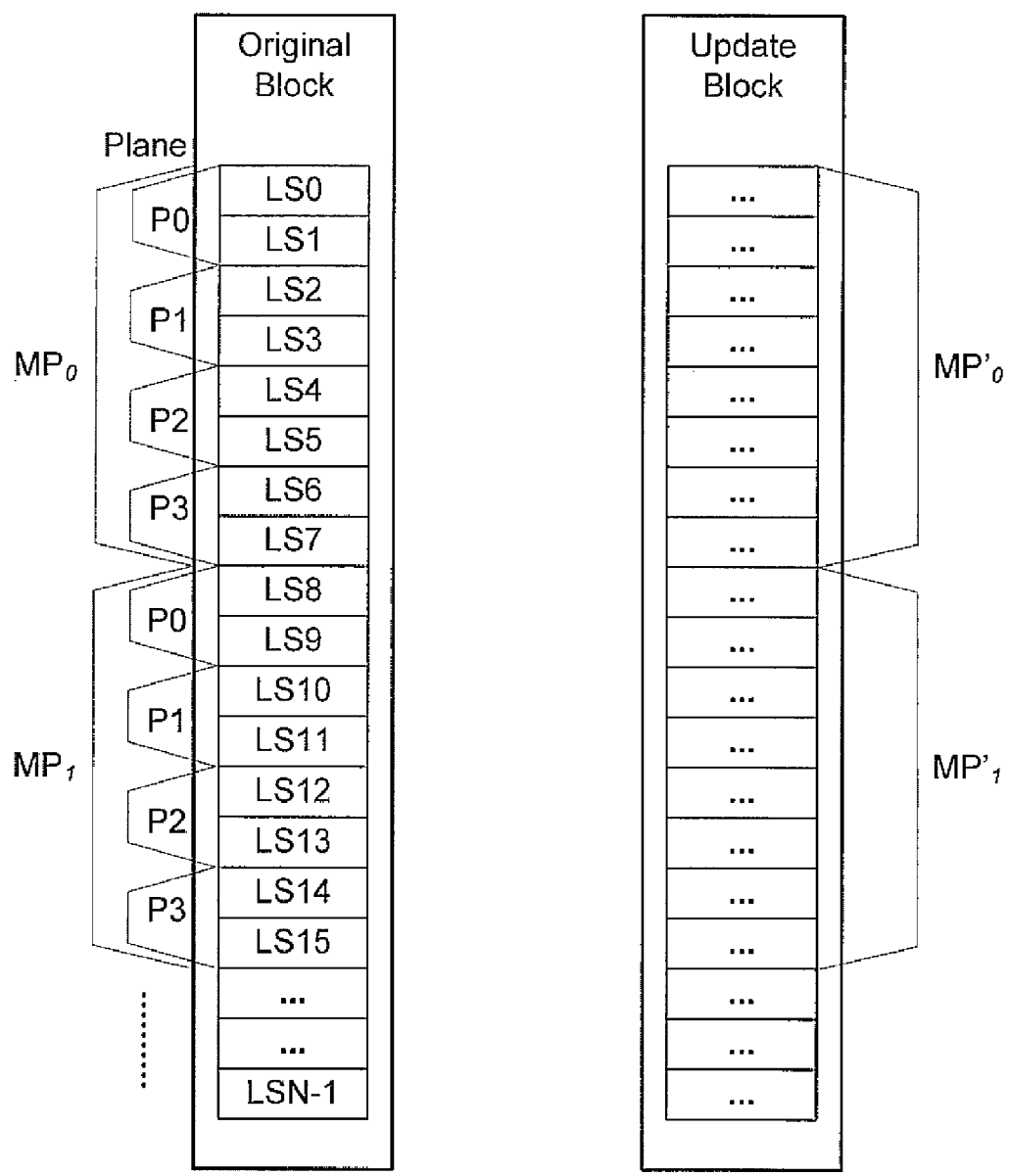
FIG. 26B illustrates metablocks shown in FIG. 26A having memory units laid out in a schematic linear fashion.

FIG. 26B illustrates metablocks shown in FIG. 26A having memory units laid out in a schematic linear fashion. As compared to the single sector page of FIG. 21, the logical sectors are stored cyclically among the four pages with two sectors in each page.

In general, if there are W planes operating in parallel and there are K memory units per page and the metablock is filled in logically sequential order, the kth logical page in a metablock would reside in plane x where x=k' MOD W, where k'=INT(k/K). For example, with four planes, W=4, and with 2 sectors per page, K=2, then for k=5, which refers to the $5^{th}$ logical sector, LS5, it will reside in a plane given by 2 MOD 4, which is plane 2, as can be seen in FIG. 24A. Generally, the same principles apply for implementing plane alignment described earlier.

The examples given earlier are for page alignment with planes in a multi-plane architecture. In the case of a page with multiple sectors, it will be advantageous to also maintain sector alignment within a page. In this way, the same set of sense circuits can be used expediently for different versions of the same logical sector. Operations such as relocation and "read-modify-write" of a sector are efficiently performed. When aligning sector order within a page, the same techniques as in aligning page to plane can be employed. Also depending on embodiments, any intervening gaps may or may not be padded.

Logical unit or Plane Alignment Without Padding

Figure 27:
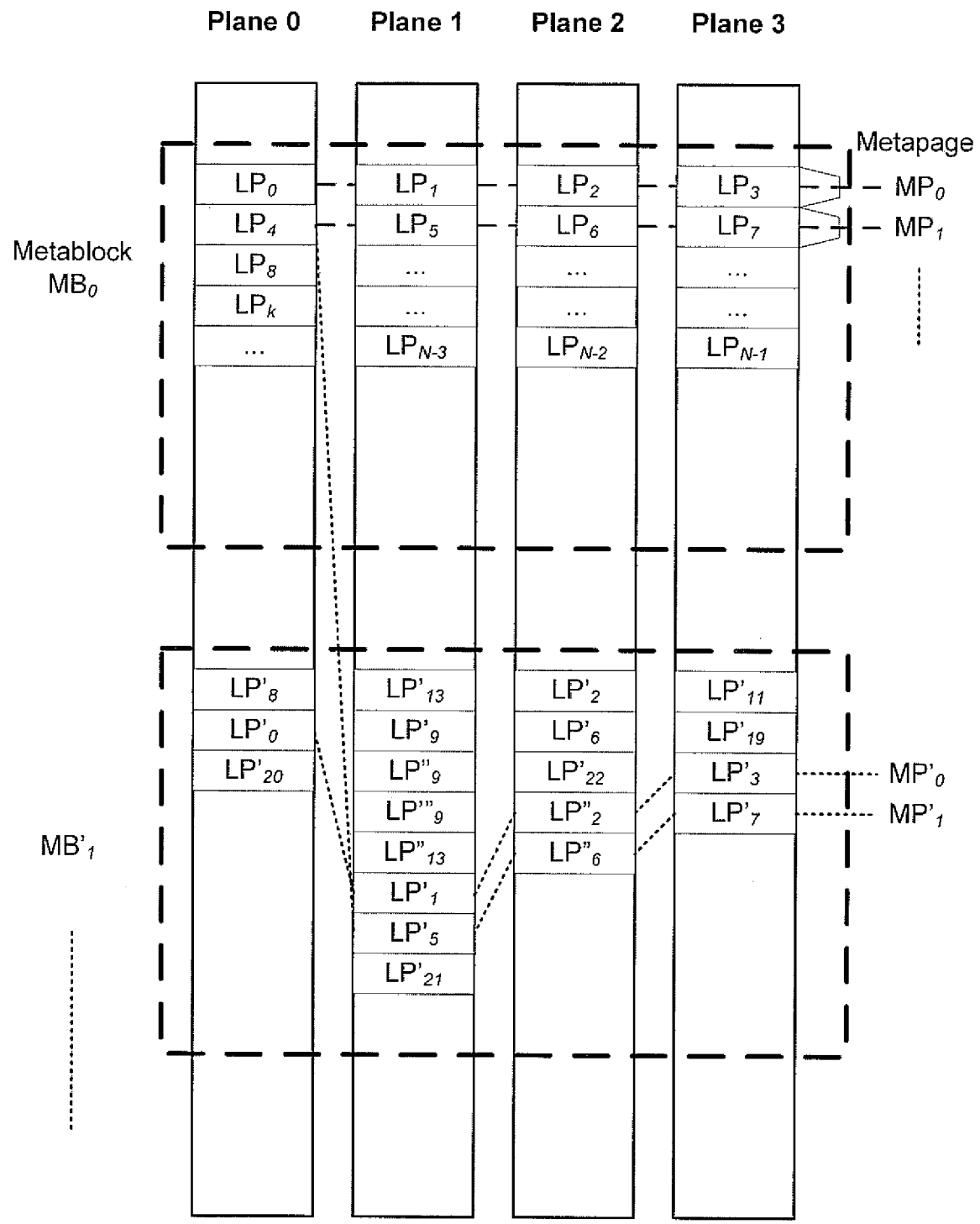
FIG. 27 illustrates an alternative scheme for plane alignment in an update block without padding logical units to be copied from one location to another.

FIG. 27 illustrates an alternative scheme for plane alignment in an update block without padding logical units to be copied from one location to another. The portions of the four planes that intersect with the update block may be regarded as four buffers that collect plane-aligned updated logical units received from a host. Each logical unit received from the host is programmed without padding in the next available memory unit of the appropriate buffer. A different number of logical units are likely to have been programmed in each plane, according to the sequence of logical unit addresses received from the host.

The chaotic update block $MB'_1$ may contain updated versions of all logical units of a logical metapage, such as for $MP'_0$. It may also contain less than all logical units of a metapage, such as for $MP'_1$. In the case of $MP'_1$, the missing logical unit, $LS_4$ can be obtained from the corresponding original block $MB_0$.

This alternative scheme is particularly efficient if the memory architecture supports parallel read of arbitrary logical page from each plane. In this way, all logical pages of a metapage can be read in a single parallel read operation even if the individual logical pages are not from the same row.

Phased Program Error Handling

When there is a program failure in a block then all the data to be stored to the block is typically moved to another block and the failed block marked as bad. Depending on the timing specification for the operation in which the failure is encountered, there may not be enough time to additionally move the stored data to another block. The worst case scenario is program failure during normal garbage collection operation, where another, similar garbage collection operation is required to relocate all the data to another block. In this case, a specified write latency time limit of a given host/memory device can be violated since it is typically designed to accommodate one by not two garbage collection operations.

Figure 28:
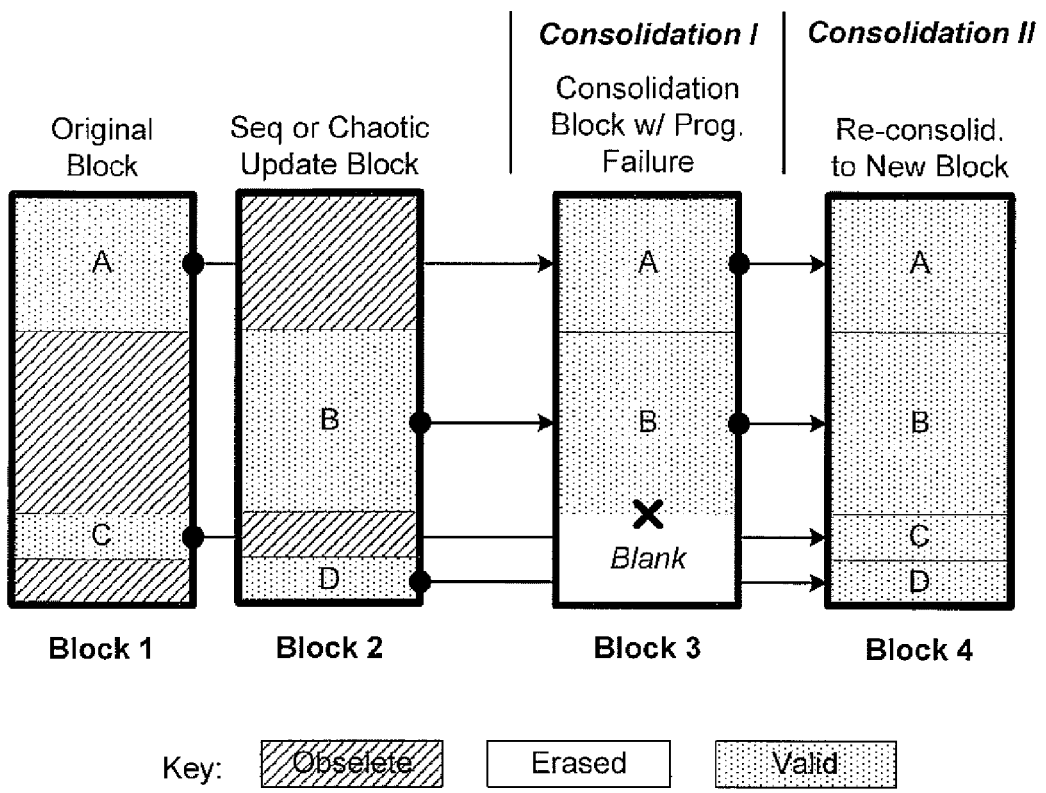
FIG. 28 illustrates a scheme in which when a program failure occurs in a defective block during a consolidation operation, the consolidation operation is repeated on another block.

FIG. 28 illustrates a scheme in which when a program failure occurs in a defective block during a consolidation operation, the consolidation operation is repeated on another block. In the example, Block 1 is an original block storing the complete logical units of a logical group in logically sequential order. For illustrative purposes, the original block contains sections A, B, C, and D, each storing a subgroup of logical units. When a host updates certain logical units of the group, the newer versions of the logical units are recorded in an update block, namely, Block 2. As described earlier in connection with update blocks, depending on the host, the updates could record the logical units in sequential or in non-sequential (chaotic) order. Eventually, the update block is closed to receiving further updates either because it is full or for some other reasons. When the update block (Block 2) is closed, the current versions of the logical units that reside either on the update block or the original block (Block 1) are consolidated onto a new block (Block 3) to form a new original block for the logical group. The example shows the update block containing the newer versions of the logical units in sections B and D. For expediency, the sections B and D are illustrated schematically in Block 2 not necessarily in the locations they are recorded but rather aligned to their original locations in Block 1.

In a consolidation operation, the current versions of all the logical units of the logical group, that originally reside in Block 1, are recorded in sequential order into a consolidation block (Block 3). Thus, the logical units of section A will first be copied from Block 1 to Block 3, followed by those of section B from Block 2 to Block 3. In the example, when the logical units of section C are to be copied from Block 1 to Block 3, a defect in Block 3 results in a program failure.

One way of handling the program failure is to restart the consolidation process on a fresh block (Block 4). Thus, the sections A, B, C, D are copied onto Block 4, and the defective Block 3 is then discarded. However, this would mean performing two consolidation operations in tandem, which may result in copying as much as two blocks full of logical units.

Memory devices have a specific time allowance to complete a certain operation. For example when a host writes to a memory device, it expects the write operation to be completed within a specified time, know as "write latency". While the memory device, such as a memory card, is busy writing the data from the host, it signals a "BUSY" state to the host. If the "BUSY" state lasts longer than the write latency period, the host will time-out the write operation and register an exception or error to the write operation.

Figure 29:
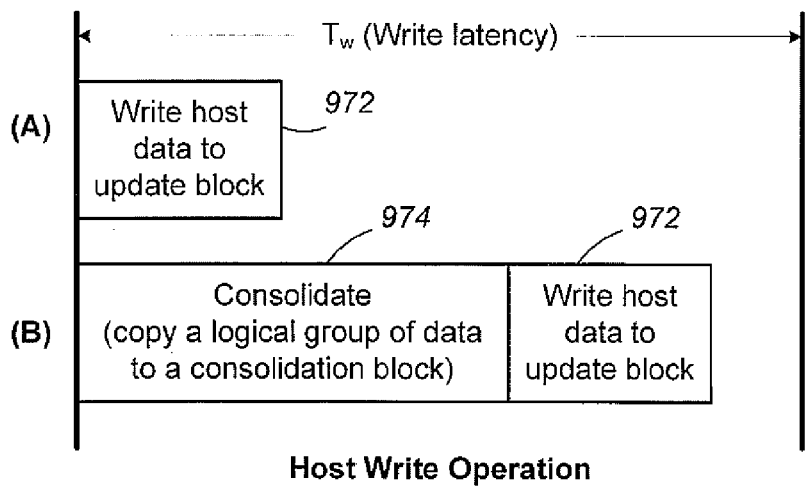
FIG. 29 illustrates schematically, a host write operation with a timing or write latency that allows enough time to complete a write (update) operation as well as a consolidation operation.

FIG. 29 illustrates schematically, a host write operation with a timing or write latency that allows enough time to complete a write (update) operation as well as a consolidation operation. The host write operation has a write latency, $T_W$, that will provide sufficient time for the completion of an update operation 972 of writing host data to an update block (FIG. 29(A)). As described in the block management system earlier, a host write to an update block may trigger a consolidation operation. Thus, the timing also allows for a consolidation operation 974 (FIG. 29(B)) in addition to the update operation 972. However, having to restart the consolidation operation anew in response to a failed one may take too much time and exceed the specified write latency.

According to another aspect of the invention, in a memory with block management system, program failure in a block during a time-critical memory operation is handled by continuing the programming operation in a breakout block. Later, at a less critical time, the data recorded in the failed block prior to the interruption is transferred to another block, which could also be the breakout block. The failed block can then be discarded. In this way, when a defective block is encountered, it can be handled without loss of data and without exceeding a specified time limit by having to transfer the stored data in the defective block on the spot. This error handling is especially critical for a garbage collection operation so that the entire operation need not be repeated on a fresh block during a critical time. Subsequently, at an opportune time, the data from the defective block can be salvaged by relocation to another block.

Figure 30:
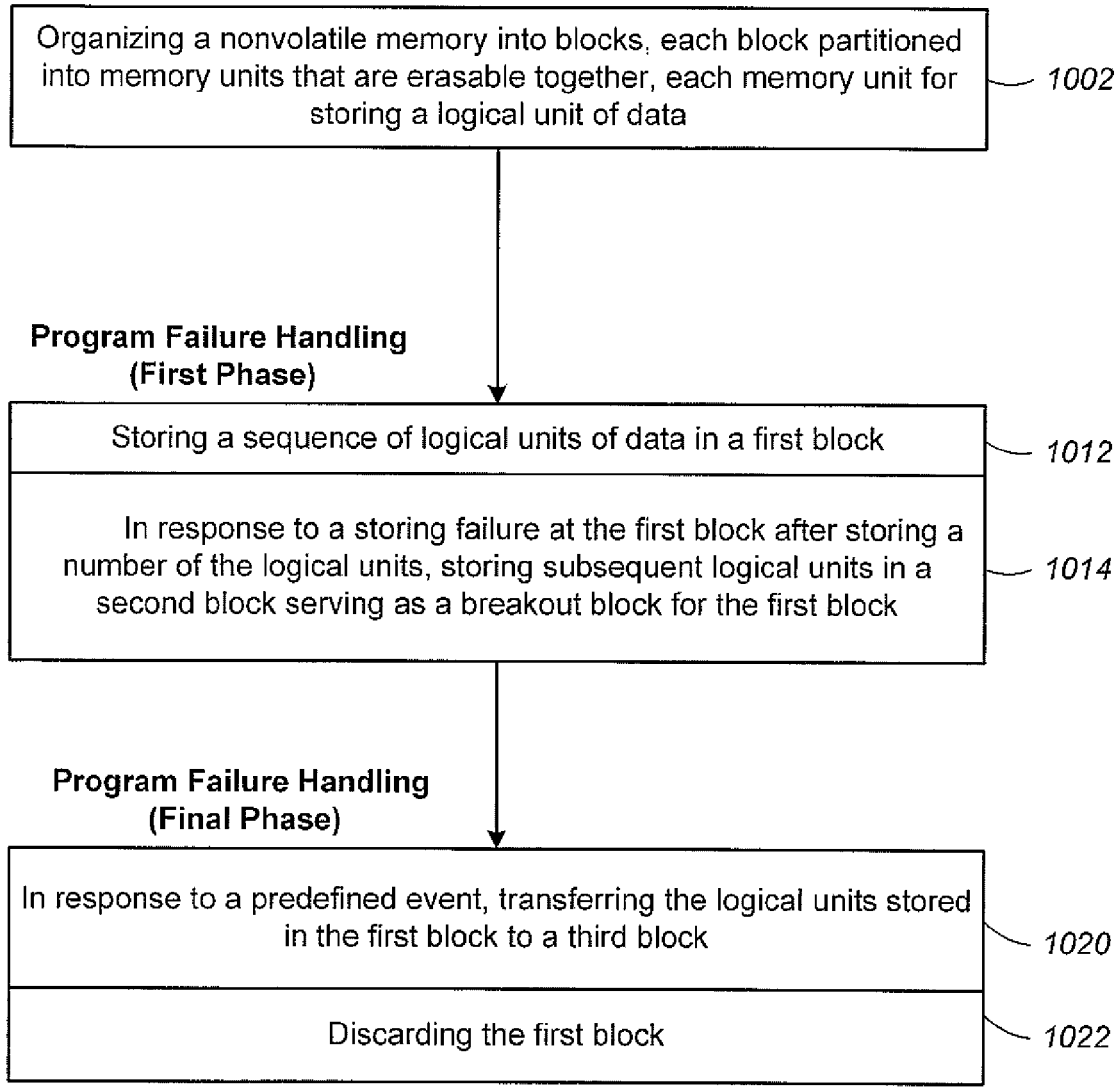
FIG. 30 illustrates a flow chart of the program failure handling according to a general scheme of the invention.

FIG. 30 illustrates a flow chart of the program failure handling according to a general scheme of the invention.

STEP 1002: Organizing a nonvolatile memory organized into blocks, each block partitioned into memory units that are erasable together, each memory unit for storing a logical unit of data.

Program Failure Handling (First Phase)

STEP 1012: Storing a sequence of logical units of data in a first block.

STEP 1014: In response to a storing failure at the first block after storing a number of logical units, storing subsequent logical units in a second block serving as a breakout block for the first block.

Program Failure Handling (Final Phase)

STEP 1020: In response to a predefined event, transferring the logical units stored in the first block to a third block, wherein the third block may or may not be identical to the second block.

STEP 1022: Discarding the first block.

Figure 31A:
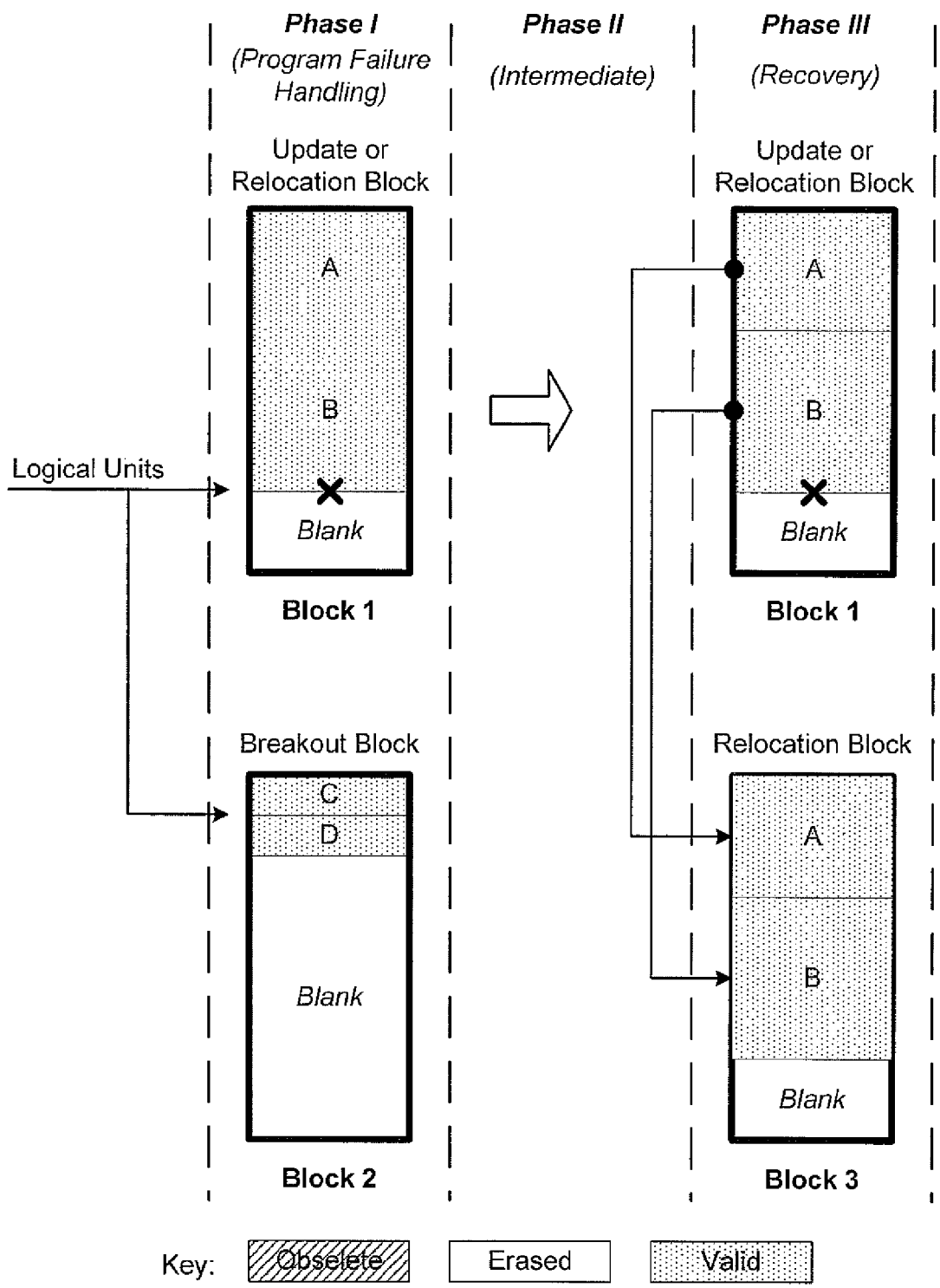
FIG. 31A illustrates one embodiment of program failure handling in which the third (final relocation) block is different from the second (breakout) block.

FIG. 31A illustrates one embodiment of program failure handling in which the third (final relocation) block is different from the second (breakout) block. During Phase I, a sequence of logical units is being recorded on a first block. If the logical units are from a host write, the first block may be regarded as an update block. If the logical units are from a consolidation of compaction operation, the first block may be regarded as a relocation block. If at some point, a program failure is encountered in block 1, a second block acting as a breakout block is provisioned. The logical unit that failed to be recorded in block 1 and any subsequent logical units are recorded on the breakout block instead. In this way, no additional time is required to replace the failed block 1 and the data residing on it.

In an intermediate Phase II, all the recorded logical units of the sequence are obtainable between block 1 and block 2.

In a final Phase III, the failed block 1 and the data residing on it are replaced by relocating the logical units to block 3, which serves as a relocation block. Thus, the data in the failed block is salvaged and the failed block can then be discarded. The final phase is timed so that it does not conflict with the timing of any contemporary memory operations.

In this embodiment the relocation block 3 is distinct from the breakout block 2. This is expedient when the breakout block has been recorded with additional logical units during the intermediate phase. Thus, the breakout block has turned into an update block and may not be suitable for relocating the logical units from the defective block 1 thereto.

Figure 31B:
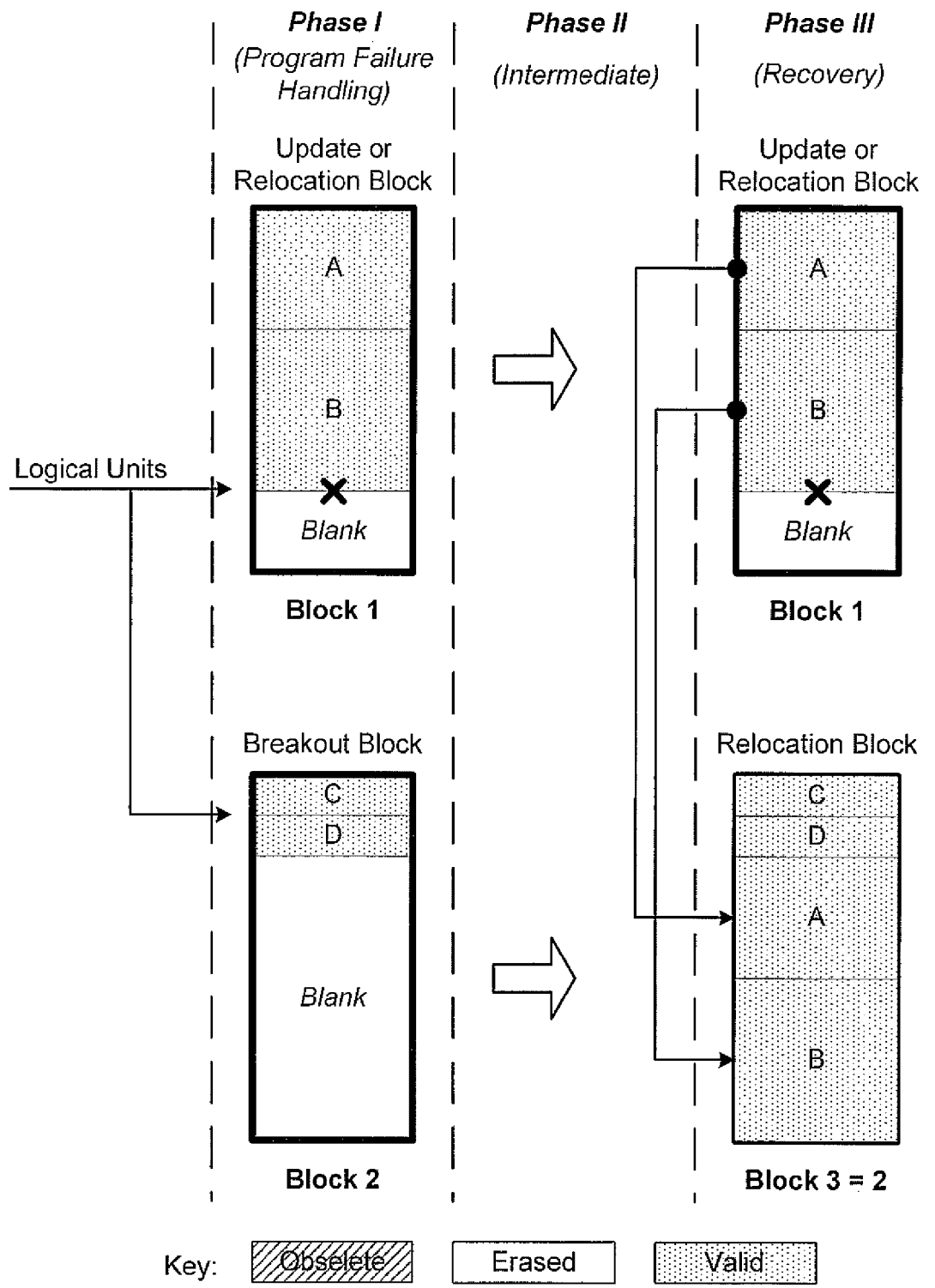
FIG. 31B illustrates another embodiment of program failure handling in which the third (final relocation) block is the same as the second (breakout) block.

FIG. 31B illustrates another embodiment of program failure handling in which the third (final relocation) block is the same as the second (breakout) block. Phases I and II are similar to the first embodiment shown in FIG. 31A. However, in Phase III, the logical units from the defective block 1 is relocated to the breakout block 2. This is expedient when the breakout block 2 has not been recorded with additional logical units other the original sequence of the previous write operation. In this way, a minimum of blocks is needed to store the logical units in question.

Embodiment for Program Failure Handling During Consolidation

The program failure handling is especially critical during a consolidation operation. A normal consolidation operation consolidates into a consolidation block the current versions of all logical units of a logical group residing among an original block and an update block. During the consolidation operation, if a program failure occurs in the consolidation block, another block acting as a breakout consolidation block will be provisioned to receive the consolidation of the remaining logical units. In this way, no logical units need be copied more than once and the operation with exception handling can still be completed within a period specified for a normal consolidation operation. At an opportune time, the consolidation operation can be completed by consolidating all outstanding logical units of the group into the breakout block. The opportune time will be during some other period outside the current host write operation when there is time to perform the consolidation. One such opportune time is during another host write where there is an update but no associated consolidation operation.

Essentially, the consolidation with the program failure handling can be regarded as being implemented in multiple phases. In a first phase, the logical units are being consolidated into more than one block after a program failure occurs in order to avoid consolidating each logical unit more than once. The final phase is completed at an opportune time, where the logical group is consolidated into one block, preferably by collecting all the logical units into the breakout consolidation block in sequential order.

Figure 32A:
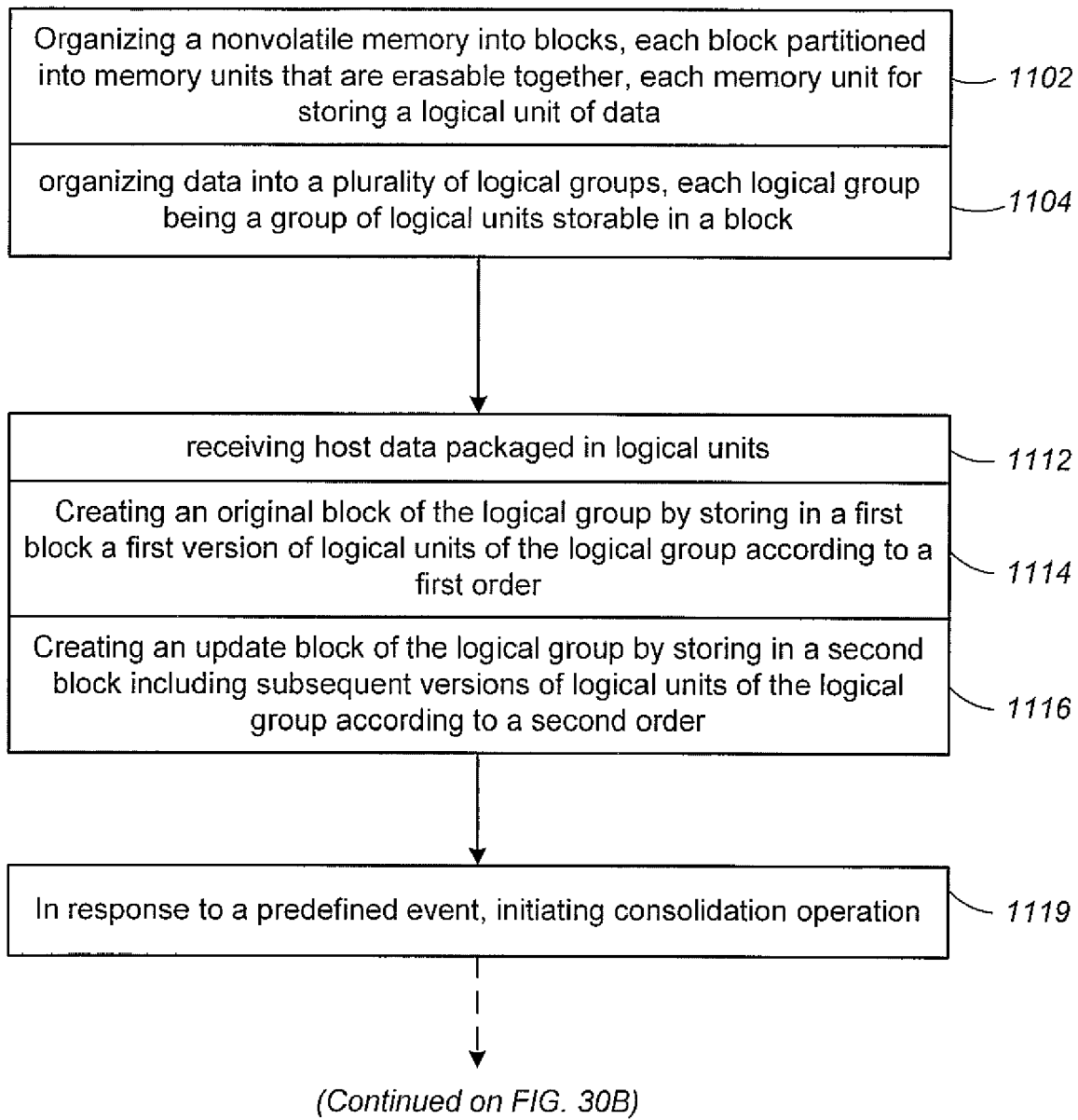
FIG. 32A illustrates a flow chart of initial update operation that results in a consolidation operation.

FIG. 32A illustrates a flow chart of initial update operation that results in a consolidation operation.

STEP 1102: Organizing a nonvolatile memory organized into blocks, each block partitioned into memory units that are erasable together, each memory unit for storing a logical unit of data.

STEP 1104: Organizing data into a plurality of logical groups, each logical group being a group of logical units storable in a block.

STEP 1112: Receiving host data packaged in logical units.

STEP 1114: Creating an original block of the logical group by storing in a first block a first version of logical units of the logical group according to a first order.

STEP 1116: Creating an update block of the logical group by storing in a second block including subsequent versions of logical units of the logical group according to a second order.

STEP 1119: At some predefined event as described in earlier sections, a garbage collection is performed to collect the current versions of the logical units among the various blocks and re-record into a new block.

Figure 32B:
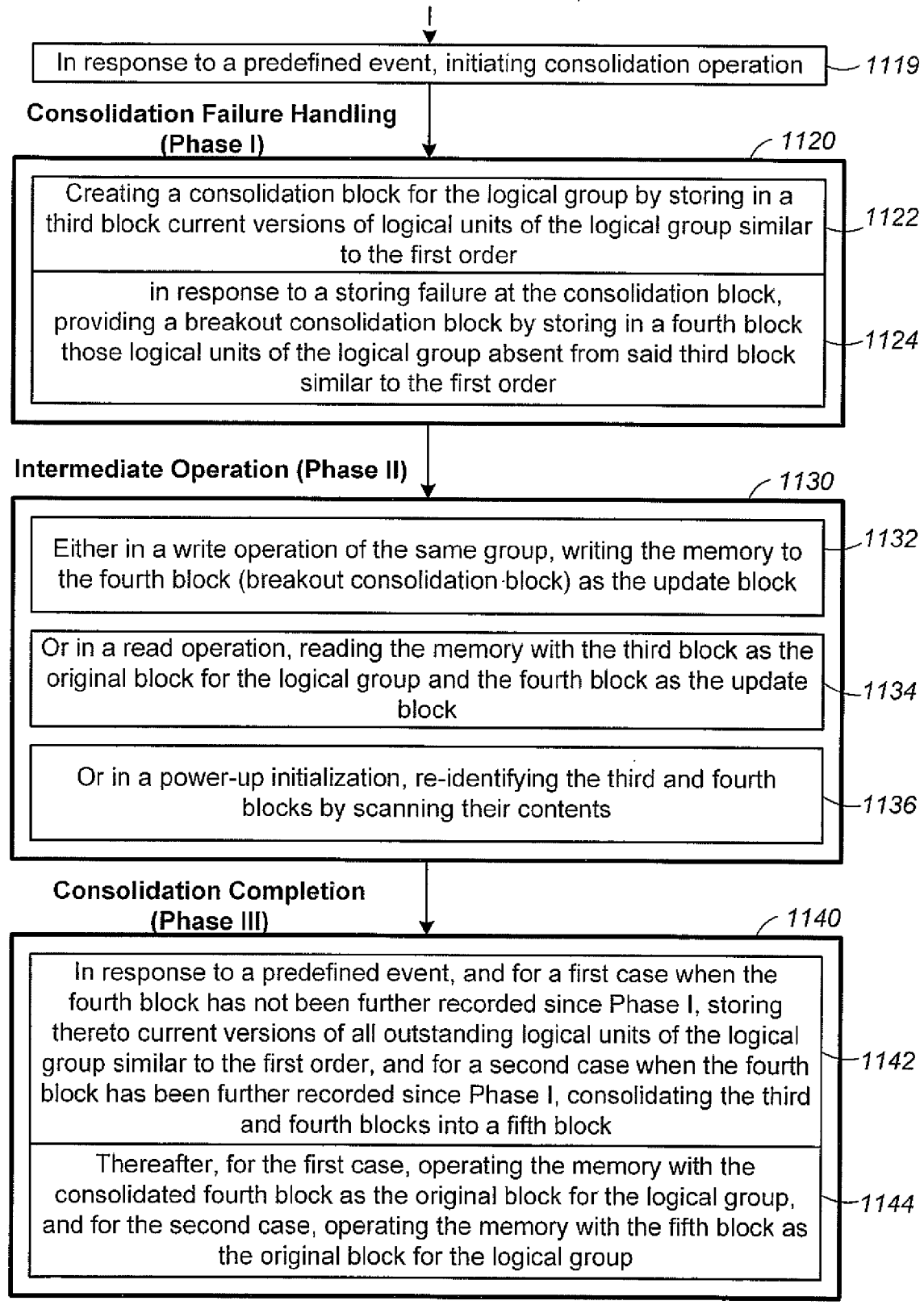
FIG. 32B illustrates a flow chart of the multiple phase consolidation operation, according to a preferred embodiment of the invention.

FIG. 32B illustrates a flow chart of the multiple phase consolidation operation, according to a preferred embodiment of the invention.

Consolidation Failure Handling (Phase I)

The consolidation with error handling, Phase I operation 1120 comprises of STEP 1122 and STEP 1124.

STEP 1122: Creating a consolidation block for the logical group by storing in a third block current versions of logical units of the logical group similar to the first order.

STEP 1124: In response to a storing failure at the consolidation block, providing a breakout consolidation block by storing in a fourth block similar to the first order those logical units of the logical group absent from said third block.

Since the data in Blocks 1 and 2 has been transferred to Blocks 3 and 4, Blocks 1 and 2 can be erased in order to free up space. In the preferred embodiment, Block 2 can be immediately released to the EBL (Erased Block List, see FIG. 18) and reused. Block 1 can only be released if this is a Closed Update block and there is another block the corresponding GAT entry points to.

Essentially, Block 3 becomes the original block for the logical group and Block 4 becomes a replacement sequential update block for Block 3.

After Phase I consolidation has completed, the memory device so signals the host by releasing the BUSY signal.

Intermediate Operation (Phase II)

Phase II, the intermediate operation 1130, may take place the before Phase III consolidation operation 1140. A number of possible scenarios are possible as given by any one of STEPs 1132, 1134 and 1136.

STEP 1132: Either in a write operation of the logical group, writing to the fourth block (breakout consolidation block) as the update block.

If the host writes to the logical group in question, Block 4, which is the breakout consolidation block and which has up to now assumed the role of a replacement sequential update block, will be used as a normal update block. Depending on the host writes, it may remain sequential or be turned into a chaotic state. As an update block it will at some point trigger closure of another chaotic block as described in an earlier preferred embodiment.

If the host writes to another logical group, proceed directly to Phase III operation.

STEP 1134: Or in a read operation, reading the memory with the third block as the original block for the logical group and the fourth block as the update block.

In this case, logical units from sections A and B will be read from Block 3 as the logical group's original block, and logical units from sections C and D will be read from Block 4 as the group's update block. As only sections A and B can be read from Block 3, there will be no access to the page where programming failed, and there will be no access to the unwritten portion thereafter. Although the GAT directory in flash memory has not yet been updated and still points to Block 1 as the original block, no data will be read from it, and the block itself has been erased earlier.

Another possibility is a host read of the logical units in the logical group. In this case, logical units from the sections A and B will be read from Block 3 as the logical group original block, and logical units from the sections C and D will be read from Block 4 as the group's sequential update block.

STEP 1136: Or in a power-up initialization, re-identifying any of the first to fourth blocks by scanning their contents.

Another possibility for the intermediate phase is for the memory device to be powered off and then re-started. As described earlier, during power-up initialization, the blocks in the Allocation Block List (erase pool's blocks to be used, see FIG. 15 and FIG. 18) are scanned to identify the defective consolidation block that has become a special status original block (Block 3) and the associated sequential update block (Block 4) for the logical group. The flag in the first logical unit of the breakout block (Block 4) will indicate that the associated block is an original block (Block 3) that has suffered a program error. By consulting the block directory (GAT), Block 3 can then be located.

In one embodiment, a flag is programmed into the first logical unit in the breakout consolidation block (Block 4). This helps to indicate the special status of the logical group: i.e., it has been consolidated into two blocks, i.e., Block 3 and Block 4.

An alternative to using a flag to identify the logical group with a defective block is to detect the block as defective during scanning by the property that it is not full as an original block should be (unless the error happened in the last page, and the last page does not have ECC error). Also, depending on implementation, there could be an information record about the failed group/block stored in a control data structure in flash memory, not just a flag in the header area of the first sector written to the breakout consolidation block (Block 4).

Consolidation Completion (Phase III)

STEP 1142: In response to a predefined event, and for a first case when the fourth block has not been further recorded since Phase I, storing thereto current versions of all outstanding logical units of the logical group similar to the first order, and for a second case when the fourth block has been further recorded since Phase I, consolidating the third and fourth blocks into a fifth block.

STEP 1144: Thereafter, for the first case, operating the memory with the consolidated fourth block as the original block for the logical group, and for the second case, operating the memory with the fifth block as the original block for the logical group.

The final consolidation in Phase III is executed whenever there is opportunity without violating any specified time limits. A preferred occasion is to "piggy-back" on the next host write slot when there is an update operation to another logical group with no accompanying consolidation operation. If the host write to another logical group triggers a garbage collection itself, then the Phase III consolidation will be deferred.

Figure 33:
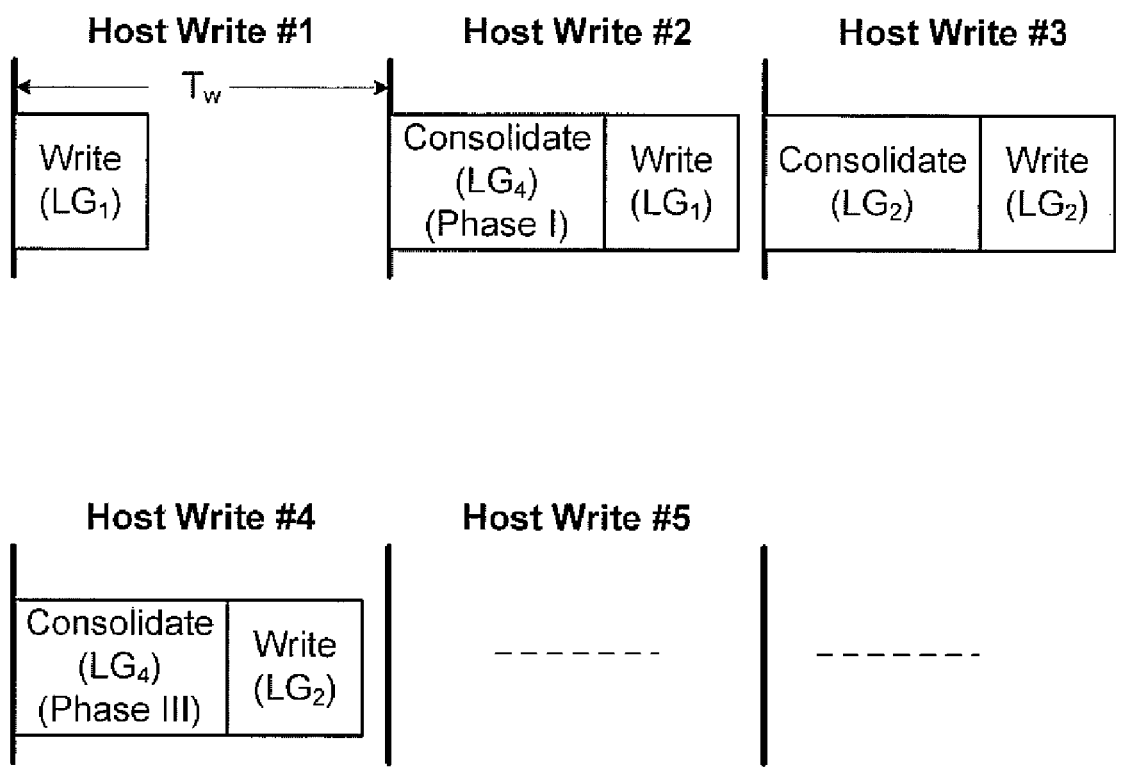
FIG. 33 illustrates an example timing of the first and final phases of the multiple phase consolidation operation.

FIG. 33 illustrates an example timing of the first and final phases of the multiple phase consolidation operation. The host write latency is the width of each host write time slot with a period $T_W$. Host Write 1 is a simple update, and the current versions of a first set of logical units in the logical group $LG_1$ are recorded on an associated update block.

In Host Write 2 another update on logical group $LG_1$ happens to result in the update block being closed (e.g., full). A new update block will be provisioned for recording the rest of the updates. The provisioning of a new update block may trigger a garbage collection that results in a consolidation operation on $LG_4$ in order to recycle a block for reuse. The current logical units of the $LG_4$ group are being recorded on a consolidation block in sequential order. The consolidation operation proceeds until a defect is encountered in the consolidation block. Phase I consolidation is then invoked where the consolidation operation continues on a breakout consolidation block. In the meantime, the final consolidation of $LG_4$ (Phase III) awaits the next opportunity.

In Host Write 3, a write of logical units of the logical group $LG_2$ also happens to trigger a consolidation for $LG_2$. This means the time slot is already fully utilized.

In Host Write 4, the operation is merely recording some logical units of $LG_2$ to its update block. The surplus time in the time slot provides the opportunity to execute the final consolidation of $LG_4$.

Figure 34A:
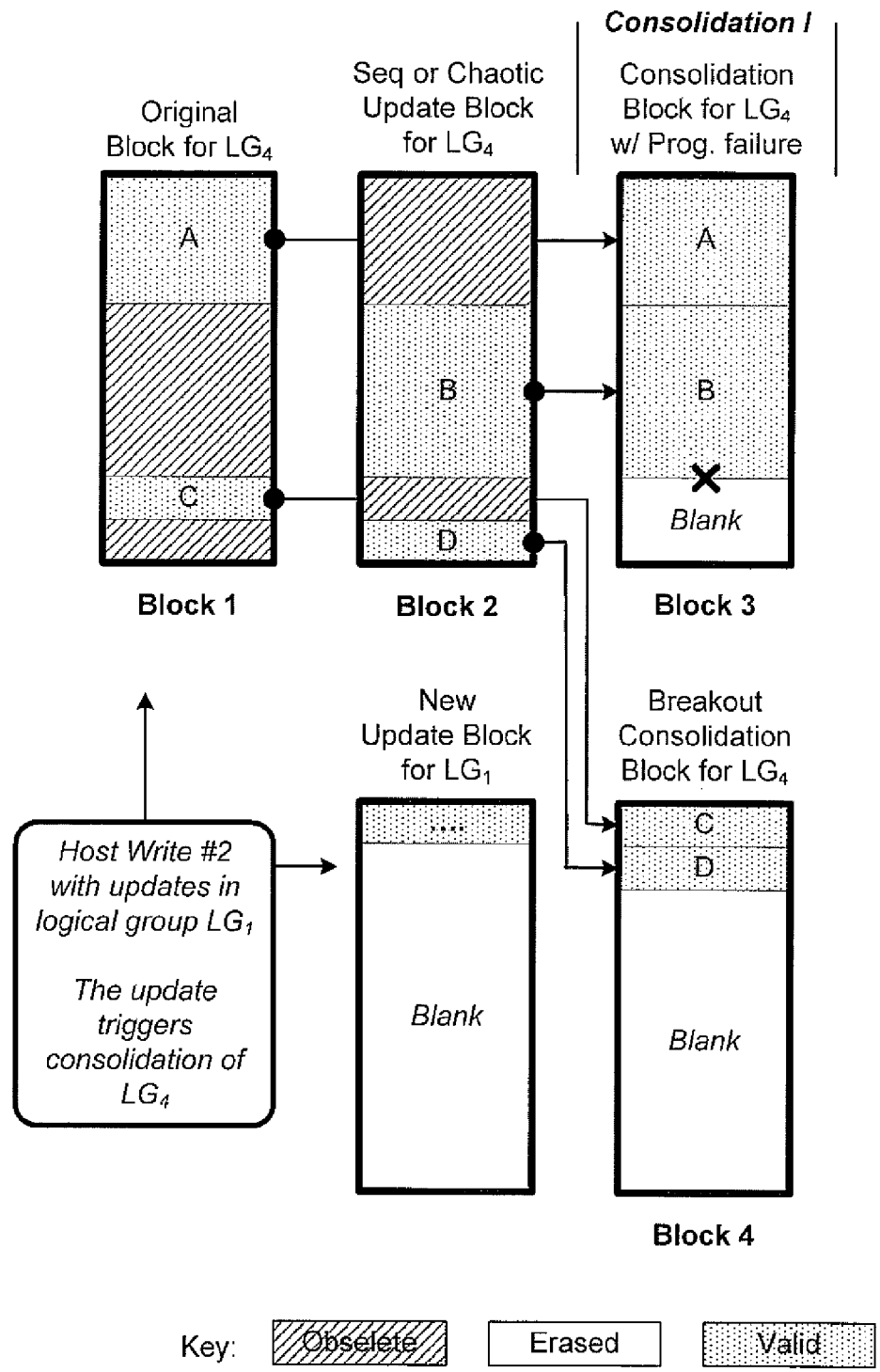
FIG. 34A illustrates the case where the breakout consolidation block is not used as an update block but more as a consolidation block whose consolidation operation has been interrupted.
Figure 34B:
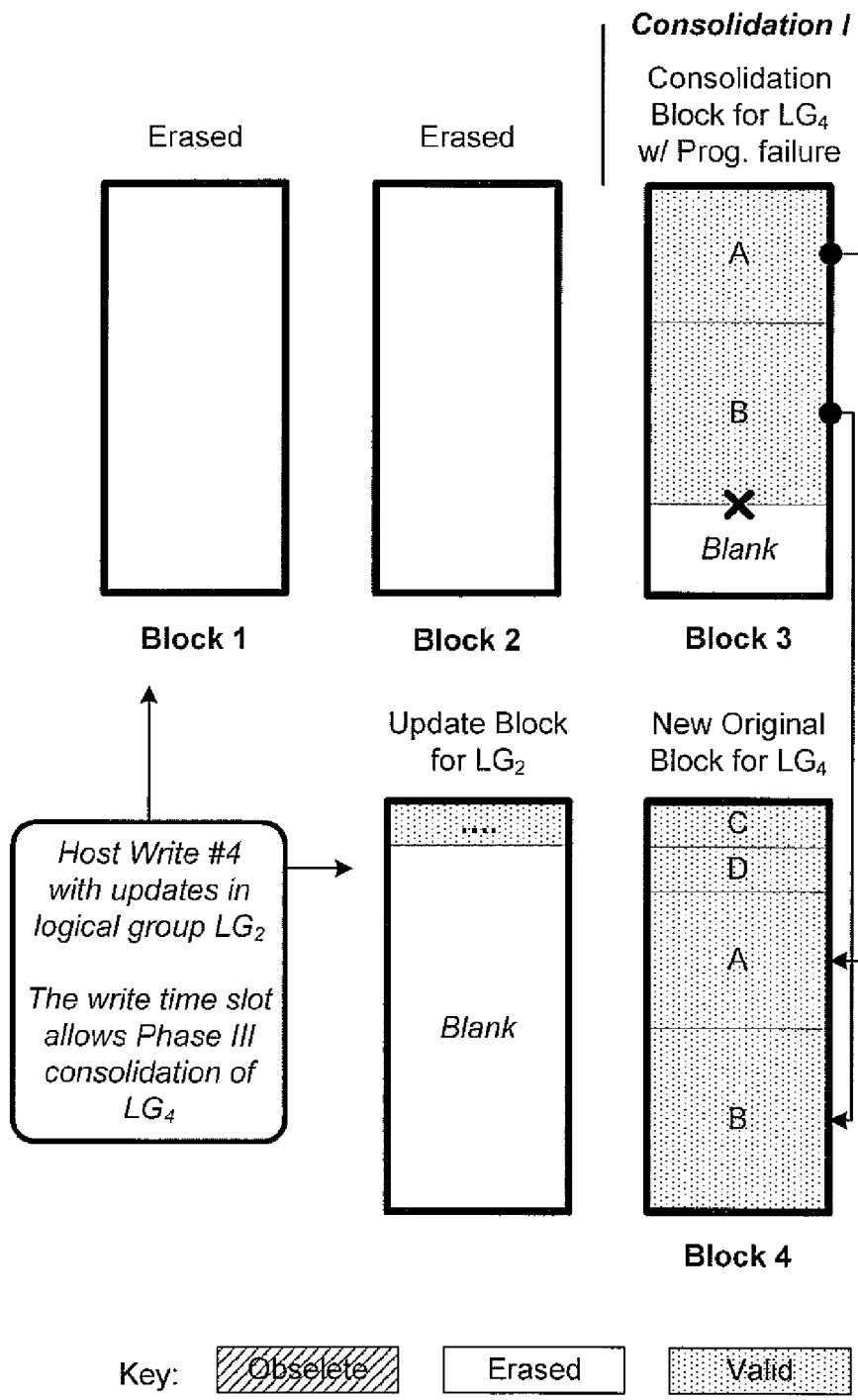
FIG. 34B illustrates the third and final phase of the multiple phase consolidation started in FIG. 34A.

Embodiment where the Breakout Consolidation Block is not Converted to an Update Block FIG. 34A and FIG. 34B illustrate respectively a first case for Phase I and Phase III operations of the multiple phase consolidation as applied to the examples in FIG. 28 and FIG. 31.

FIG. 34A illustrates the case where the breakout consolidation block is not used as an update block but more as a consolidation block whose consolidation operation has been interrupted. In particular, FIG. 34A refers to the Host Write #2 shown in FIG. 33 in which the host writes updates of logical units belonging to the logical group $LG_1$ and during which the operation also triggers a consolidation of blocks associated with another logical group $LG_4$.

The formation of the original block (Block 1) and the update block (Block 2) is in the same manner as the example in FIG. 28. Similarly during the consolidation operation, the consolidation block (Block 3) is found to have a defect at the point of consolidating the logical units in section C. However, unlike the re-consolidation scheme illustrated in FIG. 28, the present multiple phase scheme continues the consolidation operation onto a newly provisioned block (Block 4) that serves as a breakout consolidation block. Thus, in a Phase I consolidation operation, logical units in sections A and B have been consolidated in the consolidation block (Block 3). When a program failure occurs in the consolidation block, the remaining logical units in sections C and D are copied sequentially into the breakout consolidation block (Block 4).

If originally the host writes an update in a first logical group that triggers a consolidation operation of blocks associated with a second logical group, the updates of the first logical group are recorded into an update block (typically a new update block) for the first logical group. In this case, the breakout consolidation block (Block 4) is not used to record any update data outside the consolidation operation and remains a breakout consolidation block that has yet to be completed.

Since the data in Blocks 1 and 2 are now fully contained in the other blocks (Blocks 3 and 4), they can be erased for recycling. The address table (GAT) is updated to point to Block 3 as an original block for the logical group. The directory information (in the ACL, see FIG. 15 and FIG. 18) for the update block is also updated to point to Block 4, which has become the sequential update block for the logical group (e.g., $LG_4$).

The result is that the consolidated logical group is not localized in one block, but distributed over the defective consolidation block (Block 3) and the breakout consolidation block (Block 4). The important feature of this scheme is that logical units in the group are only consolidated once during this phase at the expense of spreading the consolidation over more than one block. In this way, the consolidation operation can be completed within the normal specified time.

FIG. 34B illustrates the third and final phase of the multiple phase consolidation started in FIG. 34A. As described in connection with FIG. 33, Phase III consolidation is executed at an opportune time after the first phase, such as during a subsequent host write that does not trigger an accompanying consolidation operation. In particular, FIG. 34B refers to the time slot in which Host Write #4 shown in FIG. 33 takes place. During that period the host write updates logical units belonging to the logical group $LG_2$ without triggering another additional consolidation operation. Thus, the surplus time in the time slot can expediently be utilized for Phase III operation for completion of the consolidation of logical group $LG_4$.

The operation consolidates all outstanding logical units of $LG_4$ not already in the breakout block into the breakout block. In the example, this means sections A and B will be copied from Block 3 to the breakout block (Block 4) in logically sequential order. In view of the wrap-around scheme of logical units in a block and the use of a page tag (see FIG. 3A), even though the example shows that in Block 4, sections A and B are being recorded after section C and D, the recorded sequence will considered to be equivalent to the sequential order of A, B, C, D. Depending on implementation, the current versions of the outstanding logical units to be copied are preferable obtained from Block 3, since it is already in consolidated form, but may also be collected from Block 1 and Block 2 if they have not been erased.

After the final consolidation has completed on the breakout block (Block 4), it will be designated as the original block for the logical group and the appropriate directory (e.g., GAT, see FIG. 17A) will be updated accordingly. Similarly, the failed physical block (Block 3) is marked as bad and mapped out. The other blocks, Block 1 and Block 2 are erased and recycled. In the meantime, the updates to $LG_2$ are recorded in the update block associated with $LG_2$.

Figure 35A:
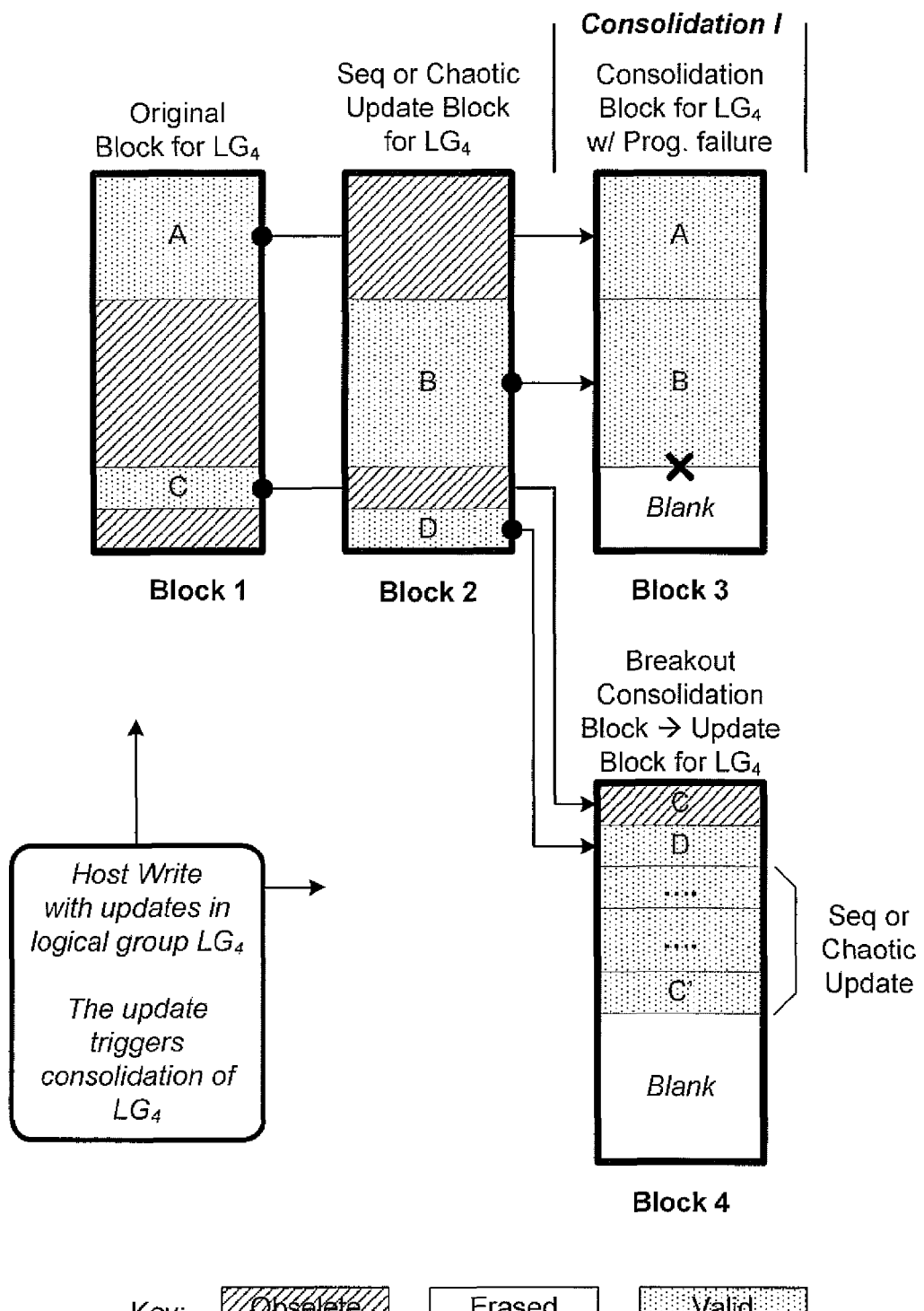
FIG. 35A illustrates the case where the breakout consolidation block is maintained as an update block to receive host writes rather than as a consolidation block.
Figure 35B:
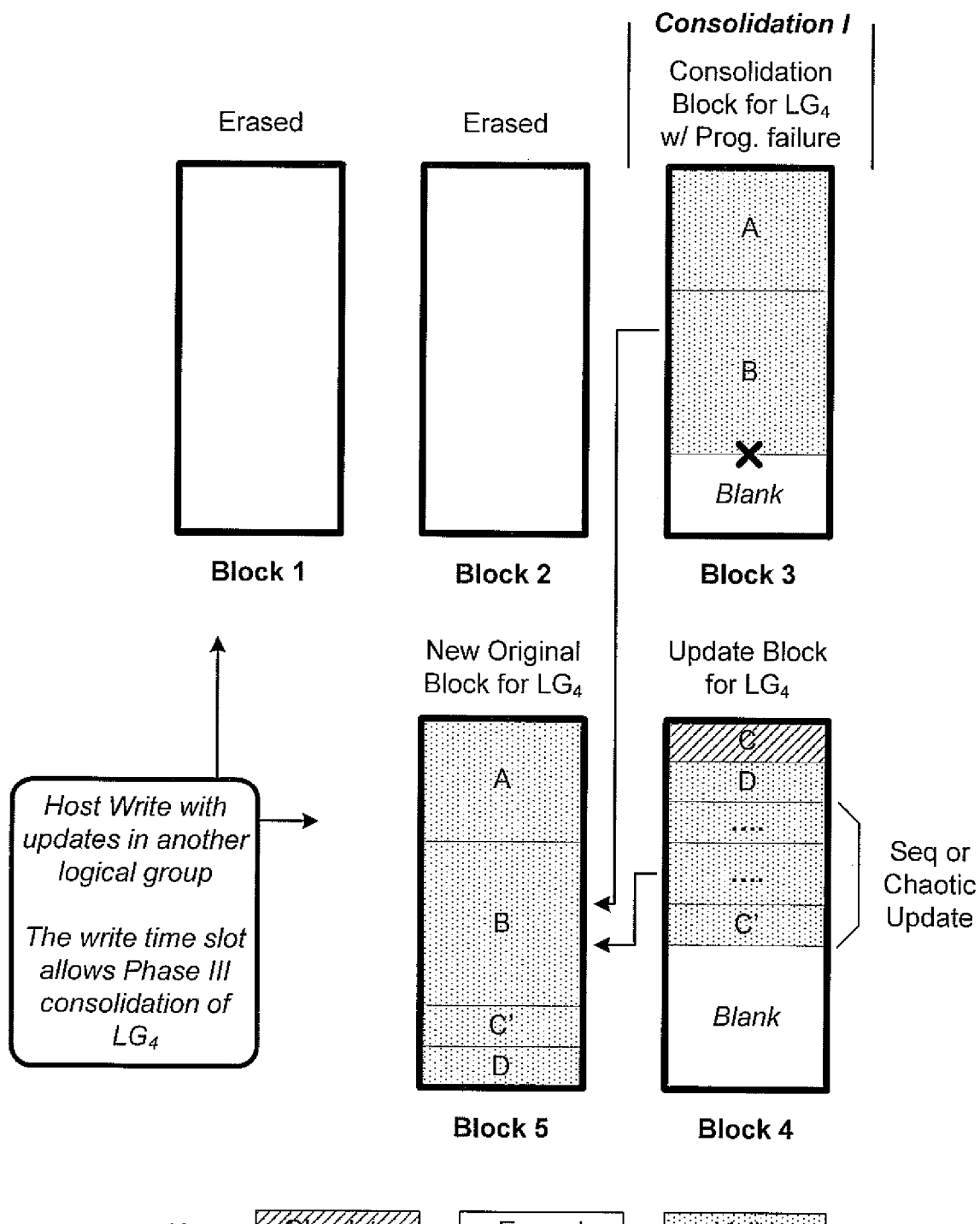
FIG. 35B illustrates the third and final phase of the multiple phase consolidation started in FIG. 35A for the second case.

Embodiment where the Breakout Consolidation Block is Turned into an Update Block FIG. 35A and FIG. 35B illustrate respectively a second case for Phase I and Phase III operations of the multiple phase consolidation as applied to the examples in FIG. 28 and FIG. 33.

FIG. 35A illustrates the case where the breakout consolidation block is maintained as an update block to receive host writes rather than as a consolidation block. This is applicable to a host write that for example updates the logical group $LG_4$, and in the process also triggers a consolidation in the same logical group.

As in the case for FIG. 34A, the consolidation of Block 1 and Block 2 onto Block 3 proceeds until it encounters a program failure while processing section C. The consolidation then continues on a breakout consolidation block (Block 4). After the outstanding logical units (e.g. in sections C and D) have been consolidated in the breakout block (Block 4), instead of waiting in Phase III to complete the consolidation of the logical group thereto, the breakout block is maintained as an update block. This case is particular applicable to a scenario where the host write updates a logical group and triggers a consolidation of the same logical group. In the example, this enables recording of the host updates for the logical group $LG_4$ to be recorded in the breakout consolidation block (Block 4) instead of recorded to a new update block. The update block (previously the breakout consolidation block (Block 4)) can be sequential or become chaotic depending on the host data recorded to it. In the example shown, Block 4 has turned chaotic since a subsequent newer version of logical units in section C renders the earlier ones in Block 4 obsolete.

During the intermediate phase, Block 3 will be regarded as the original block for $LG_4$, and Block 4 will be the associated update block.

FIG. 35B illustrates the third and final phase of the multiple phase consolidation started in FIG. 35A for the second case. As described in connection with FIG. 33, Phase III consolidation is executed at an opportune time after the first phase, such as during a subsequent host write that does not trigger an accompanying consolidation operation. During that period the host write updates logical units belonging to a logical group without triggering a consolidation operation. Thus, the surplus time in the time slot can expediently be utilized for Phase III operation for the completion of the consolidation of logical group $LG_4$.

The logical group $LG_4$ is then garbage collected from Blocks 3 and 4 to a new consolidation block (Block 5). Block 3 then gets marked as bad, Block 4 is recycled and the new consolidation block (Block 5) will become the new original block for the logical group $LG_4$. The other blocks, Block 1 and Block 2 are also erased and recycled.

Other Embodiments of Phased Program Failure Handling

The examples described in FIGS. 31A, 31B, 34A, 34B, 35A and 35B apply to a preferred block management system with each physical block (metablock) storing only logical units belonging to the same logical group. The invention is equally applicable to other block management systems where there is no logical group to physical block alignment, such as those disclosed in WO 03/027828 and WO 00/49488. Some examples of implementing the phased program failure handling method to these other system are illustrated in FIGS. 36A, 36B and 36C.

Figure 36A:
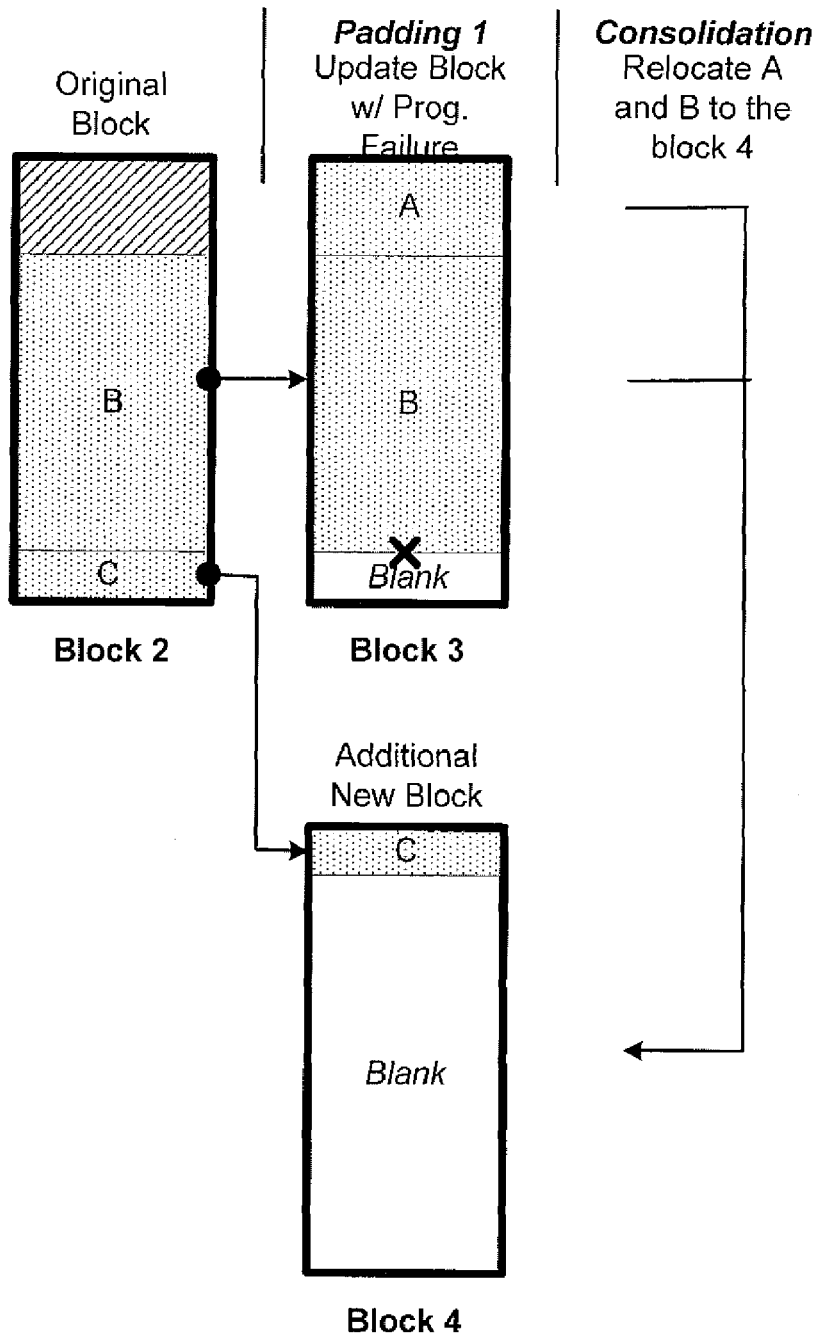
FIG. 36A illustrates the phased program error handling method as applied to the scenario when the host write triggers the closure of an update block, and the update block is sequential.

FIG. 36A illustrates the phased program error handling method as applied to the scenario when the host write triggers the closure of an update block, and the update block is sequential. The closure in this case is done by copying the remaining valid data (B and C) from the original Block 2 to the sequential update Block 3. In the case of program failure at the start of the data portion C programming, the portion C will be programmed to the reserved Block 4. The new host data can then be written to a new update Block 5 (not shown). The phases II and III of the method are the same as for the case of chaotic block closure.

Figure 36B:
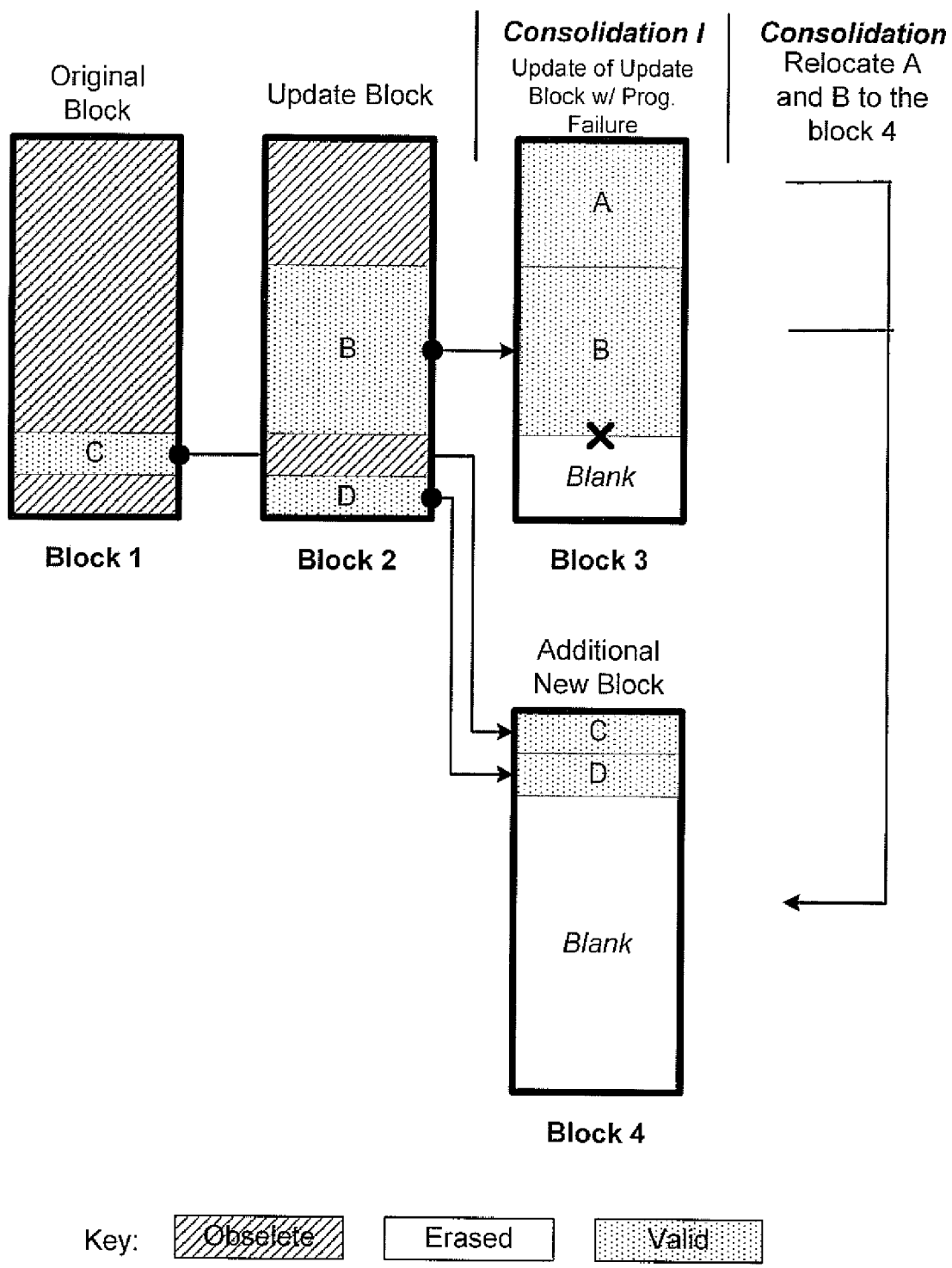
FIG. 36B illustrates the phased program error handling method as it can be applied to a (Partial Blocks system) in the case of an Update of Update blocks.

FIG. 36B illustrates the phased program error handling method as it can be applied to a (Partial Blocks system) in the case of an Update of Update blocks. In this case the logical group is stored in original Block 1, and other update blocks. Consolidation operation includes copying of the data to one of the update blocks (to be chosen according to some rule, Block 3 on the diagram) from the original Block 1 and the other update Block 2. The difference from the main scenario, which is already described, is that the Block 3 was already partially written.

Figure 36C:
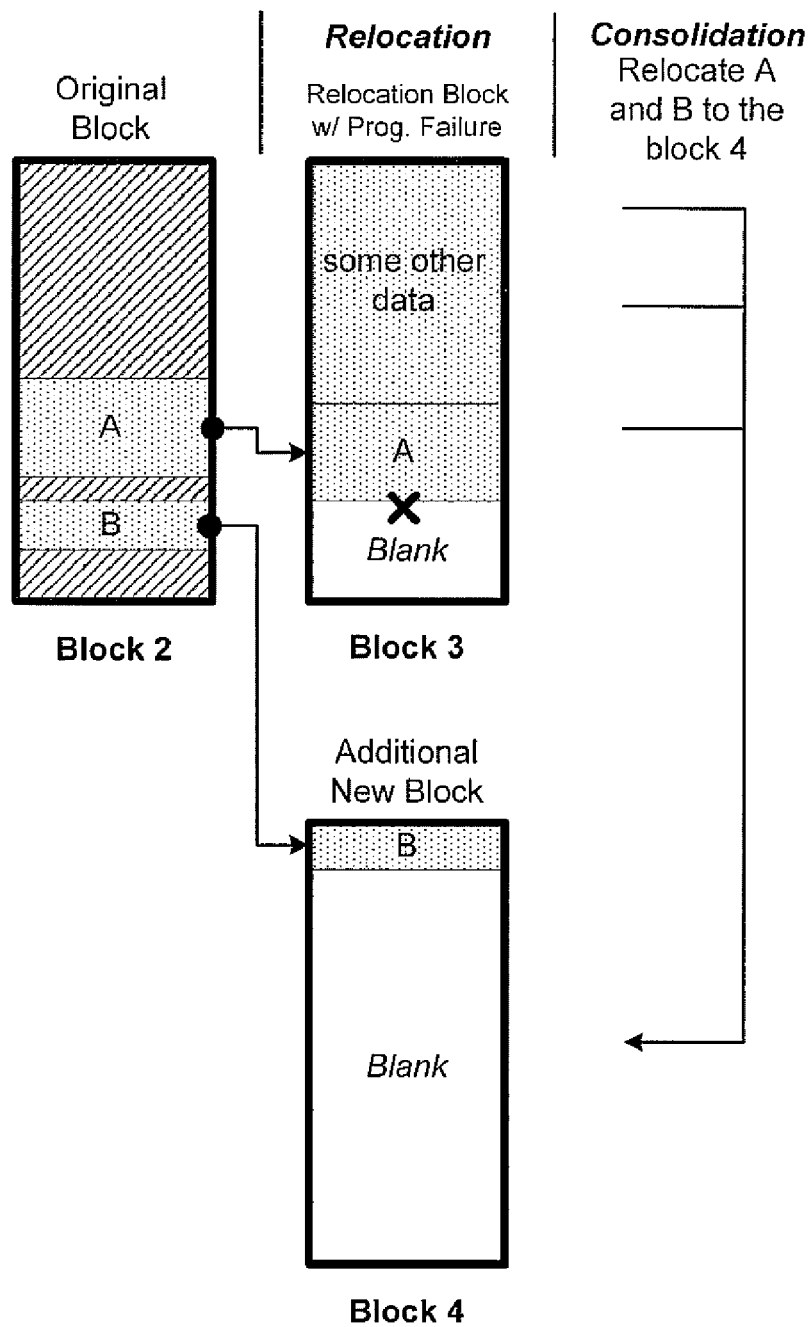
FIG. 36C illustrates the phased program error handling the garbage collection operation, or clean-up in a memory block management system that does not support a logical group mapped to a metablock.

FIG. 36C illustrates the phased program error handling the garbage collection operation, or clean-up in a memory block management system that does not support a logical group mapped to a metablock. Such a memory block management (Cyclic Storage) system is described in WO 03/027828 A1. The distinctive feature of the Cyclic Storage system is that blocks were not allocated for a single logical group. There is support of multiple logical grouping for control data in a metablock. The garbage collection involved taking the valid data sectors, which may have no relationship (random logical block addresses), from a partially obsolete block to the Relocation block, which can have some data there already. If the Relocation block gets full during the operation, another one would be opened.

Non-Sequential Update Block Indexing

In the earlier section on chaotic block indexing and in association with FIGS. 16A-16E, a CBI sector is used to store an index that keeps track of the locations of the logical sectors stored randomly in a chaotic or non-sequential update block.

According to another aspect of the invention, in a nonvolatile memory with block management system that supports update blocks with non-sequential logical units, an index of the logical units in an update block buffered in RAM is periodically stored in the non-volatile memory. In one embodiment, the index is stored in a block dedicated for storing indices. In another the index is stored in the update block. In yet another embodiment, the index is stored in the header of each logical unit. In another aspect, the logical units written after the last index update but before the next have their indexing information stored in the header of each logical unit. In this way, after a power interruption, the location of recently written logical units can be determined without have to perform a scanning during initialization. In yet another aspect, a block is managed as partially sequential and partially non-sequential, directed to more than one logical subgroup.

Index Pointer Stored in a CBI Sector in a CBI Block after a Predetermined Triggering Event According to the scheme described in association with FIGS. 16A-16E, lists of recently written sectors in chaotic blocks are held in controller RAM. A CBI sector containing the most current indexing information is written to flash memory (a CBI block 620) only after a predetermined number of writes in the logical group associated with a given chaotic block. In this way, the number of updates to the CBI block is reduced.

Before the next update of the CBI sector for a logical group, the list of recently written sectors for the logical group is held in controller RAM. The list is lost if the memory device suffers a power shut-down, but can be rebuilt by scanning the updated blocks on an initialization after a power turn-on.

Figure 37:
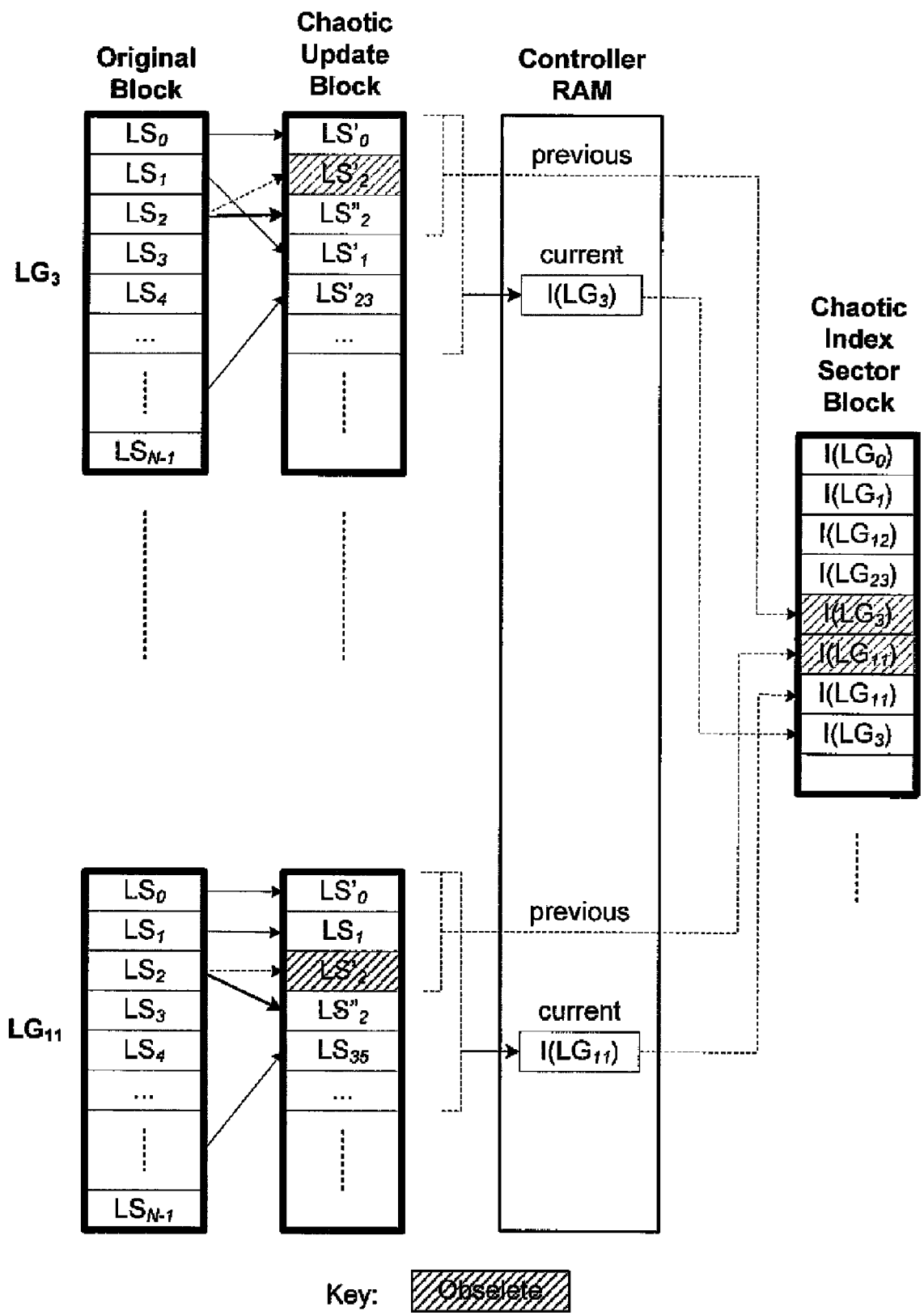
FIG. 37 illustrates an example of a schedule of writing of a CBI sector to an associated chaotic index sector block after every N sector writes of the same logical group.

FIG. 37 illustrates an example of a schedule of writing of a CBI sector to an associated chaotic index sector block after every N sector writes of the same logical group. The example shows two logical groups $LG_3$ and $LG_{11}$ undergoing concurrent updates. Initially, the logical sectors of $LG_3$ were stored in sequential order in an original block. Updates of the logical sectors in the group are recorded on an associated update block in the order dictated by a host. The example shows a chaotic update sequence. Concurrently, the logical group $LG_1$ is also being updated in similar manner at its update block. After every logical sector write, its position in the update block is kept in controller RAM. After every predetermined triggering events, the current index of the logical sectors in the update block is written in the form of a chaotic index sector to the non-volatile chaotic index sector block. For example, the predetermined triggering events occur after every N writes, where N may be 3.

Although the examples given have been with the logical unit of data being a sector, those skilled in the art will recognize that the logical unit could be some other aggregate, such as a page containing a sector or a group of sectors. Also, the first page in a sequential block does not need to be logical page 0, since a page tag wrap around could be in place.

Index Pointer Stored in a CBI Sector in Chaotic Update Block after a Predetermined Triggering Event In another embodiment, the index pointer is stored in a dedicated CBI sector in the chaotic update block itself after every N writes thereto. This scheme is similar to the embodiment described earlier where the index is also stored in a CBI sector. The difference is in that earlier embodiment, the CBI sector is recorded in a CBI sector block and not in the update block itself.

The method is based on keeping all the chaotic block indexing information in the Chaotic Update block itself. FIGS. 37A, 37B and 37C respectively illustrate the state of an update block also storing CBI sectors at three different stages.

FIG. 38A illustrates an update block up to the point when a CBI sector is recorded in it after a predetermined number of writes. In this example, after the host has written logical sectors 0-3 sequentially, it then issues a command to write another version of logical sector 1 again, thus breaking the contiguous sequence of data writes. The update block is then converted to a chaotic update block with the implementation of a chaotic block indexing carried in a CBI sector. As described before, the CBI is an index that contains indices for all logical sectors of the chaotic block. For example, the $0^{th}$ entry indicates the offset in the update block for the $0^{th}$ logical sector and similarly, the nth entry indicates the offset for the nth logical sector. The CBI sector is written to the next available location in the update block. To avoid frequent flash access, the CBI sector is written after every N data sector writes. In this example, N is 4. If the power is lost at this point, the last written sector will be the CBI sector and the block will be regarded as a chaotic update block.

FIG. 38B illustrates the update block of FIG. 38A to have logical sectors 1, 2 and 4 further recorded to it after the index sector. The newer versions of logical sectors 1 and 2 supersede the older versions previous recorded in the update block. In the case of power cycle at this point, the last written sector needs to be found first, and then up to N sectors need to be scanned in order to find the last written index sector and the recently written data sectors.

FIG. 38C illustrates the update block of FIG. 38B having another logical sector written to trigger the next recording of an index sector. The same update block after another N (N=4) sector writes records another current version of the CBI sector.

The advantage of this scheme is that it eliminates the need for a separate CBI block. At the same time it does not have to worry about whether the overhead data area of a physical flash sector is large enough to accommodate the number of entries required for an index to valid sectors in the chaotic update block. The chaotic update block then contains all the information and no external data is needed for address translation. This results in a simpler algorithm with reduced number of control updates related to CBI block compaction and shorter cascade control update. (See earlier sections on CBI block management.)

Information about Recently Written Sectors Stored in Data Sector Header in Chaotic Update Block According to another aspect of the invention, an index of logical units recorded in a block is stored in nonvolatile memory after every N writes, and current information about the logical units of the intermediate writes is stored in an overhead portion of each logical unit written. In this way, after a power restart, information about the logical units written since last index update can be obtained quickly from the overhead portion of the last written logical unit in the block, without having to scan the block.

Figure 39A:
FIG. 39A illustrates an intermediate index for the intermediate writes being stored in a header of each data sector in the chaotic update block
Figure 39B:
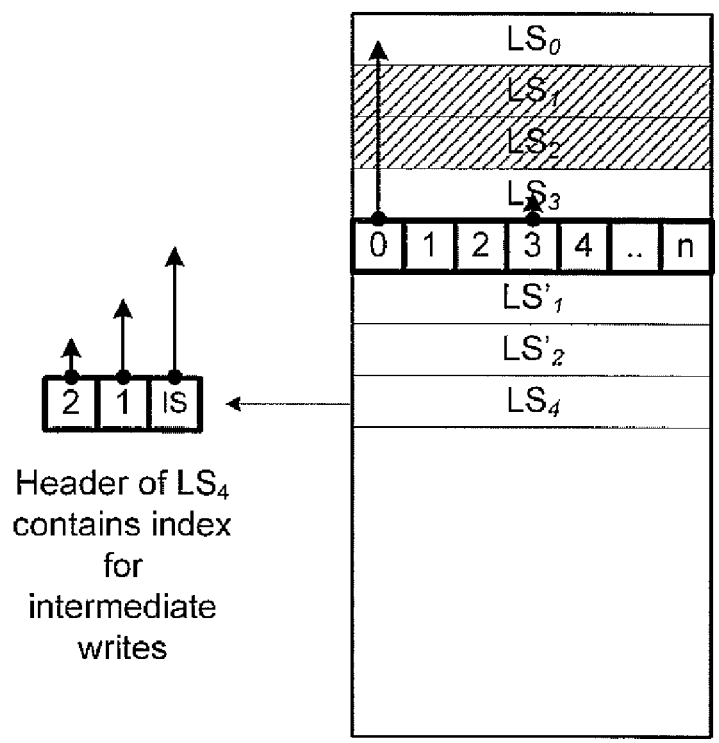
FIG. 39B illustrates an example of storing an intermediate index for the intermediate writes in the header of each sector written.

FIG. 39A illustrates an intermediate index for the intermediate writes being stored in a header of each data sector in the chaotic update block FIG. 39B illustrates an example of storing an intermediate index for the intermediate writes in the header of each sector written. In the example, after four sectors, $LS_0$-$LS_3$ have been written, a CBI index is written as the next sector in the block. Thereafter, logical sectors $LS'_1$, $LS'_2$ and $LS_4$ are written to the block. Each time, the header will store an intermediate index for the logical units written since the last CBI index. Thus, the header in $LS'_2$ will have an index giving the offset (i.e., location) of the last CBI index as well as that of $LS'_1$. Similarly, the header in $LS_4$ will have an index giving the offset of the last CBI index as well as that of $LS'_1$ and $LS'_2$.

The last written data sector always contains information about up to N last written pages (i.e., up to the last written CBI sector). Whenever, there was a power restart, the last CBI index provides indexing information for logical units written prior to the CBI index sector, and indexing information for subsequent logical units written is found in the header of the last written data sector. This has the advantage of eliminating, on initialization, the need to scan the block for those subsequently written sectors to determine their locations.

The scheme of storing intermediate index information in the header of the data sector is equally applicable whether the CBI index sector is stored in the update block itself or in a separate CBI sector block as described in an earlier section.

Index Pointer Stored in Data Sector Header in Chaotic Update Block

In another embodiment, the entire CBI index is stored in the overhead portion of each data sector in a chaotic update block.

FIG. 40 illustrates the information in the chaotic index field being stored in a header of each data sector in the chaotic update block.

The information capacity of a sector header is limited, and so the range of indices provided by any single sector may be designed to be part of a hierarchical indexing scheme. For example, sectors within a specific plane of the memory may provide indexing to only sectors within that plane. Also, the range of logical addresses may be divided into a number of sub-ranges, to allow an indirect indexing scheme to be adopted. For example, if sectors with 64 logical addresses may be stored in a plane, each sector may have 3 fields for sector offset values, each field able to store 4 offset values. The first field defines the physical offset for the last written sector within the logical offset ranges 0-15, 15-31, 32-47, and 48-63. The second field defines physical offset values for 4 sub-ranges of 4 sectors each, within the range to which it relates. The third field defines physical offset values for 4 sectors within the sub-range to which it relates. The physical offset of a logical sector within the chaotic update block may therefore be determined by reading indirect offset values from up to 3 sectors.

The advantage of this scheme is that it also eliminates the need for a separate CBI block or a CBI sector. However, it may only be applied if the overhead data area of a physical flash sector is large enough to accommodate the number of entries required for an index to valid sectors in the chaotic update block.

Limited Logical Range Within Logical Group for Chaotic Update Block

Within a logical group, the logical range of sectors which can be written non-sequentially is reduced. The main advantage of this technique that the sectors outside the range stay written sequentially in the original block and garbage collection operation can be done in much shorter time, as copying of sequentially written data can be done faster as only one multi-sector page (could be parallel read of pages in multi-chip case) need be read to get all the data for the destination page (provided the source and the destination are aligned, if not, then another read may be required). Also, sequential data can be copied from source to destination without data transfers to and from the controller, using on-chip copy feature. If the source data is scattered, as happens in chaotic blocks, up to one page read per sector may be required in order to collect all the sectors to be written to destination.

In one embodiment, instead of literally limiting the logical range to some number of sectors, it is being done via limiting the number of CBIs (it makes sense to limit chaotic range only for large groups/metablocks, which require multiple Chaotic Block Indices to cover the entire logical group's range). For example, if a metablock/group has 2048 sectors, then in may require up to 8 CBI sectors, each covering a contiguous logical range of one sub-group of 256 sectors. If the number of CBIs is limited to 4, then the Chaotic metablock can be used for writing sectors of up to 4 sub-groups (any of them). Thus, the logical group is allowed to have up to 4 partially or fully chaotic sub-groups, and a minimum of 4 sub-groups will remain fully sequential. If a Chaotic block has 4 valid CBI sectors, associated with it, and a host writes a sector outside the ranges of these CBI sectors (chaotic sub-groups), then the Chaotic Logical group should be consolidated and closed. But, this is very unlikely to happen, as in real applications, the hosts do not need more than 4 chaotic ranges of 256 sectors (sub-groups) within a range of 2048 sectors (logical group). As a result, in normal case garbage collection time is also unaffected, but the limiting rule guards form an extreme case of too long garbage collection which may trigger host's time out.

Indexing of Partially Sequential Chaotic Update Block

When a sequential update block has been partially written before the block is converted to chaotic management mode, all or part of the sequentially updated section of the logical group may continued to be treated as having been sequentially updated, and the chaotic update management may be applied to only a subset of the address range of the logical group.

Control Data Integrity & Management

Data stored in memory device may become corrupted due to power interruption or a certain memory location becoming defective. If a defect in the memory block is encountered, the data is relocated to a different block and the defective block is discarded. If the error is not extensive, it can be corrected on-the-fly by an error correction code (ECC) that is saved with the data. However, there are times when the ECC is unable to correct the corrupted data. For example, when the number of error bits exceed the capacity of the ECC. This is unacceptable for critical data such as the control data associated with the memory block management system.

Example of control data are the directory information and block allocation information associated with the memory block management system, such as those described in connection with FIG. 20. As described earlier, the control data is maintained in both high speed RAM and the slower nonvolatile memory blocks. Any frequently changing control data is maintained in RAM with periodic control writes to update equivalent information stored in a nonvolatile metablock. In this way, the control data is stored in nonvolatile, but slower flash memory without the need for frequent access. A hierarchy of control data structures such as GAT, CBI, MAP, and MAPA shown in FIG. 20 is maintained in flash memory. Thus, a control write operation causes information from control data structures in RAM to update equivalent control data structures in flash memory.

Critical Data Duplication

According to another aspect of the invention, critical data such as some or all of the control data is guaranteed an extra level of reliability if it is maintained in duplicates. The duplication is performed in a manner that for multi-state memory system employing a two-pass programming technique for successively programming the multi-bits of the same set of memory cells, any programming error in the second pass will not corrupt the data established by the first pass. The duplication also helps with detection of write aborts, detection of misdetection (i.e., both copies have good ECC but data are different), and adds an extra level of reliability. Several techniques of data duplication are contemplated.

In one embodiment, after two copies of a given data have been programmed in an earlier programming pass, a subsequent programming pass avoids programming the memory cells storing at least one of the two copies. In this way, at least one of the two copies will be unaffected in the event the subsequent programming pass aborts before completion and corrupts the data of the earlier pass.

In another embodiment, the two copies of a given data are stored in two different blocks where at most one of the two copies have its memory cells programmed in a subsequent programming pass.

In yet another embodiment, after two copies of a given data have been stored in a programming pass, no further programming will be preformed on the set of memory cells storing the two copies. This is accomplished by programming the two copies in an ultimate programming pass for the set of memory cells.

In yet another embodiment, the two copies of a given data is programmed into a multi-state memory in a binary programming mode, so that no further programming on the programmed memory cells will take place.

In yet another embodiment, for multi-state memory system employing a two-pass programming technique for successively programming the multi-bits of the same set of memory cells, a fault-tolerant code is employ to code the multiple memory states such that data established by an earlier programming pass is insensitive to errors in subsequent programming pass.

A complication of data duplication arises in multi-state memory in which each memory cell stores more than one bit of data. For example, a 4-state memory can be represented by two bits. One existing technique is to use a 2-pass programming to program such memory. A first bit (lower page bit) is programmed by a first pass. Subsequently, the same cell is programmed in a second pass to represent a desired second bit (upper page bit). In order not to change the value of the first bit in the second pass, the memory state representation of the first bit is made to depend on the value of the second bit. Therefore, during the programming of the second bit, if an error occurs during to power interruptions or other causes and results in an incorrect memory state, the value of the first bit could also be corrupted.

Figure 41A:
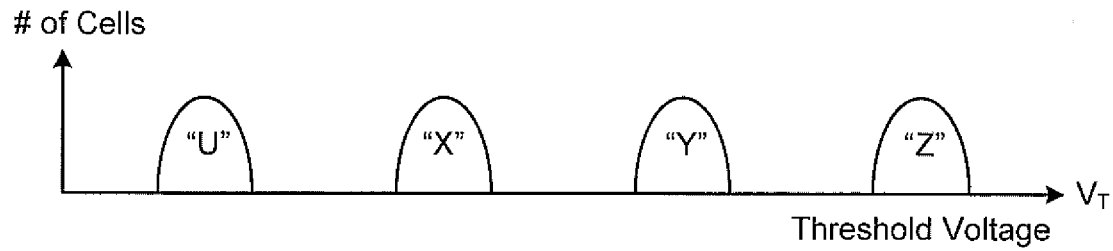
FIG. 41A illustrates threshold voltage distributions of a 4-state memory array when each memory cell stores two bits of data.

FIG. 41A illustrates threshold voltage distributions of a 4-state memory array when each memory cell stores two bits of data. The four distributions represent the population of the four memory states, "U", "X", "Y" and "Z". Before a memory cell is programmed it is first erased into its "U" or "unwritten" state. The memory states "X", "Y" and "Z" are progressively reached as the memory cell get increasingly programmed.

Figure 41B:
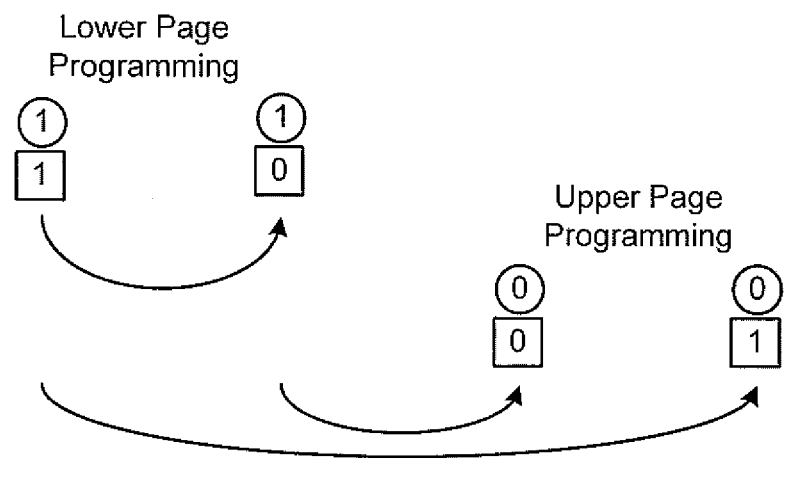
FIG. 41B illustrates an existing, 2-pass programming scheme using a Gray code.

FIG. 41B illustrates an existing, 2-pass programming scheme using a Gray code. The four states can be represented by two bits, a lower page bit and an upper page bit, such as (Upper page bit, Lower page bit). For a page of cells to be programmed in parallel, there are really two logical pages: a logical lower page and a logical upper page. A first programming pass only programs the logical lower page. By appropriate coding, a subsequent, second programming pass on the same page of cells will program the logical upper page without resetting the logical lower page. A commonly used code is the Gray code where only one bit changes when transiting to an adjacent state. Therefore, this code has the advantage of placing less demand on error correction since only one bit is involved.

A general scheme in using the Gray code is to let "1" represent a "not program" condition. Thus, the erased memory state "U" is represented by (Upper page bit, Lower page bit)=(1, 1). In a first pass to program the logical lower page, any cell to store the data "0" will therefore have its logical state transit from (x, 1) to (x, 0), where "x" represent the "don't care" value of the upper bit. However, since the upper bit has not been programmed yet, "x" may as well be labeled by "1" for consistency. The (1, 0) logical state is represented by programming the cell to the memory state "X". That is, prior to a second program pass, the lower bit value of "0" is represented by the memory state "X".

A second pass programming is performed to store the bits of the logical upper page. Only those cells needing an upper page bit value of "0" will be programmed. After the first pass, the cells in the page are either in the logical state (1, 1) or (1, 0). In order to preserve the values of the lower page in the second pass, the lower bit value of "0" or "1" need be distinguished. For the transition from (1, 0) to (0, 0) the memory cell in question is programmed to the memory state "Y". For the transition from (1, 1) to (0, 1) the memory cell in question is programmed to the memory state "Z". In this way, during read, by determining the memory state programmed in a cell, both the lower page bit and the upper page bit can be decoded.

However, the Gray-code, 2-pass programming scheme can become a problem when the second-pass programming is erroneous. For example, the programming of the upper page bit to "0" while the lower bit is at "1" will cause the transition from (1, 1) to (0, 1). This requires the memory cell to be progressively programmed from "U" through "X" and "Y" to "Z". If there is a power outage before the completion of the programming, the memory cell may end up in one of the transition memory state, say "X". When the memory cell is read, "X" will be decoded as the logical state (1, 0). This gives incorrect results for both the upper and lower bits, since it should have been (0, 1). Similarly, if the programming is interrupted when "Y" is reached, it would correspond to (0, 0). While the upper bit is now correct, the lower bit is still wrong.

Thus, it can be seen that a problem in the upper page programming can corrupt data already in the lower page. In particular when a second pass programming involves passing over an intermediate memory state, a program abort could have the programming ending up in that memory state, resulting in an incorrect lower page bit being decoded.

Figures 42, 43:
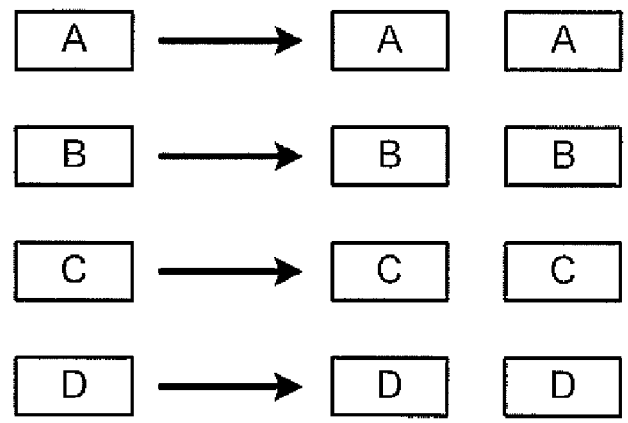
FIG. 42 illustrates a way of safe guarding critical data by saving each sector in duplicates. For example, the sectors A, B, C, and D are saved in duplicate copies. If there is corruption of the data in one sector copy, then the other one can be read instead.
FIG. 43 illustrates the non-robustness in which duplicate sectors are typically saved in a multi-state memory.

FIG. 42 illustrates a way of safe guarding critical data by saving each sector in duplicates. For example, the sectors A, B, C, and D are saved in duplicate copies. If there is corruption of the data in one sector copy, then the other one can be read instead.

FIG. 43 illustrates the non-robustness in which duplicate sectors are typically saved in a multi-state memory. As described earlier, in an example 4-state memory, the multi-state page actually includes a logical lower page and a logical upper page that are respectively programmed in two passes. In the example shown, the page is four sector wide. Thus, sector A and its duplicate will be concurrently programmed in the logical lower page and similarly for sector B and its duplicate. Then in a subsequent second pass of programming in the logical upper page, the sectors C, C will be concurrently programmed and likewise for the sectors D, D. If a program abort occurs in the middle of the programming of sectors C, C, the sectors A, A, in the lower page will be corrupted. Unless, the lower page sectors are first read and buffered prior to the upper page programming, they may be unrecoverable if corrupted. Thus, saving two copies of critical data concurrently such as sectors A, A can not prevent both of them being corrupted by a subsequent problematic saving of sectors C, C in its upper page.

Figure 44A:
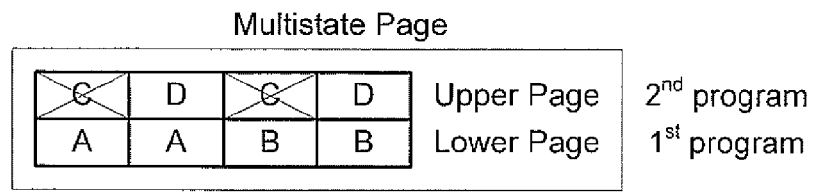
FIG. 44A illustrates one embodiment of saving staggered duplicate copies of critical data to a multi-state memory.

FIG. 44A illustrates one embodiment of saving staggered duplicate copies of critical data to a multi-state memory. Basically the lower page is saved in the same manner as in FIG. 43, namely, sectors A, A and sectors B, B. However, in the upper page programming, the sectors C and D are interleaved with their duplicates as C, D, C, D. If partial page programming is supported, the two copies of sector C can be programmed concurrently and likewise for the two copies of sector D. If the program of say, the two sectors C gets aborted, it can corrupt the lower page only in terms of one copy of sector A and one copy of sector B. The other copies remain unaffected. Thus, if there are two copies of critical data stored in a first pass, they should not be subject to a subsequent second pass programming simultaneously.

Figure 44B:
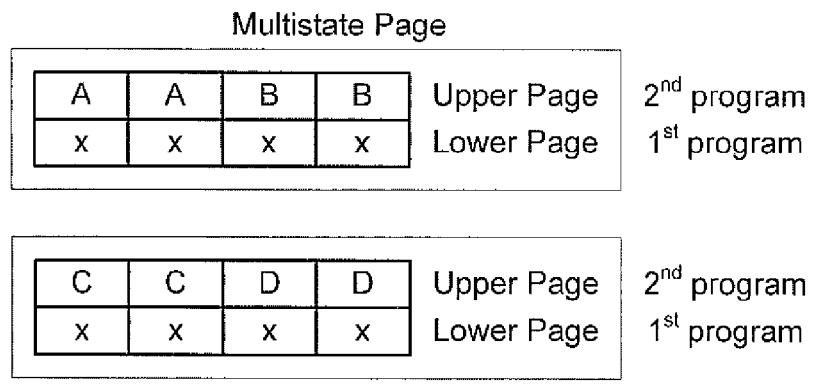
FIG. 44B illustrates another embodiment of saving duplicate copies of critical data only to the logical upper page of a multi-state memory.

FIG. 44B illustrates another embodiment of saving duplicate copies of critical data only to the logical upper page of a multi-state memory. In this case, the data in the lower page is not used. The critical data and its duplicates, such as sectors A, A and sectors B, B are saved to the logical upper page only. In this way, if there is a program abort, the critical data could be rewritten in another logical upper page, while any corruption to the lower page data would be immaterial. This solution basically uses half the storage capacity of each multi-state page.

Figure 44C:
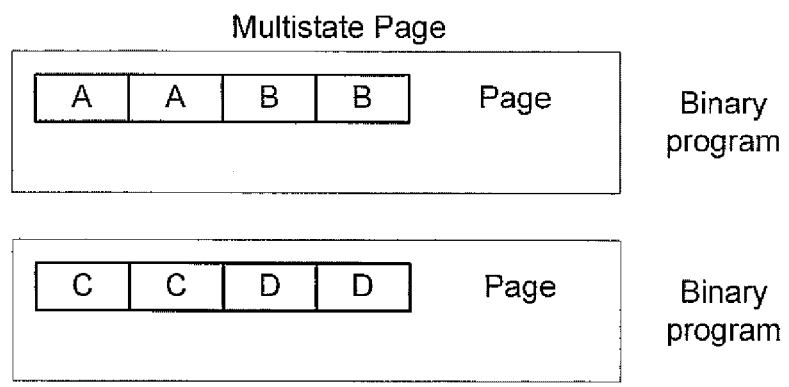
FIG. 44C illustrates yet another embodiment of saving duplicate copies of critical data in binary mode of a multi-state memory.

FIG. 44C illustrates yet another embodiment of saving duplicate copies of critical data in binary mode of a multi-state memory. In this case, each memory cell is programmed in a binary mode where its threshold range is only divided into two regions. Thus, there is only one-pass programming and the programming can be restart in a different location if a program abort occurs. This solution also uses half the storage capacity of each multi-state page. Operating a multi-state memory in binary mode is described in U.S. Pat. No. 6,456, 528 B1, the entire disclosure of which is incorporated herein by reference.

Figure 45:
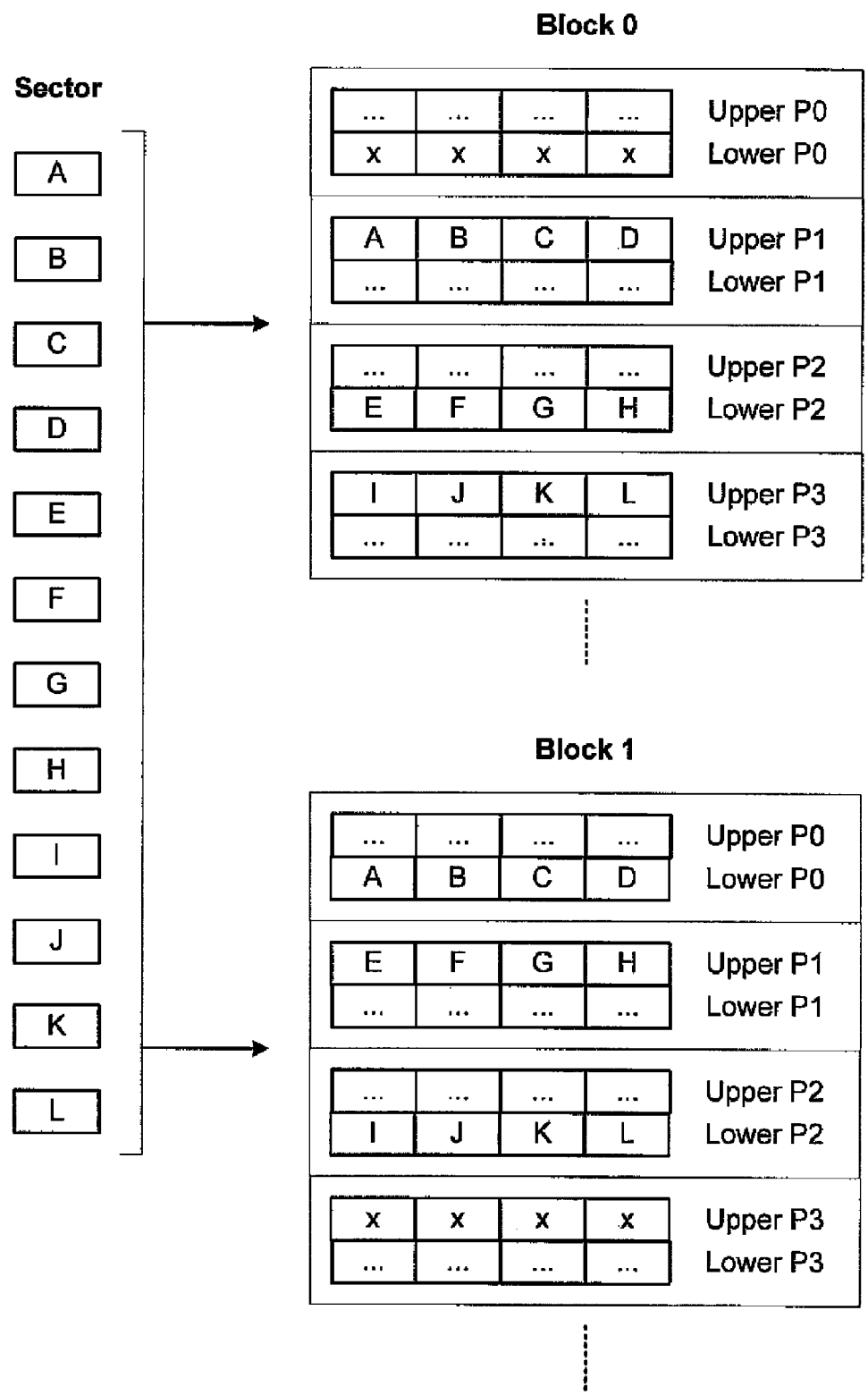
FIG. 45 illustrates yet another embodiment of saving duplicate copies of critical data concurrently to two different metablocks.

FIG. 45 illustrates yet another embodiment of saving duplicate copies of critical data concurrently to two different metablocks. If one of the blocks becomes unavailable, the data can be read from the other one. For example, the critical data are contained in sectors A, B, C, D and E, F, G, H, and I, J, K, L. Each sector is saved in duplicates. The two copies will be written concurrently to two differently blocks, Block 0 and Block 1. If one copy is written to a logical lower page, the other copy will be written to a logical upper page. In this way, there will always be a copy programmed to a logical upper page. If a program abort occurs, it can be reprogrammed to another logical upper page. At the same time, if the lower page is corrupted, there will always be another upper page copy in the other block.

Figure 46A:
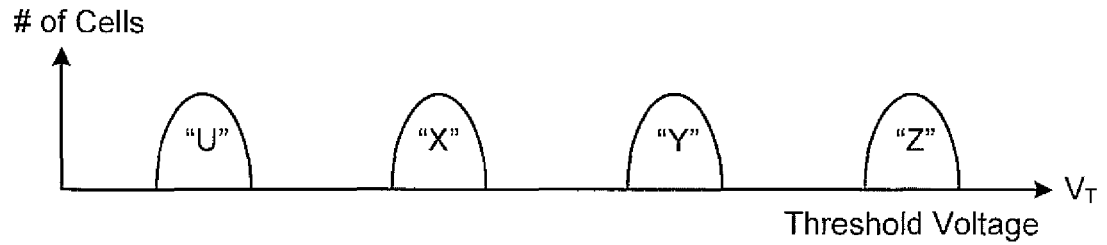
FIG. 46A is similar to FIG. 41A in illustrating threshold voltage distributions of a 4-state memory array and is shown as a reference for FIG. 46B.
Figure 46B:
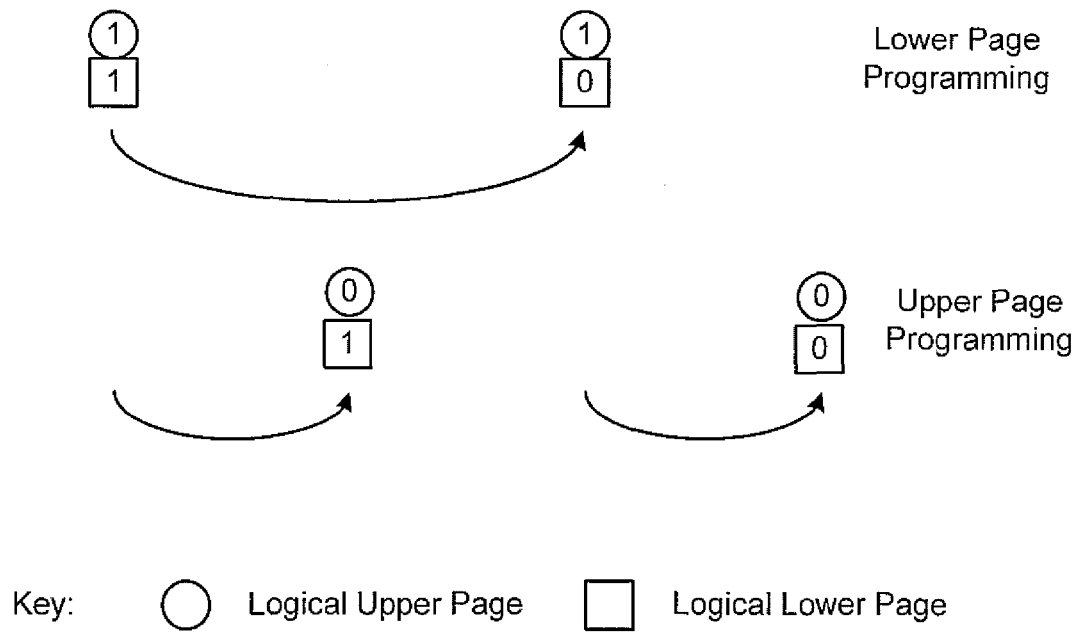
FIG. 46B illustrates yet another embodiment of saving duplicate copies of critical data concurrently by the use of a fault-tolerant code.

FIG. 46B illustrates yet another embodiment of saving duplicate copies of critical data concurrently by the use of a fault-tolerant code. FIG. 46A is similar to FIG. 41A in illustrating threshold voltage distributions of a 4-state memory array and is shown as a reference for FIG. 46B. The fault-tolerant code essentially avoids any upper page programming to transit through any intermediate states. Thus, the first pass lower page programming has the logical state (1, 1) transits to (1, 0) as represented by programming the erased memory state "U" to "Y". In the second pass programming of the upper page bit to "0", if the lower page bit is at "1", the logical state (1, 1) transits to (0, 1) as represented by programming the erased memory state "U" to "X". If the lower page bit is at "0", the logical state (1, 0) transits to (0, 0) as represented by programming the memory state "Y" to "Z". Since the upper page programming only involves programming to the next adjacent memory state, a program abort does not change the lower page bit.

Serial Write

Figures 47, 48:
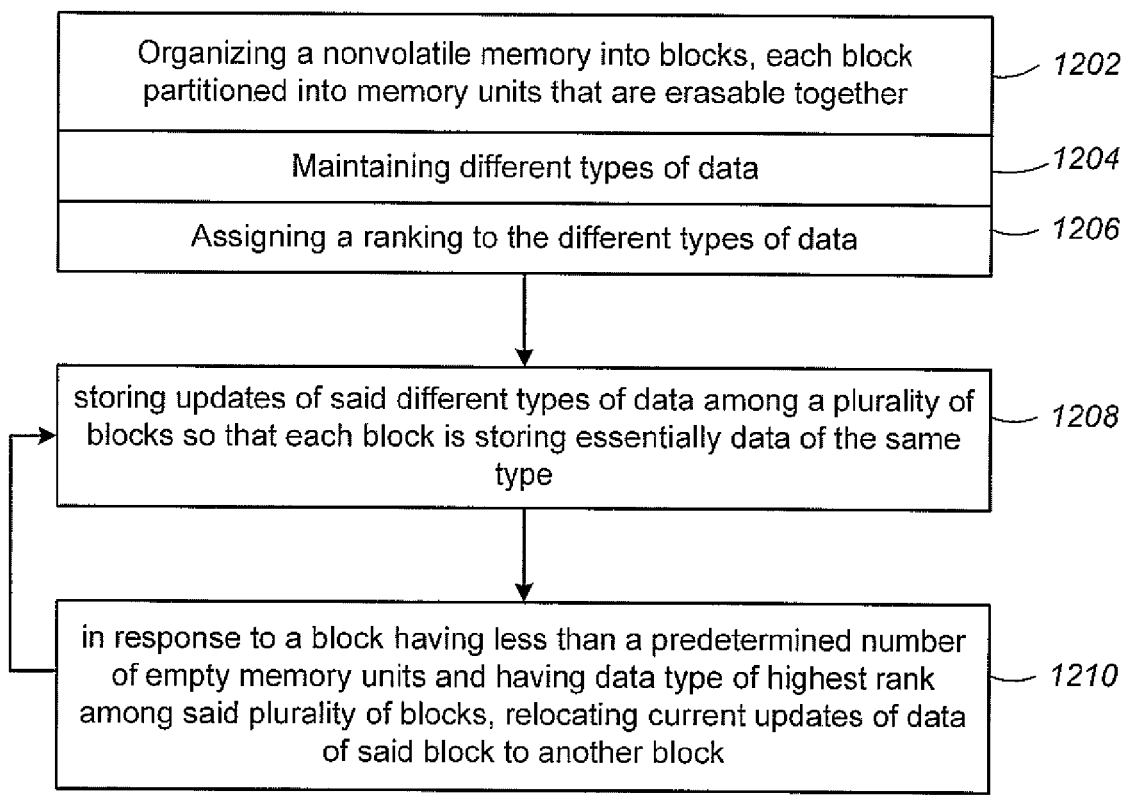
FIG. 47 is a table showing the possible states of the two copies of data, and the validity of the data.
FIG. 48 illustrates a flow chart of preemptive relocation of memory block storing control data.

The duplicate copies of critical data are preferably written concurrently as described above. Another way to avoid corrupting both copies at the same time is to write the copies sequentially. This method is slower, but the copies themselves indicate whether their programming was successful or not when the controller checks both the copies:

FIG. 47 is a table showing the possible states of the two copies of data, and the validity of the data.

If both first and second copies have no ECC error, then the programming of the data is believed to have been totally successfully. Valid data can be obtained from either copy.

If first copy has no ECC error, but the second has ECC error, then it could mean that the programming was interrupted in the middle of the second copy programming. The first copy contains valid data. The second copy data is not trustworthy even if the error is correctable.

If first copy has no ECC error and the second is empty (erased), then it could mean that the programming was interrupted after the end of first copy programming but before the commencement of the second copy. The first copy contains valid data.

If first copy has ECC error and the second is empty (erased), then it could mean that the programming was interrupted in the middle of first copy programming. The first copy may contain invalid data even if error is correctable.

For reading of data that is maintained in duplicates, the following techniques are preferred, as they take advantage of the existence of duplicate copies. Read and compare both copies. In this case the states of both copies as shown in FIG. 47 can be used to ensure that there is no error misdetection.

In another embodiment where the controller reads only one copy, for speed and simplicity considerations, the copy read is preferably alternate between the two copies. For example, when the controller reads a control data, it reads, say, Copy 1, the next control read (any control read) should be from Copy 2, then Copy 1 again etc. In this way, the two copies will be read and checked for integrity (ECC checked) regularly. It reduces the risk of not detecting in time errors caused by deteriorating data retention. For example, if only Copy 1 is normally read, then Copy 2 may gradually deteriorate to the level where the error is no longer be salvaged by ECC, and the 2nd copy can no longer be used.

Pre-emptive Data Relocation

As described in connection with FIG. 20, the block management system maintains a set of control data in flash memory during its operation. This set of control data is stored in the metablocks similar to host data. As such, the control data itself will be block managed and will be subject to updates and therefore garbage collection operations.

It has also been described that a hierarchy of control data exists, with the ones in the lower hierarchy being updated more often than those higher up. For example, assuming that every control block has N control sectors to write, the following sequence of control updates and control block relocations, normally happens. Referring to FIG. 20 again, every N CBI updates fill up the CBI block and trigger a CBI relocation (rewrite) and a MAP update. If the Chaotic block gets closed then it also triggers GAT update. Every GAT update triggers a MAP update. Every N GAT updates fill up the block and trigger a GAT block relocation. In addition, when a MAP block gets full it also triggers a MAP block relocation and a MAPA Block (if exist, otherwise BOOT block points directly to MAP) update. In addition, when a MAPA block gets full, it also triggers a MAPA block relocation, a BOOT Block update and a MAP update. In addition, when a BOOT Block gets full, it triggers an active BOOT Block relocation to another BOOT Block.

Since the hierarchy is formed by the BOOT control data at the top followed by MAPA, MAP and then GAT, thus, in every $N^3$ GAT updates there will be a "cascade control update", where all of the GAT, MAP, MAPA and BOOT blocks would be relocated. In the case when GAT update is caused by a Chaotic or Sequential Update block closure as a result of a host write, there will also be a garbage collection operation (i.e., relocation or rewrite.) In that case of Chaotic Update Block garbage collection, a CBI would be updated, and that can also trigger a CBI block relocation. Thus, in this extreme situation, a large number of metablocks need be garbage collected at the same time.

In can be seen that each control data block of the hierarchy has its own periodicity in terms of getting filled and being relocated. If each proceeds normally, there will be times when the phases of a large number of the blocks will line up and trigger a massive relocation or garbage collection involving all those blocks at the same time. Relocation of many control blocks will take a long time and should be avoided as some hosts do not tolerate long delays caused by such massive control operations.

According to another aspect of the invention, in a nonvolatile memory with a block management system, a "control garbage collection" or preemptive relocation of a memory block is implemented to avoid the situation where a large number of update blocks all happen to need relocation concurrently. For example, this situation can happen when updating control data used for controlling the operation of the block management system. A hierarchy of control data type can exist with varying degree of update frequencies, resulting in their associated update blocks requiring garbage collection or relocation at different rates. There will be certain times that the garbage collection operations of more than one control data types coincide. In the extreme situation, the relocation phases of the update blocks for all control data types could line up, resulting in all of the update blocks requiring relocation at the same time.

This undesirable situation is avoided by the present invention where whenever a current memory operation can accommodate a voluntary garbage collection operation, a preemptive relocation of an update block takes place in advance the block being totally filled. In particular, priority is given to the block with data type highest up in the hierarchy having the slowest rate. In this way, once the slowest rate blocks are relocated, they will not need another garbage collection for a relatively long time. Also, the slower rate blocks being higher up in the hierarchy do not have much of a cascade of relocation to trigger. The inventive method can be regarded as introducing some sort of dithering to the overall mix of things in order to avoid alignment of the phases of the various blocks in question. Thus, whenever an opportunity arises, a slow-filling block that has a slight margin from being totally filled is to be relocated preemptively.

In a system with a hierarchy of control data such that those lower in the hierarchy is changing faster than the one higher up due to a cascading effect, priority is given to a block of control data higher up in the hierarchy. One example of the opportunity for performing a voluntary preemptive relocation is when a host write does not itself trigger a relocation so any surplus in its latency period can be utilized for the preemptive relocation operation. Generally, the margin in advance of the block absolutely having to be relocated is a predetermined number of unwritten memory units before the block is totally full. Consideration is given to the margin being sufficient to precipitate relocation in advance of the block being totally filled, but without being unduly premature, resulting in wasted resources. In the preferred embodiment, the predetermined number of unwritten memory units is between one and six memory units.

FIG. 48 illustrates a flow chart of preemptive relocation of memory block storing control data.

STEP 1202: Organizing a nonvolatile memory into blocks, each block partitioned into memory units that are erasable together.

STEP 1204: Maintaining different types of data.

STEP 1206: Assigning a ranking to the different types of data.

STEP 1208: Storing updates of said different types of data among a plurality of blocks so that each block is storing essentially data of the same type.

STEP 1210: In response to a block having less than a predetermined number of empty memory units and having data type of highest rank among said plurality of blocks, relocating current updates of data of said block to another block. Go to STEP 1208 unless interrupted.

An example algorithm for implementing preemptive relocation for the control data shown in FIG. 20 is as follows:

If ((there is no garbage collection due to user data) OR (MAP has 6 or fewer unwritten sectors left) OR (GAT has 3 or fewer unwritten sectors left)

```
Then
    If (BOOT has 1 unwritten sector left)
    Then relocate BOOT (i.e. relocate to a block)
    Else
        If (MAPA has 1 unwritten sector left)
        Then relocate MAPA and update MAP
        Else
            If (MAP has 1 unwritten sector left)
            Then relocate MAP
            Else
                If (the last updated, or the biggest, GAT has 1 unwritten sector left)
                Then relocate GAT
                Else
                    If (CBI has 1 unwritten sector left)
                    Then Relocate CBI
                    Else
    Else
    Exit
```

Thus, the preemptive relocations are normally done when there is no user data garbage collection taking place. In the worst case, when every host write triggers user data garbage collection, but there is enough time for voluntary relocation of one block, preemptive relocation can be performed one control block at a time.

As the user data garbage collection operations and control updates may coincide with physical errors, it is better to do have larger safety margins by doing the preemptive relocation or controlled garbage collection earlier in advance, say, at the point when the block still has 2 or more unwritten memory units (e.g., sectors.)

Although the various aspects of the present invention have been described with respect to certain embodiments, it is understood that the invention is entitled to protection within the full scope of the appended claims.

The invention is claimed:

1. In a nonvolatile memory organized into blocks, each block partitioned into memory units that are erasable together, each memory unit for storing a logical unit of data, a method of storing and updating data comprising:
   organizing data into a plurality of logical groups, each logical group being a group of logical units;
   receiving host data packaged in logical units;
   storing in a first block a first version of logical units of a logical group according to a first order; and
   storing in a second block including subsequent versions of said logical units according to a second order different from the first; in response to a predefined triggering event, storing in a third block a directory of logical units stored in the second block since a latest triggering event; providing a header portion for each logical unit; and for logical units being stored intermediately in the second block since a latest predefined triggering event, storing a directory of the intermediate logical units in the header portion of each said intermediate logical units.

2. The method as in claim 1, wherein said nonvolatile memory has floating gate memory cells.

3. The method as in claim 1, wherein said nonvolatile memory is flash EEPROM.

4. The method as in claim 1, wherein said nonvolatile memory is NROM.

5. The method as in claim 1, wherein said nonvolatile memory is in a memory card.

6. The method as in claim 1, wherein said nonvolatile memory has memory cells that each stores one bit of data.

7. The method as in claim 1, wherein said nonvolatile memory has memory cells that each stores more than one bit of data.

8. In a nonvolatile memory organized into blocks, each block partitioned into memory units that are erasable together, each memory unit for storing a logical unit of data, a method of storing and updating data comprising:
   organizing data into a plurality of logical groups, each logical group being a group of logical units;
   receiving host data packaged in logical units; storing in a first block a first version of logical units according to a first order; and
   storing in a second block subsequent versions of said logical units according to a second order different from the first;
   storing in response to a predefined triggering event a directory of said logical units of the second block in a logical unit in the second block dedicated to storing said directory;
   providing a header portion for each logical unit; and for logical units being stored intermediately in the second block since a latest predefined triggering event, storing a directory of the intermediate logical units in the header portion of each said intermediate logical units.

9. The method as in claim 8, wherein said nonvolatile memory has floating gate memory cells.

10. The method as in claim 8, wherein said nonvolatile memory is flash EEPROM.

11. The method as in claim 8, wherein said nonvolatile memory is NROM.

12. The method as in claim 8, wherein said nonvolatile memory is in a memory card.

13. The method as in claim 8, wherein said nonvolatile memory has memory cells that each stores one bit of data.

14. The method as in claim 8, wherein said nonvolatile memory has memory cells that each stores more than one bit of data.

\* \* \* \* \*